(12) United States Patent
Saeki

(10) Patent No.: US 11,735,608 B2
(45) Date of Patent: Aug. 22, 2023

(54) IMAGING APPARATUS AND METHOD FOR MANUFACTURING IMAGING APPARATUS

(71) Applicant: Panasonic Intellectual Property Management Co., Ltd., Osaka (JP)

(72) Inventor: Kosaku Saeki, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 356 days.

(21) Appl. No.: 17/126,145

(22) Filed: Dec. 18, 2020

(65) Prior Publication Data

US 2021/0217786 A1 Jul. 15, 2021

(30) Foreign Application Priority Data

Jan. 10, 2020 (JP) ................................ 2020-002595

(51) Int. Cl.
*H01L 27/146* (2006.01)
*H04N 25/76* (2023.01)
*H04N 25/75* (2023.01)

(52) U.S. Cl.
CPC .... *H01L 27/14612* (2013.01); *H01L 27/1461* (2013.01); *H01L 27/14636* (2013.01); *H01L 27/14643* (2013.01); *H01L 27/14665* (2013.01); *H04N 25/76* (2023.01); *H04N 25/75* (2023.01)

(58) Field of Classification Search
None
See application file for complete search history.

(56) References Cited

U.S. PATENT DOCUMENTS

| 2005/0184322 A1* | 8/2005 | Inoue ................ H01L 27/14601 257/292 |
| 2011/0233620 A1* | 9/2011 | Naruse .................. H01L 23/485 257/E31.085 |
| 2011/0233702 A1* | 9/2011 | Takahashi ......... H01L 27/14638 257/E31.127 |
| 2013/0089947 A1* | 4/2013 | Kato ....................... H01L 31/18 257/E31.124 |
| 2015/0076500 A1* | 3/2015 | Sakaida ............ H01L 21/28525 438/59 |
| 2015/0137199 A1* | 5/2015 | Mori .................... H01L 27/1463 257/292 |

(Continued)

FOREIGN PATENT DOCUMENTS

| CN | 101147260 A | * 3/2008 | ....... H01L 27/14603 |
| CN | 108807434 A | * 11/2018 | ............... G02B 7/04 |
| JP | 2019-024075 | 2/2019 | |

*Primary Examiner* — Scott B Geyer
(74) *Attorney, Agent, or Firm* — McDermott Will & Emery LLP

(57) ABSTRACT

An imaging apparatus includes: a semiconductor substrate which includes a charge accumulation portion containing an impurity of a first conductivity type; a contact plug which is connected to the charge accumulation portion, contains an impurity of the first conductivity type, and is not silicide; a first insulating film which includes an upper wall located above the contact plug; and a second insulating film which includes a portion located above the upper wall. A material of the second insulating film is different from a material of the first insulating film, and the first insulating film is thinner than the second insulating film.

16 Claims, 22 Drawing Sheets

(56) References Cited

U.S. PATENT DOCUMENTS

| | | | |
|---|---|---|---|
| 2015/0155173 A1* | 6/2015 | Hirota | H01L 29/4983 |
| | | | 438/682 |
| 2015/0214269 A1* | 7/2015 | Endo | H01L 21/02321 |
| | | | 257/443 |
| 2016/0079297 A1* | 3/2016 | Sato | H01L 27/14612 |
| | | | 257/291 |
| 2016/0190188 A1* | 6/2016 | Murakami | H01L 27/14665 |
| | | | 250/214 A |
| 2016/0293654 A1* | 10/2016 | Tomekawa | H01L 27/14612 |
| 2018/0083004 A1* | 3/2018 | Sato | H01L 27/14612 |
| 2018/0269252 A1* | 9/2018 | Qi | H01L 27/14636 |
| 2019/0027524 A1* | 1/2019 | Sato | H01L 27/14612 |
| 2019/0371839 A1* | 12/2019 | Sato | H01L 27/14638 |
| 2020/0058688 A1* | 2/2020 | Kwon | H01L 27/14612 |
| 2020/0119098 A1* | 4/2020 | Sakaida | H01L 27/14636 |
| 2020/0135797 A1* | 4/2020 | Misaki | H01L 27/1259 |
| 2021/0043671 A1* | 2/2021 | Yoneda | H01L 27/1464 |

* cited by examiner

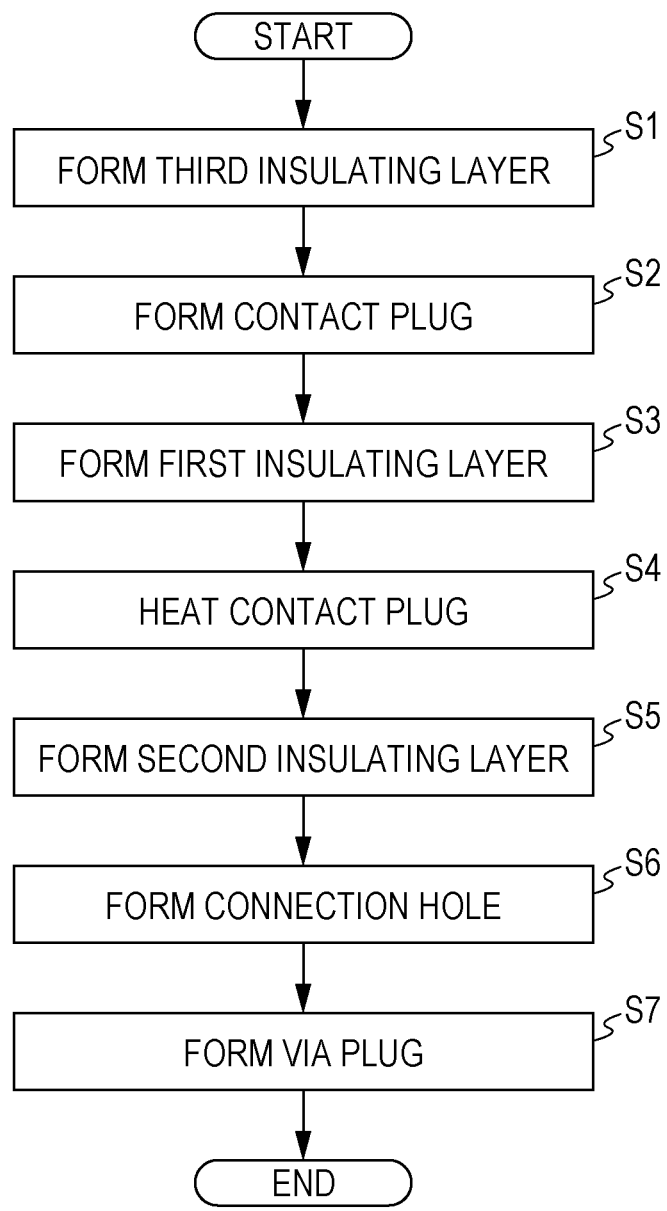

IMAGING APPARATUS AND METHOD FOR MANUFACTURING IMAGING APPARATUS

BACKGROUND

1. Technical Field

The present disclosure relates to an imaging apparatus and a method for manufacturing the imaging apparatus.

2. Description of the Related Art

A stack-type imaging apparatus has been proposed as a meta-oxide-semiconductor (MOS) imaging apparatus. In a stack-type imaging apparatus, a photoelectric conversion layer is stacked on a semiconductor substrate. Charges generated by photoelectric conversion in the photoelectric conversion layer are stored in a charge accumulation portion. The imaging apparatus reads the stored charges using a charge-coupled device (CCD) circuit or a complementary MOS (CMOS) circuit in the semiconductor substrate. For example, Japanese Unexamined Patent Application Publication No. 2019-24075 discloses such an imaging apparatus.

SUMMARY

In one general aspect, the techniques disclosed here feature an imaging apparatus comprising: a semiconductor substrate which includes a charge accumulation portion containing an impurity of a first conductivity type; a contact plug which is connected to the charge accumulation portion, contains an impurity of the first conductivity type, and is not silicide; a first insulating film which includes an upper wall located above the contact plug; and a second insulating film which includes a portion located above the upper wall. A material of the second insulating film is different from a material of the first insulating film, and the first insulating film is thinner than the second insulating film.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 24 is a flowchart showing a method of manufacturing the imaging apparatus according to the embodiment.

DETAILED DESCRIPTION

Figure 1:
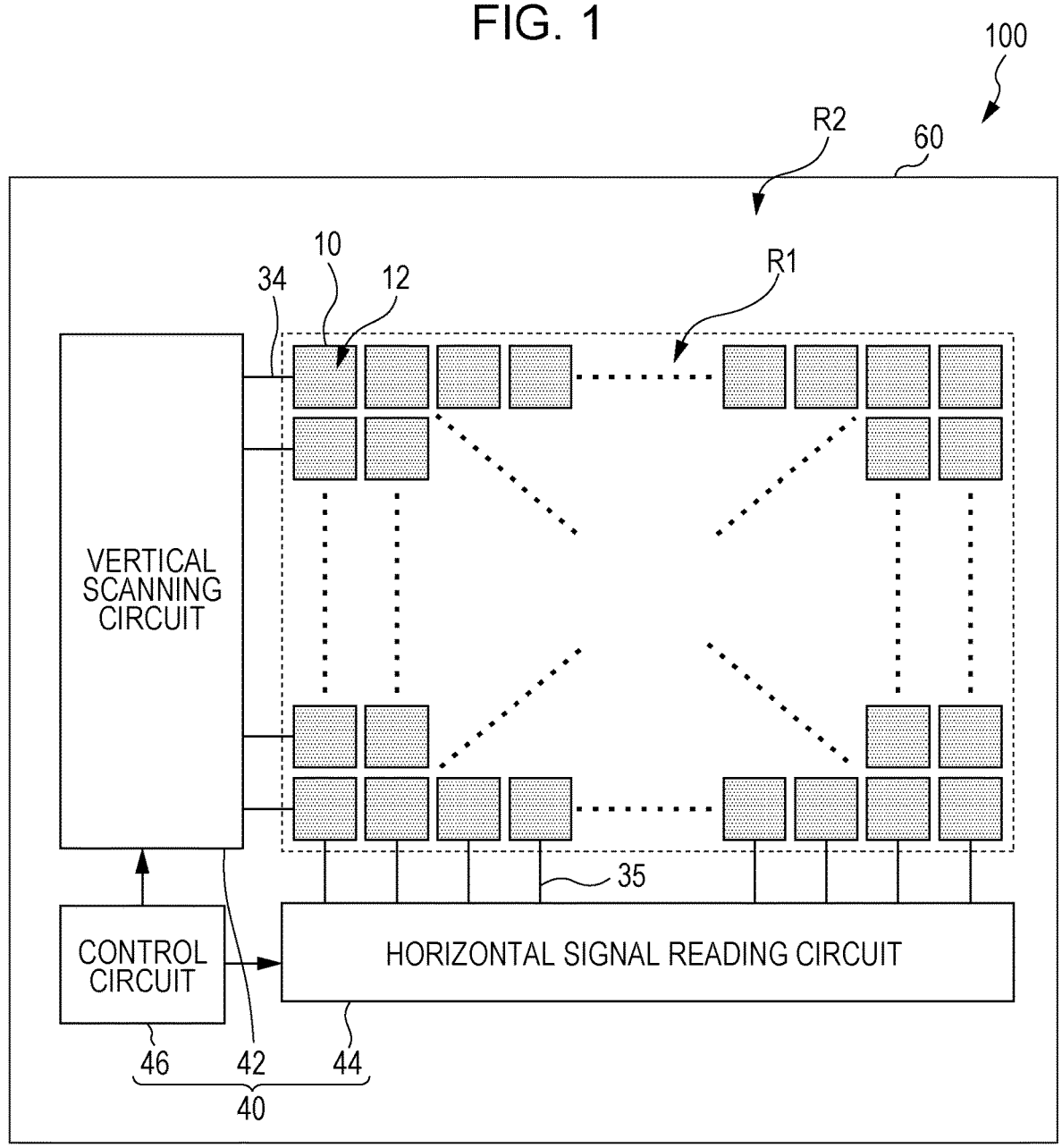
FIG. 1 is a block diagram showing an example configuration of an imaging apparatus according to an embodiment.

Summary of Aspects of the Present Disclosure

An imaging apparatus according to a first aspect of the present disclosure comprises:

a semiconductor substrate which includes a charge accumulation portion containing an impurity of a first conductivity type;

a contact plug which is connected to the charge accumulation portion, contains an impurity of the first conductivity type, and is not silicide;

a first insulating film which includes an upper wall located above the contact plug; and a second insulating film which includes a portion located above the upper wall.

A material of the second insulating film is different from a material of the first insulating film, and the first insulating film is thinner than the second insulating film.

The technique according to the first aspect may contribute to obtaining a high-quality image. Also, the technique according to the first aspect facilitates giving the first insulating film and the second insulating film properties different from each other.

In a second aspect of the present disclosure, for example, in the imaging apparatus according to the first aspect, the upper wall may be in contact with a surface of the contact plug.

The technique according to the second aspect may contribute to obtaining a high-quality image.

In a third aspect of the present disclosure, for example, in the imaging apparatus according to the first or second aspect, the first insulating film may include a sidewall located lateral to the contact plug, and the sidewall may be in contact with the contact plug.

The technique according to the third aspect may contribute to obtaining a high-quality image.

In a fourth aspect of the present disclosure, for example, in the imaging apparatus according to any one of the first to third aspects, the first insulating film may be 50 nm or less in thickness.

The technique according to the fourth aspect may contribute to obtaining a high-quality image.

In a fifth aspect of the present disclosure, for example, in the imaging apparatus according to any one of the first to fourth aspects, the first insulating film may contain a silicon oxide.

The technique according to the fifth aspect may contribute to obtaining a high-quality image.

In a sixth aspect of the present disclosure, for example, the imaging apparatus according to any one of the first to fifth aspects may further comprise:

a connection hole which penetrates the first insulating film; and a metal plug which is connected to the contact plug through the connection hole.

According to the sixth aspect, the contact plug and the metal plug can be properly connected to each other.

In a seventh aspect of the present disclosure, for example, in the imaging apparatus according to the sixth aspect, the connection hole may be 100 nm or less in diameter.

The technique according to the seventh aspect may contribute to obtaining a high-quality image.

In an eighth aspect of the present disclosure, for example, in the imaging apparatus according to any one of the first to fifth aspects, the second insulating film may be 50 nm or less in thickness.

The technique according to the eighth aspect may contribute to obtaining a high-quality image.

In a ninth aspect of the present disclosure, for example, in the imaging apparatus according to any one of the first to eighth aspects, the second insulating film may contain a silicon nitride.

A silicon nitride is an example of a material which may be contained in the second insulating film.

In a 10th aspect of the present disclosure, for example, the imaging apparatus according to any one of the first to ninth aspects may further comprise:

a contact hole in which the contact plug extends; and a third insulating film which includes a portion located around the contact hole and between the semiconductor substrate and the contact plug.

The 10th aspect is an example configuration of an insulating film.

In an 11th aspect of the present disclosure, for example, in the imaging apparatus according to the 10th aspect, the third insulating film may be made of a same material as the first insulating film.

The 11th aspect facilitates simplification of the steps for forming the first insulating film and the third insulating film.

In a 12th aspect of the present disclosure, for example, in the imaging apparatus according to the 10th or 11th aspect, the first insulating film may be thinner than the third insulating film.

The 12th aspect is an example configuration of an insulating film.

In a 13th aspect of the present disclosure, for example, the imaging apparatus according to any one of the 10th to 12th aspects may further comprise:

a connection hole which penetrates the first insulating film; and a metal plug which is connected to the contact plug through the connection hole, and in a plan view, the connection hole and the contact hole may be separated from each other.

The configuration of the 13th aspect is an example of a configuration in which the positional flexibility of the metal plug relative to the position of the contact hole in a plan view is improved by use of the contact plug as a local wire.

In a 14th aspect of the present disclosure, for example, in the imaging apparatus according to any one of the 1st to 13th aspects, the semiconductor substrate may include an impurity region of a second conductivity type different from the first conductivity type, and in a plan view, a distance between the impurity region and a portion where the contact plug is in contact with the charge accumulation portion may be 50 nm or greater.

The technique according to the 14th aspect may contribute to obtaining a high-quality image.

In a 15th aspect of the present disclosure, for example, in the imaging apparatus according to any one of the 1st to 14th aspects, the contact plug may contain phosphorus.

The technique according to the 15th aspect may contribute to obtaining a high-quality image.

In a 16th aspect of the present disclosure, for example, in the imaging apparatus according to any one of the 1st to 15th aspects, in a depth direction of the semiconductor substrate, a difference between maximum and minimum values of a concentration of the impurity of the first conductivity type contained in the contact plug may be 30% or less of an intermediate value of the concentration.

The technique according to the 16th aspect may contribute to obtaining a high-quality image.

A method for manufacturing an imaging apparatus according to a 17th aspect of the present disclosure comprises:

forming a contact plug which contains an impurity of a first conductivity type and is not silicide so that the contact plug is connected to a charge accumulation portion which is included in a semiconductor substrate and contains an impurity of the first conductivity type; and forming a first insulating film which includes an upper wall located above the contact plug.

The technique according to the 17th aspect is suitable for manufacturing the imaging apparatus of the first aspect.

In a 18th aspect of the present disclosure, for example, the manufacturing method according to the 17th aspect may comprise forming a second insulating film which includes a portion located above the upper wall.

According to the 18th aspect, the second insulating film can be formed.

In a 19th aspect of the present disclosure, for example, the manufacturing method according to the 17th or 18th aspect may further comprise:

forming a connection hole which penetrates the first insulating film; and forming a metal plug which is connected to the contact plug through the connection hole.

According to the 19th aspect, the metal plug connected to the contact plug can be formed.

In a 20th aspect of the present disclosure, for example, the manufacturing method according to any one of the 17th to 19th aspects may further comprise:

heating the contact plug after forming the first insulating film; and forming a connection hole which penetrates the first insulating film after heating the contact plug.

The 20th aspect facilitates making the concentration of the impurity in the contact plug uniform.

An imaging apparatus according to a 21st aspect of the present disclosure comprises:

a semiconductor substrate which has a charge accumulation portion containing an impurity of a first conductivity type; and a contact plug which is connected to the charge accumulation portion and contains an impurity of the first conductivity type, wherein the contact plug has a linear region extending in a depth direction of the semiconductor substrate, the linear region includes a proximal end and a distal end, the proximal end constituting part of a contour of the contact plug and being relatively close to the semiconductor substrate, the distal end constituting part of the contour of the contact plug and being relatively far from the semiconductor substrate, when the linear region is divided into five equal sections which are a first section, a second section, a third section, a fourth section, and a fifth section in this order from the distal end to the proximal end, the first section has a first portion, and a concentration of the impurity of the first conductivity type in the first portion is 70% or higher of a maximum concentration of the impurity of the first conductivity type in the linear region.

The technique according to the 21st aspect may contribute to obtaining a high-quality image.

Embodiments of the present disclosure are described below with reference to the drawings.

The present disclosure is not limited to the following embodiments. The present disclosure is also modifiable as needed without departing from the scope in which the advantageous effects of the present disclosure can be provided. Further, one embodiment can be combined with another embodiment. In the descriptions below, the same or like elements are denoted by the same reference numeral. Repetitive descriptions may be omitted. Furthermore, a "plan view" herein indicates seeing in a direction perpendicular to the semiconductor substrate.

Ordinal numbers, first, second, third, and so on may be used in the following embodiments. When a certain element is denoted by an ordinal number, it is not essential that there is an element of the same kind with a number lower than that ordinal number. The ordinal numbers can be changed as needed.

In the following embodiments, an impurity contained in contact plugs Cp1 to Cp7 may be referred to as a first impurity.

Embodiment 1

With reference to FIGS. 1 to 4, the structure and functions of an imaging apparatus according to Embodiment 1 are described.

FIG. 1 is a block diagram illustrating an example configuration of an imaging apparatus 100 according to Embodiment 1 of the present disclosure. The imaging apparatus 100 shown in FIG. 1 has a plurality of pixels 10 and surrounding circuitry 40 which are formed on a semiconductor substrate 60. Each pixel 10 has a photoelectric converter 12 that converts incident light into a signal charge.

In the example shown in FIG. 1, the pixels 10 are arranged in m rows and n columns, where m and n are integers greater than or equal to 1 and are independent of each other. The pixels 10 are arranged, for example, two-dimensionally on the semiconductor substrate 60, forming an imaging region R1.

The number and the arrangement of the pixels 10 are not limited to what is shown in the example. For example, the imaging apparatus 100 may include one pixel 10. In this example, the center of each pixel 10 is positioned on a lattice point in a square lattice. Alternatively, for example, the pixels 10 may be arranged in such a manner that, for example, the center of each pixel 10 is positioned on a lattice point in a triangular or hexagonal lattice. For example, the pixels 10 may be arranged one-dimensionally, in which case the imaging apparatus 100 may be used as a line sensor.

In the configuration exemplified in FIG. 1, the surrounding circuitry 40 includes a vertical scanning circuit 42 and a horizontal signal reading circuit 44. As exemplified in FIG. 1, the surrounding circuitry 40 may additionally include a control circuit 46. For example, the surrounding circuitry 40 may further include a voltage supply circuit that supplies predetermined voltage to the pixels 10 and the like. For example, the surrounding circuitry 40 may further include a signal processing circuit or an output circuit.

For example, the surrounding circuitry 40 are provided in a surrounding region R2 located around the imaging region R1. Although the surrounding region R2 is a loop-shaped region surrounding the imaging region R1 in the example shown in FIG. 1, the present disclosure is not limited to this. The surrounding region R2 may be a letter-L-shaped region extending along two sides of the imaging region R1, or an elongated region extending along one side of the imaging region R1.

The vertical scanning circuit 42 is also called a row scanning circuit, and is coupled to address signal lines 34 provided for the respective rows of the pixels 10. Signal lines provided for the respective rows of the pixels 10 in a corresponding manner are not limited to the address signal lines 34, and a plurality of types of signal lines may be connected to the vertical scanning circuit 42 for each of the rows of the pixels 10. The horizontal signal reading circuit 44 is also called a column scanning circuit, and is coupled to vertical signal lines 35 provided for the respective columns of the pixels 10.

For example, the control circuit 46 provides overall control of the imaging apparatus 100 by receiving instruction data and clock signals given from, for example, the outside of the imaging apparatus 100. Typically, the control circuit 46 has a timing generator and supplies drive signals to the vertical scanning circuit 42 and the horizontal signal reading circuit 44. In FIG. 1, the arrows extending from the control circuit 46 schematically indicate the flow of output signals of the control circuit 46. The control circuit 46 may be implemented by, for example, a microcontroller including one or more processors. The functions of the control circuit 46 may be implemented by a combination of a general-purpose processing circuit and software or by hardware dedicated to such processing.

Figure 2:
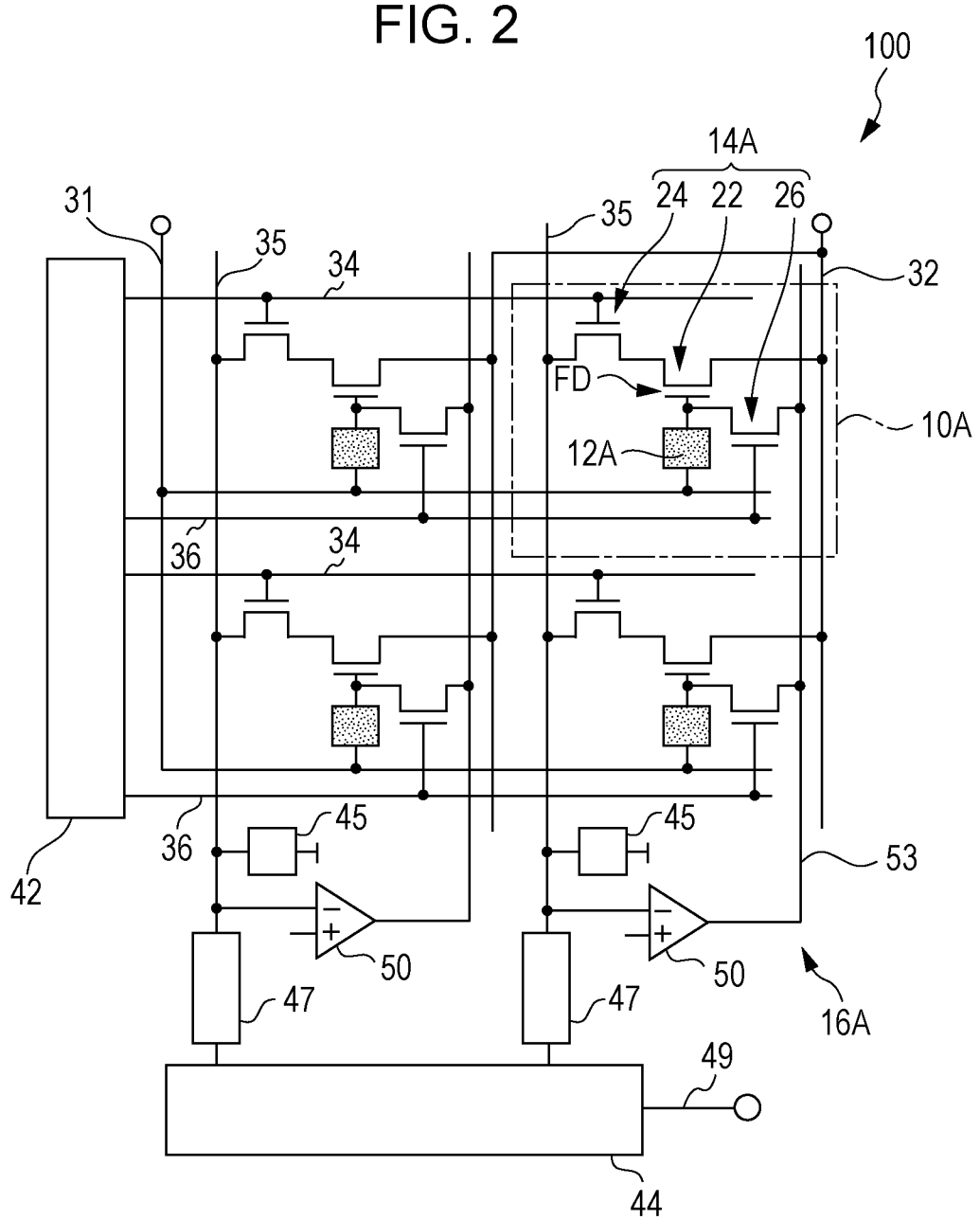
FIG. 2 is a schematic diagram showing an example circuit configuration of the imaging apparatus according to the embodiment.

FIG. 2 schematically shows an example circuit configuration of the imaging apparatus 100 according to Embodiment 1 of the present disclosure. To avoid complicating the drawing, FIG. 2 shows only four pixels 10A arranged in two rows and two columns as representative examples. Each of these pixels 10A is an example of the pixel 10 shown in FIG. 1.

Each pixel 10A has a photoelectric conversion structure 12A as the photoelectric converter 12, and includes a signal detecting circuit 14A electrically connected to the photoelectric conversion structure 12A. As will be described in detail later with reference to drawings, the photoelectric conversion structure 12A includes a photoelectric conversion layer disposed above the semiconductor substrate 60. In other words, a stack-type imaging apparatus is exemplified here as the imaging apparatus 100. However, the photoelectric converter may be a photodiode provided inside the semiconductor substrate.

Note that the terms such as "above", "below", "upper surface", and "lower surface" herein are used only to specify a positional relation between members, and are not intended to limit the posture of the imaging apparatus 100 during use.

In the configuration exemplified in FIG. 2, the photoelectric conversion structure 12A of each pixel 10A is coupled to a storage control line 31. When the imaging apparatus 100 is in operation, predetermined voltage is applied to the storage control line 31. For example, in a case where positive charges are used as signal charges out of positive and negative charges generated by photoelectric conversion, a positive voltage of e.g., approximately 10 V may be applied to the storage control line 31 when the imaging apparatus 100 is in operation. The following shows a case of using positive holes as signal charges, as an example.

In the configuration exemplified in FIG. 2, the signal detecting circuit 14A includes a signal detection transistor 22, an address transistor 24, and a reset transistor 26. As will be described in detail later with reference to drawings, the signal detection transistor 22, the address transistor 24, and the reset transistor 26 are typically field-effect transistors formed on the semiconductor substrate 60 that supports the photoelectric conversion structure 12A. Described hereinbelow is an example of using N-channel metal-oxide-semiconductor field-effect transistors (MOSFETs) as the transistors, unless otherwise noted.

As schematically shown in FIG. 2, the gate of the signal detection transistor 22 is electrically connected to the photoelectric conversion structure 12A. Application of predetermined voltage to the storage control line 31 during operation allows, for example, positive holes to be stored in a charge accumulation portion FD as signal charges.

The charge accumulation portion FD corresponds to an impurity region formed in the semiconductor substrate 60. In the example shown, the charge accumulation portion FD has a function to temporarily retain charges generated by the photoelectric conversion structure 12A. Note that the imaging apparatus 100 may have, other than the charge accumulation portion FD, a portion to temporarily retain charges generated by the photoelectric conversion structure 12A.

Examples of such a portion include a pixel electrode 12a, a conductive structure 89, and a gate electrode 22e of the signal detection transistor 22.

One of the drain and the source of the signal detection transistor 22 is connected to power source wiring 32. The power source wiring 32 supplies a power supply voltage VDD to each of the pixels 10A when the imaging apparatus 100 is in operation. The power supply voltage VDD is, for example, 3.3 V. The other one of the drain and the source of the signal detection transistor 22 is connected to the vertical signal line 35 via the address transistor 24. The signal detection transistor 22, when supplied with the power supply voltage VDD at the other one of the drain and the source, outputs a signal voltage according to the quantity of signal charges stored in the charge accumulation portion FD.

The address signal line 34 is connected to the gate of the address transistor 24 connected between the signal detection transistor 22 and the vertical signal line 35. Thus, by applying a row selection signal that controls ON and OFF of the address transistor 24 to the address signal line 34, the vertical scanning circuit 42 can read an output of the signal detection transistor 22 of the selected pixel 10A onto the corresponding vertical signal line 35. Note that the position of the address transistor 24 is not limited to the example shown in FIG. 2, and may be between the drain of the signal detection transistor 22 and the power source wiring 32.

A load circuit 45 and a column signal processing circuit 47 are connected to each of the vertical signal lines 35. The load circuit 45, together with the signal detection transistor 22, forms a source follower circuit. The column signal processing circuit 47 is also called a row signal storing circuit, and for example, performs analog-digital conversion and noise suppression signal processing typified by correlated double sampling. The horizontal signal reading circuit 44 sequentially reads signals from the column signal processing circuits 47 to a horizontal common signal line 49. The load circuit 45 and the column signal processing circuit 47 may be part of the surrounding circuitry 40.

A reset signal line 36 that is coupled to the vertical scanning circuit 42 is connected to the gate of the reset transistor 26. Like the address signal lines 34, the reset signal lines 36 are provided for the respective rows of the pixels 10A. By applying a row selection signal to the address signal line 34, the vertical scanning circuit 42 can select a row of pixels 10A to be reset. The vertical scanning circuit 42 can also switch on and off the reset transistors 26 of the selected row by applying reset signals to the gates of the reset transistors 26 via the reset signal line 36. When the reset transistors 26 are switched on, the electric potentials at the charge accumulation portions FD are reset.

In this example, one of the drain and the source of the reset transistor 26 is the charge accumulation portion FD, and the other one of the drain and the source is connected to a corresponding one of feedback lines 53 provided for the respective columns of the pixels 10A. Thus, in this example, voltage of the feedback line 53 is supplied to the charge accumulation portion FD as reset voltage to initialize charges in the photoelectric conversion structure 12A.

In the configuration exemplified in FIG. 2, the imaging apparatus 100 has feedback circuits 16A each including an inverting amplifier 50 as part of a feedback path. As shown in FIG. 2, the inverting amplifier 50 is provided for each column of the pixels 10A, and the above-described feedback line 53 is connected to one output terminal of the corresponding inverting amplifier 50. The inverting amplifier 50 may be part of the surrounding circuitry 40.

As shown in FIG. 2, the inverting input terminal of the inverting amplifier 50 is connected to the vertical signal line 35 of the corresponding column, and the non-inverting input terminal of the inverting amplifier 50 is supplied with a reference voltage Vref when the imaging apparatus 100 is in operation. When the address transistor 24 and the reset transistor 26 are switched on, a feedback path to negatively feed back the output of the pixel 10 can be formed. By the formation of the feedback path, the voltage of the vertical signal line 35 converges to the reference voltage Vref, which is the input voltage to the non-inverting input terminal of the inverting amplifier 50. In other words, by the formation of the feedback path, the voltage of the charge accumulation portion FD is reset to a voltage such that the voltage of the vertical signal line 35 becomes the reference voltage Vref. As the reference voltage Vref, a voltage of any magnitude within the range of the power supply voltage and the ground may be used. The reference voltage Vref is a positive voltage of, for example, 1 V or close to 1 V. The formation of the feedback path can reduce reset noise generated when the reset transistor 26 is switched off.

Figure 3:
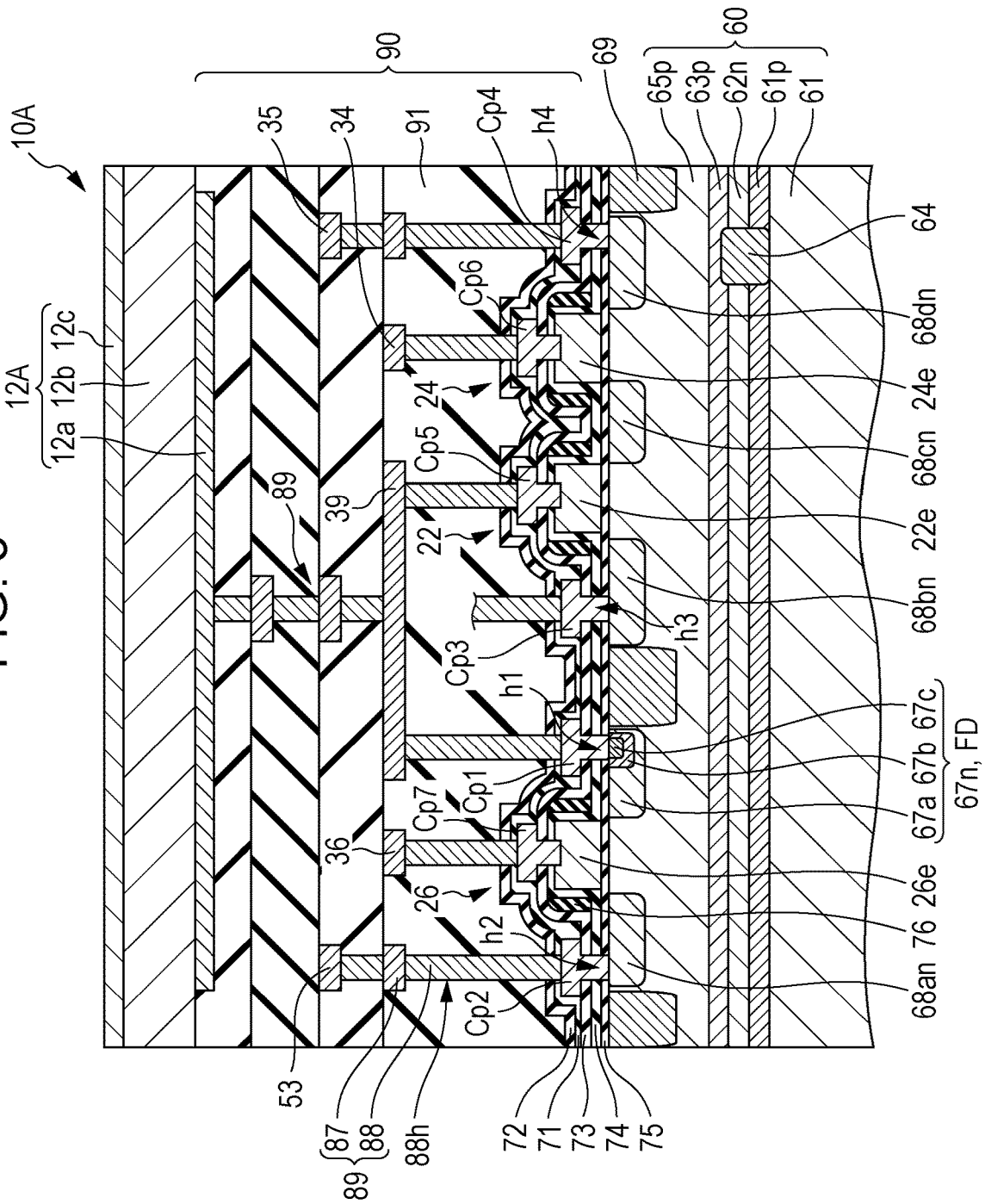
FIG. 3 is a sectional view schematically showing an example device structure of a pixel in the imaging apparatus according to the embodiment.
Figure 4:
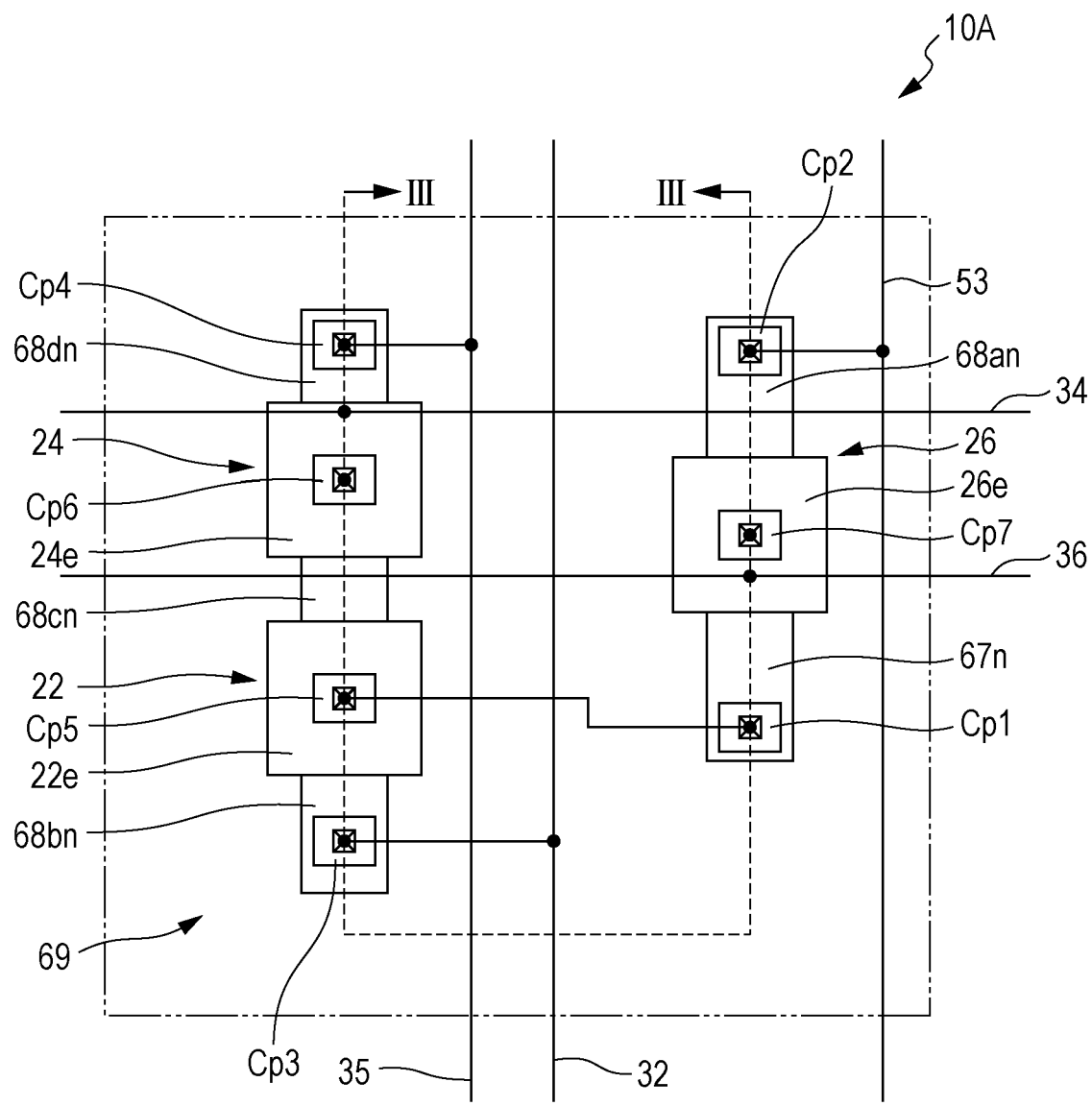
FIG. 4 is a schematic plan view showing an example layout of elements in a pixel in the imaging apparatus according to the embodiment.

Next, the device structure of the pixel 10A is described in detail using FIGS. 3 and 4.

FIG. 3 is a sectional view schematically showing an example device structure of the pixel 10A of the imaging apparatus 100 according to Embodiment 1 of the present disclosure. FIG. 4 is a schematic plan view of an example layout of elements in the pixel 10A of the imaging apparatus 100 according to the present embodiment. FIG. 4 schematically shows the arrangement of the elements formed on the semiconductor substrate 60 when the pixel 10A shown in FIG. 3 is seen in a direction normal to the semiconductor substrate 60. The section shown in FIG. 3 is obtained when the pixel 10A is cut along the line Ill-Ill in FIG. 4 and expanded.

FIG. 4 omits a first insulating layer 71, a second insulating layer 72, a third insulating layer 73, and the like to simplify the schematic diagram.

Referring to FIG. 3, the pixel 10A includes the semiconductor substrate 60, the photoelectric conversion structure 12A disposed above the semiconductor substrate 60, and the conductive structure 89. As shown, the photoelectric conversion structure 12A is supported by an interlayer insulating layer 90 covering the semiconductor substrate 60. The conductive structure 89 is disposed inside the interlayer insulating layer 90.

In the example shown, the interlayer insulating layer 90 includes a plurality of insulating layers including a seventh insulating layer 91. The seventh insulating layer 91 is also called a pre-metal dielectric film. The conductive structure 89 includes via plugs 88. The conductive structure 89 also includes parts of a plurality of wiring layers disposed inside the interlayer insulating layer 90. In the present embodiment, the via plug 88 is a metal plug. The via plug 88 is housed in a connection hole 88h.

The wiring layers disposed in the interlayer insulating layer 90 may include, for example, a wiring layer having as its part at least one of the address signal line 34, the reset signal line 36, the vertical signal line 35, the power source wiring 32, and the feedback line 53. It goes without saying that the number of the insulating layers and the number of the wiring layers in the interlayer insulating layer 90 are not limited to this example, and can be set to any numbers.

A term "metal wiring 87" may be used below. The metal wiring 87 is wiring included in the conductive structure 89. The metal wiring 87 may correspond to part of, for example, the address signal line 34, the reset signal line 36, the vertical signal line 35, the power source wiring 32, the feedback line 53, or the like.

The photoelectric conversion structure 12A includes the pixel electrode 12a formed on the interlayer insulating layer 90, a counter electrode 12c disposed on the light incident side, and a photoelectric conversion layer 12b disposed between these electrodes. The photoelectric conversion layer 12b of the photoelectric conversion structure 12A is formed of an organic material or an inorganic material. The inorganic material is, for example, amorphous silicon. The photoelectric conversion layer 12b receives incident light via the counter electrode 12c, and generates positive and negative charges through photoelectric conversion. Typically, the photoelectric conversion layer 12b is formed continuously over a plurality of pixels 10A. The photoelectric conversion layer 12b may include a layer formed of an organic material and a layer formed of an inorganic material. The photoelectric conversion layer 12b may be provided for each pixel 10A separately.

The counter electrode 12c is a translucent electrode formed of a translucent conductive material. Examples of a translucent conductive material include indium tin oxide (ITO). The term "translucent" herein means allowing at least part of light of a wavelength that can be absorbed by the photoelectric conversion layer 12b to pass, and it is not essential that the translucent electrode allows light of all the wavelengths of visible light to pass therethrough. Typically, the counter electrode 12c is formed over a plurality of pixels 10A, like the photoelectric conversion layer 12b. In other words, the counter electrode 12c is shared by a plurality of pixels 10A. To put it differently, the photoelectric conversion structure 12A provided to each pixel 10A includes a part of the counter electrode 12c, the part being different for each pixel 10A. The counter electrode 12c may be provided to each pixel 10A separately.

Although not shown in FIG. 3, the counter electrode 12c is coupled to the above-described storage control line 31. When the imaging apparatus 100 is in operation, the electric potential at the counter electrode 12c is set to be, for example, higher than that at the pixel electrode 12a by control of the electric potential at the storage control line 31. Thereby, positive charges out of the positive and negative charges generated by photoelectric conversion can be selectively collected by the pixel electrode 12a. The counter electrode 12c may be formed as a single layer continuously extending over a plurality of pixels 10A. This allows a predetermined potential to be applied collectively to the counter electrode 12c of a plurality of pixels 10A.

The pixel electrode 12a is formed of, for example, a metal, a metal nitride, or polysilicon doped with an impurity in order to be conductive. The metal here is, for example, aluminum or copper. The pixel electrode 12a is electrically isolated from the pixel electrode 12a of an adjacent different pixel 10 by being spatially isolated from the pixel electrode 12a of the different pixel 10.

The conductive structure 89 includes a plurality of sets of wiring and plugs, and is connected at one end to the pixel electrode 12a. The other end of the conductive structure 89 is connected to the charge accumulation portion FD. In the example shown, the charge accumulation portion FD is an n-type impurity region 67n. The plurality of sets of wiring and plugs may be formed of, for example, a metal such as copper or tungsten or a metal compound such as a metal nitride or a metal oxide. The plurality of sets of wiring and plugs may be formed of polysilicon made to be conductive. By the connection of the other end of the conductive structure 89 to circuit elements formed on the semiconductor substrate 60, the pixel electrode 12a of the photoelectric conversion structure 12A and the circuitry on the semiconductor substrate 60 are electrically connected to each other.

Now, a focus is made on the semiconductor substrate 60. As schematically shown in FIG. 3, the semiconductor substrate 60 includes a support substrate 61 and one or more semiconductor layers formed on the support substrate 61. Herein, a p-type silicon substrate is shown as an example of the support substrate 61.

In the configuration exemplified in FIG. 3, the semiconductor substrate 60 has a p-type semiconductor layer 61p on the support substrate 61, an n-type semiconductor layer 62n on the p-type semiconductor layer 61p, a p-type semiconductor layer 63p on the n-type semiconductor layer 62n, and a p-type semiconductor layer 65p located on the p-type semiconductor layer 63p. Typically, the p-type semiconductor layer 63p is formed over the entire surface of the support substrate 61. Typically, the p-type semiconductor layer 61p, the n-type semiconductor layer 62n, the p-type semiconductor layer 63p, and the p-type semiconductor layer 65p are each formed by ion implantation of an impurity into a semiconductor layer formed by epitaxial growth. The concentrations of the impurities in the p-type semiconductor layer 63p and the p-type semiconductor layer 65p are approximately the same and higher than that in the p-type semiconductor layer 61p.

The n-type semiconductor layer 62n is located between the p-type semiconductor layer 61p and the p-type semiconductor layer 63p. Although not shown in FIG. 3, a well contact is connected to the n-type semiconductor layer 62n. The well contact is provided outside the imaging region R1, and when the imaging apparatus 100 is in operation, the potential at the n-type semiconductor layer 62n is controlled via the well contact. The provision of the n-type semiconductor layer 62n helps prevent minority carriers from flowing from the support substrate 61 or the surrounding circuitry 40 into the charge accumulation portion FD that stores signal charges.

Further, in this example, the semiconductor substrate 60 has a p-type region 64 which is provided between the p-type semiconductor layer 63p and the support substrate 61, penetrating the p-type semiconductor layer 61p and the n-type semiconductor layer 62n. The p-type region 64 has a higher impurity concentration than the p-type semiconductor layer 63p or the p-type semiconductor layer 65p, and serves a function to electrically connect the p-type semiconductor layer 63p and the support substrate 61 to each other.

The support substrate 61 is coupled to a substrate contact (not shown in FIG. 3) provided outside the imaging region R1. When the imaging apparatus 100 is in operation, the potentials at the support substrate 61 and the p-type semiconductor layer 63p are controlled via the substrate contact. Further, disposing the p-type semiconductor layer 65p in such a manner that the p-type semiconductor layer 65p is in contact with the p-type semiconductor layer 63p enables the potential of the p-type semiconductor layer 65p to be controlled via the p-type semiconductor layer 63p when the imaging apparatus 100 is in operation.

In the configuration exemplified in FIG. 3, the n-type impurity region 67n, which is an example of the charge accumulation portion FD, is formed inside the p-type semiconductor layer 65p. As schematically shown in FIG. 3, the n-type impurity region 67n is formed near the surface of the semiconductor substrate 60, and at least part thereof is located at the surface of the semiconductor substrate 60.

In the example in FIG. 3, the n-type impurity region 67n includes a first region 67a, a second region 67b, and a third region 67c. The second region 67b is located inside the first region 67a and has a high impurity concentration relative to the first region 67a. The third region 67c is located inside the second region 67b.

In the configuration exemplified in FIG. 3, an n-type impurity region 68an, an n-type impurity region 68bn, an n-type impurity region 68cn, and an n-type impurity region 68dn are formed in the p-type semiconductor layer 65p. Although not shown, the n-type impurity region 68an, the n-type impurity region 68bn, and the n-type impurity region 68dn may include an n+-type impurity region, like the n-type impurity region 67n. These n+-type impurity regions may also be formed by diffusion. The n+-type impurity region in the n-type impurity region 68an has a high concentration relative to the n-type impurity region 68an, like the third region 67c, which is an n+-type impurity region. The same applies to the n-type impurity region 68bn and the n-type impurity region 68dn as well. Also, impurity regions 69 are formed in the p-type semiconductor layer 65p. In the example in FIG. 3, the impurity regions 69 are element isolation regions. In the configuration exemplified in FIG. 3, specifically, the impurity region 69 being a certain element isolation region is formed between the n-type impurity region 68an and an end portion of the pixel 10A. The impurity region 69 being another element isolation region is formed between the charge accumulation portion FD and the n-type impurity region 68bn. The impurity region 69 being yet another element isolation region is formed between the n-type impurity region 68dn and another end portion of the pixel 10A. In the present embodiment, the impurity regions 69, which are element isolation regions, are implanted isolation regions. However, shallow trench isolation (STI) may be used as the element isolation regions.

Insulating layers are disposed on the semiconductor substrate 60 at the surface thereof closer to the photoelectric conversion structure 12A. In this example, the surface of the semiconductor substrate 60 closer to the photoelectric conversion structure 12A is covered by the first insulating layer 71, the second insulating layer 72, the third insulating layer 73, a fourth insulating layer 74, and a fifth insulating layer 75. The fifth insulating layer 75 is what is called a gate insulating layer, and is typically a gate oxide film.

In the present embodiment, the first insulating layer 71, the third insulating layer 73, the fourth insulating layer 74, and the fifth insulating layer 75 each contain a silicon oxide. Specifically, the first insulating layer 71, the third insulating layer 73, the fourth insulating layer 74, and the fifth insulating layer 75 each contain a silicon dioxide. The second insulating layer 72 contains a silicon nitride.

Hereinbelow, expressions such as a silicon dioxide layer and a silicon nitride layer are used. A silicon dioxide layer means a layer containing a silicon dioxide, and a silicon nitride layer means a layer containing a silicon nitride. A silicon dioxide content in a silicon dioxide layer may be 50% or higher by mass, or 80% or higher by mass. A silicon nitride content in a silicon nitride layer may be 50% or higher by mass, or 80% or higher by mass. The same applies to other similar expressions.

In the present embodiment, the first insulating layer 71, the second insulating layer 72, the third insulating layer 73, the fourth insulating layer 74, and the fifth insulating layer 75 are each in the form of a film. In other words, the first insulating layer 71 is a first insulating film. The second insulating layer 72 is a second insulating film. The third insulating layer 73 is a third insulating film. The fourth insulating layer 74 is a fourth insulating film. The fifth insulating layer 75 is a fifth insulating film.

In the present embodiment, the first insulating layer 71, the second insulating layer 72, the third insulating layer 73, the fourth insulating layer 74, and the fifth insulating layer 75 each have a single-layer structure consisting of only one layer. However, the first insulating layer 71, the second insulating layer 72, the third insulating layer 73, the fourth insulating layer 74, and the fifth insulating layer 75 may each have a stacked-layer structure including a plurality of insulating layers.

The fourth insulating layer 74 is formed on the fifth insulating layer 75. Further, the gate electrode 22e, a gate electrode 24e, and a gate electrode 26e are formed on the fifth insulating layer 75.

In the present embodiment, the gate electrodes 22e, 24e, 26e are made of a polysilicon material. The gate electrodes 22e, 24e, 26e have a high concentration of an n-type impurity introduced by ion implantation. The n-type impurity makes the gate electrodes 22e, 24e, 26e less resistant, and conductive.

A sixth insulating layer 76 is formed on the sidewall portions of the gate electrodes 22e, 24e, 26e with part of the fourth insulating layer 74 interposed therebetween. The sixth insulating layer 76 is a sidewall spacer (also called a "sidewall").

In the present embodiment, the sixth insulating layer 76 has a stacked-layer structure including a plurality of insulating layers. In one example, the sixth insulating layer 76 includes a silicon dioxide layer and a silicon nitride layer. In such an example, due to the etching selectivity of the silicon nitride layer of the sixth insulating layer 76 to the silicon dioxide in the fourth insulating layer 74, the fourth insulating layer 74 acts as an etching stopper during dry etching for forming the sidewall spacers, helping prevent the n-type impurity region 67n from being etched. It is consequently prevented that the surface of the semiconductor substrate 60 in the imaging region R1 is exposed by the dry etching. Thus, particles ionized by plasma irradiation during dry etching do not directly collide with the n-type impurity region 67n, which reduces crystallographic defects caused by the damage during the dry etching. As a result, leakage current is reduced.

The fourth insulating layer 74 is an offset sidewall spacer. An offset sidewall spacer is also called an offset sidewall. The fourth insulating layer 74 is formed in the surrounding circuitry 40 as well, as shown in FIGS. 5 to 8 to be referred to later.

As will be described later, a silicide transistor 55 is formed in the surrounding circuitry 40 of the present embodiment. The fourth insulating layer 74 may reduce the overlap capacitance of the silicide transistor 55. In the manufacture of the imaging apparatus 100, before a silicide layer of the silicide transistor 55 is formed, a heat treatment is performed in a furnace (a diffusion furnace) to recover defects in an impurity region induced by ion implantation. The fourth insulating layer 74 may reduce a short-channel effect of the silicide transistor 55 caused by the heat treatment.

The above-described operation based on the fourth insulating layer 74 is useful when a device rule employed states that the gate length is smaller than submicron. This device rule defines that, for example, the gate length should be 130 nm or less. If the gate length is equal to or longer than 150 nm, even with the fourth insulating layer 74 omitted, it is unlikely that the overlap capacitance becomes excessively large, or that the short-channel effect becomes manifest. Regardless of what kind of a device rule is employed, the fourth insulating layer 74 may or may not be provided.

As shown in FIG. 3, the third insulating layer 73, the fourth insulating layer 74, and the fifth insulating layer 75 are stacked. The stack structure of the third insulating layer 73, the fourth insulating layer 74, and the fifth insulating layer 75 is provided with a contact hole h1, a contact hole h2, a contact hole h3, and a contact hole h4. In other words, the contact hole h1, the contact hole h2, the contact hole h3, and the contact hole h4 communicate with the semiconductor substrate 60 through the stack structure of the third insulating layer 73, the fourth insulating layer 74, and the fifth insulating layer 75.

In the example shown in FIG. 3, the contact hole h1 is provided on the n-type impurity region 67n. Specifically, the contact hole h1 is provided on the third region 67c, which is an n+-type impurity region.

In the example shown in FIG. 3, the contact hole h2 is provided on the n-type impurity region 68an. The contact hole h3 is provided on the n-type impurity region 68bn. The contact hole h4 is provided on the n-type impurity region 68dn.

The contact plugs Cp1 to Cp7 are not silicide. The contact plugs Cp1 to Cp7 each include an impurity of a first conductivity type. In the present embodiment, the contact plugs Cp1 to Cp7 have a non-silicide surface. The contact plugs Cp1 to Cp7 contain phosphorus as the impurity of the first conductivity type.

A silicide is a compound of a metal and silicon. Silicon is a concept encompassing polysilicon. A non-silicide contact plug substantially does not include a silicide region. A non-silicide contact plug is, in one example, substantially formed of silicon entirely, and is, in one specific example, substantially formed of polysilicon entirely. A non-silicide surface substantially does not include a silicide region. A non-silicide surface is, in one example, substantially formed of silicon entirely, and is, in one specific example, substantially formed of polysilicon entirely. Note that what is meant by "substantially does not include a silicide region" in the above context is that the ratio of a silicide content to the whole is less than 10% by mass, and this silicide content is typically less than 5% by mass, or may be 0% by mass. In addition, what is meant by "substantially formed of silicon" is that the ratio of a silicon content to the whole is 90% or higher by mass, and this silicon content is typically 95% or higher by mass, or may be 100% by mass. The same applies to "substantially formed of polysilicon".

In one specific example, a silicide is formed in the surrounding region R2. There may be more than one phase of silicide. For example, there may be two or more phases having different composition ratios of a metal element (M) to silicon (Si) (e.g., $MSi_2$, $M_2Si$, and MSi). In addition, there may be two or more phases by including silicides with different metal elements. The kind of the metal contained in the silicide is not limited to any particular kind, but may be preferably at least one kind selected from a group including titanium (Ti), cobalt (Co), nickel (Ni), platinum (Pt), and the like, or more preferably Ni or Pt, or most preferably Ni. A silicide formed with any of these elements exhibits higher electron conductance than a silicide formed with other elements. In particular, NiSi, which is a silicide having Ni as a metal element, exhibits very high electron conductance and is therefore preferable. In one specific example, a silicide is formed in the surrounding region R2, and the non-silicide contact plugs substantially do not contain a silicide which is $MSi_2$, $M_2Si$, or $MSi$.

In the present embodiment, the non-silicide surfaces of the contact plugs Cp1 to Cp7 are in contact with the via plugs 88. The non-silicide surfaces of the contact plugs Cp1 to Cp7 are in contact with portions of the first insulating layer 71 that are located above the contact plugs Cp1 to Cp7. Here, "above the contact plugs" means an opposite side of the contact plugs from the semiconductor substrate 60.

In the example shown in FIG. 3, the contact plug Cp1 extends through the contact hole h1 and connects the conductive structure 89 to the n-type impurity region 67n (or specifically the third region 67c, which is an n+-type impurity region). Thereby, the n-type impurity region 67n is electrically connected to the pixel electrode 12a of the photoelectric conversion structure 12A via the contact plug Cp1 and the conductive structure 89. In this example, the n-type impurity region 67n is the charge accumulation portion FD and is where signal charges generated by the photoelectric conversion structure 12A are stored.

The junction capacitance formed in a PN junction between the p-type semiconductor layer 65p and the n-type impurity region 67n serves as capacitance where at least part of the signal charges are stored. Thereby, the n-type impurity region 67n serves as the charge accumulation portion FD that temporarily retains signal charges. The p-type semiconductor layer 65p serves as a p-well.

The second region 67b is formed by, for example, ion implantation.

The third region 67c, which is an n+-type impurity region, contains an impurity having the same composition as that in the contact plug Cp1. In the present embodiment, this impurity is phosphorus. In the present embodiment, the impurity in the third region 67c is introduced from the contact plug Cp1 by diffusion caused by the heat treatment performed in the manufacture of the imaging apparatus 100. Typically, the concentration of the impurity in the third region 67c is high. Specifically, the third region 67c is formed first by ion implantation like the second region 67b and then by introduction of the above-described diffused impurity into the ion-implanted region.

It is not essential that both of the second region 67b and the third region 67c are formed in the n-type impurity region 67n. The first region 67a may be connected to the contact plug Cp1. Alternatively, the second region 67b may be connected to the contact plug Cp1.

The contact resistance between the n-type impurity region 67n and the contact plug Cp1 is more likely to be reduced when the second region 67b is connected to the contact plug Cp1 than when the first region 67a is connected to the contact plug Cp1. This is because the second region 67b has a higher impurity concentration than the first region 67a.

Further, the contact resistance between the n-type impurity region 67n and the contact plug Cp1 is more likely to be reduced when the third region 67c is connected to the contact plug Cp1 than when the second region 67b is connected to the contact plug Cp1. This is because the difference between the impurity concentration in the third region 67c and that in the contact plug Cp1 is smaller than the difference between the impurity concentration in the second region 67b and that in the contact plug Cp1. In one specific example, the third region 67c and the contact plug Cp1 have the same impurity concentration. Note that the "impurity concentration" in the above context is, when one type of impurity is contained in an element, the concentration of that impurity, and when two or more types of impurities are contained in an element, the total concentration of those impurities.

The signal detecting circuit 14A is formed on the semiconductor substrate 60. As described earlier, the signal detecting circuit 14A includes the signal detection transistor 22, the address transistor 24, and the reset transistor 26.

The signal detection transistor 22 includes the n-type impurity region 68bn as one of its source and drain and includes the n-type impurity region 68cn as the other one of its source and drain. The signal detection transistor 22 further includes the gate electrode 22e provided on the fifth insulating layer 75. A part of the fifth insulating layer 75 that is located between the gate electrode 22e and the semiconductor substrate 60 functions as a gate insulating layer of the signal detection transistor 22. The gate electrode 22e is connected to the pixel electrode 12a and the n-type impurity region 67n via the contact plug Cp5 and the conductive structure 89. For example, at the layer where the address signal line 34 and the reset signal line 36 are located, the gate electrode 22e is connected to a portion 39 of the conductive structure 89, the portion 39 connecting the pixel electrode 12a and the contact plug Cp1 to each other.

The contact plug Cp3 is connected to the n-type impurity region 68bn. A part of the contact plug Cp3 is provided inside the contact hole h3. The above-described power source wiring 32 as a source follower power supply is electrically connected to the contact plug Cp3. Note that the power source wiring 32 is not shown in FIG. 3.

The address transistor 24 includes the n-type impurity region 68cn as one of its source and drain and includes the n-type impurity region 68dn as the other one of its source and drain. The address transistor 24 further includes the gate electrode 24e provided on the fifth insulating layer 75. A portion of the fifth insulating layer 75 that is located between the gate electrode 24e and the semiconductor substrate 60 functions as a gate insulating layer of the address transistor 24. The address signal line 34 is connected to the gate electrode 24e via the contact plug Cp6 and the conductive structure 89. In this example, the address transistor 24 and the signal detection transistor 22 share the n-type impurity region 68cn and are thereby electrically connected to each other.

The contact plug Cp4 is connected to the n-type impurity region 68dn. A part of the contact plug Cp4 is provided inside the contact hole h4. The contact plug Cp4 is electrically connected to the vertical signal line 35.

The reset transistor 26 includes the n-type impurity region 67n as one of its source and drain, and includes the n-type impurity region 68an as the other one of its source and drain. In other words, in the example shown, one of the source and the drain of the reset transistor 26 is the n-type charge accumulation portion FD. The reset transistor 26 further includes the gate electrode 26e provided on the fifth insulating layer 75. A portion of the fifth insulating layer 75 that is located between the gate electrode 26e and the semiconductor substrate 60 functions as a gate insulating layer of the reset transistor 26. The reset signal line 36 is connected to the gate electrode 26e via the contact plug Cp7 and the conductive structure 89. The contact plug Cp7 is connected to the gate electrode 26e. The contact plug Cp7 is formed of, for example, polysilicon doped with an impurity in order to be conductive.

As shown in FIG. 3, the n-type impurity region 68an is connected to the contact plug Cp2. A part of the contact plug Cp2 is provided inside the contact hole h2. The contact plug Cp2 is electrically connected to the feedback line 53 via the conductive structure 89.

Although not shown in FIG. 3, in the present embodiment, the surrounding circuitry 40 includes a silicide layer. The silicide layer may also be referred to as a metal silicide layer. By contrast, as already described, the contact plugs Cp1 to Cp7 are not silicide.

In the example in FIG. 3, the first insulating layer 71 is formed on the upper and side surfaces of each of the contact plugs Cp1 to Cp7. In connection with being or not being silicide, the first insulating layer 71 provides useful effects in the manufacture of the imaging apparatus 100. This point is described below while describing the configuration of the surrounding region R2 of the present embodiment.

Figure 5:
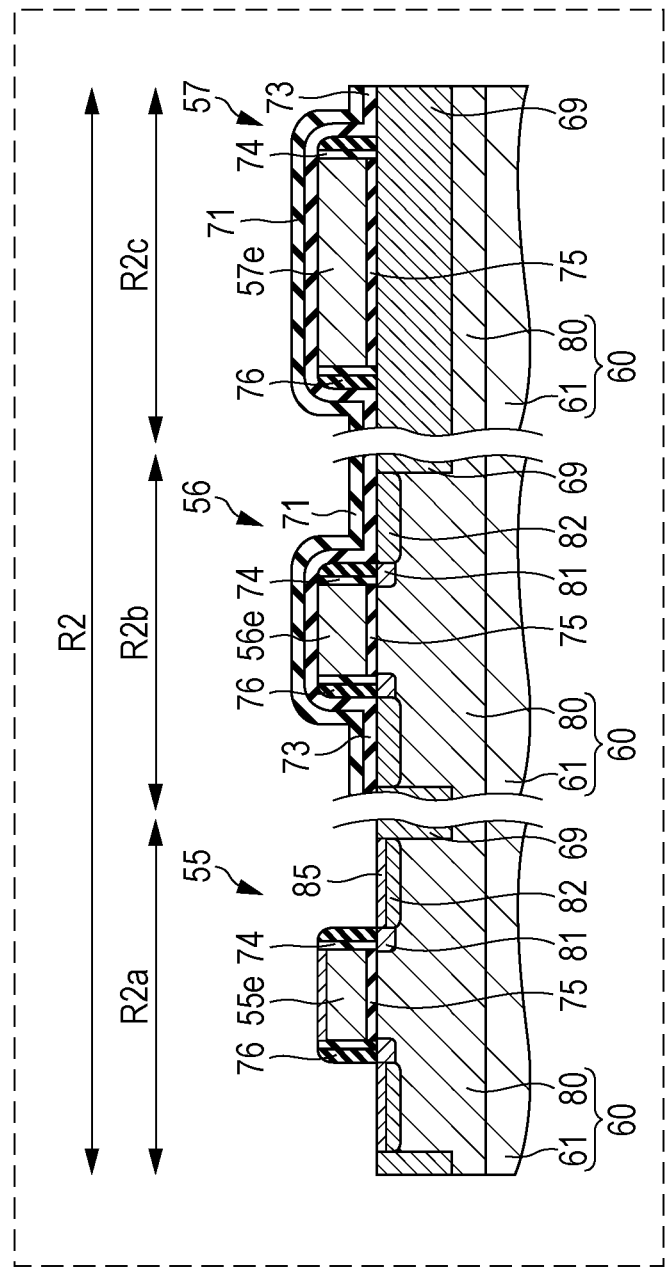
FIG. 5 is an explanatory diagram illustrating the structure of a surrounding region in the imaging apparatus according to the embodiment.

As shown in FIG. 5, in the present embodiment, the surrounding region R2 includes a silicide transistor region R2a, a non-silicide transistor region R2b, and a non-silicide resistance element region R2c. Specifically, the surrounding circuitry 40 includes these regions R2a, R2b, and R2c.

The silicide transistor 55 is formed in the silicide transistor region R2a. In the present embodiment, the silicide transistor 55 is an n-type MOSFET.

Alternatively, the silicide transistor 55 may be a p-type MOSFET. A non-silicide transistor 56 is formed in the non-silicide transistor region R2b. A non-silicide resistance element 57 is formed in the non-silicide resistance element region R2c.

Note that after the structure in FIG. 5 is obtained, processing such as connecting a plug to the silicide transistor 55 may be performed. The same applies to the non-silicide transistor 56 and the non-silicide resistance element 57 as well. In one specific example, for the connection of the plugs to the non-silicide transistor 56 and the non-silicide resistance element 57, through-holes are provided in the first insulating layer 71 and the third insulating layer 73 shown in FIG. 5.

In the silicide transistor region R2a, a p-type impurity region 80 is formed in the semiconductor substrate 60. The p-type impurity region 80 is what is called a p-well.

In the silicide transistor region R2a, n-type impurity regions 81 and n+-type impurity regions 82 are formed in the p-type impurity region 80. The n-type impurity regions 81 and the n+-type impurity regions 82 are formed by implantation, forming a lightly-doped drain (LDD) structure. In other words, the silicide transistor 55 is an LDD transistor. The source and the drain of the silicide transistor 55 are formed by the n+-type impurity regions 82. A silicide layer 85 is formed on the source and the drain of the silicide transistor 55. Examples of a silicide in the silicide layer 85 include a titanium silicide, a cobalt silicide, and a nickel silicide. A gate electrode 55e of the silicide transistor 55 is formed with the interposition of the fifth insulating layer 75, which is a gate insulating layer. The silicide layer 85 is formed on the gate electrode 55e as well. The fourth insulating layer 74 is formed on the sidewalls of the gate electrode 55e. In the silicide transistor region R2a, unlike in the imaging region R1, the fourth insulating layer 74 is not formed along the surface of the semiconductor substrate 60. The sixth insulating layer 76, which is a sidewall spacer, is formed in contact with the fourth insulating layer 74.

When a metal plug is connected to the silicide layer 85 of the silicide transistor 55, the silicide transistor 55 can reduce the contact resistance between the silicide layer 85 and the metal plug.

In the non-silicide transistor region R2b, the source and the drain of the non-silicide transistor 56 are formed by the n+-type impurity regions 82. The silicide layer 85 is not formed on the source and the drain of the non-silicide transistor 56. The silicide layer 85 is not formed on a gate electrode 56e of the non-silicide transistor 56, either. The upper surfaces of the source, the drain, and the gate electrode 56e are covered by the first insulating layer 71 and the third insulating layer 73.

The non-silicide transistor 56 may be used as an anti-surge measure. In one specific example, a certain circuit and the non-silicide transistor 56 are formed in the surrounding circuitry 40. The non-silicide transistor 56 is used as an electrostatic discharge (ESD) protection transistor. The non-silicide transistor 56 is disposed between a pad for external connection and the certain circuit. Using the non-silicide transistor 56 as an ESD protection transistor reduces the risk that a transistor in the certain circuit is destroyed by a surge coming from the pad for external connection and that the performance of the certain circuit degrades consequently. Examples of the certain circuit include an input circuit, an output circuit, an input/output circuit, and an internal circuit.

In the non-silicide resistance element region R2c, the non-silicide resistance element 57 is formed on the shallow trench isolation 69, which is an element isolation region. A resistance element body 57e is formed on the shallow trench isolation 69, which is an element isolation region, with the interposition of the fifth insulating layer 75, which is a gate insulating layer. The resistance element body 57e is formed of polysilicon. The fourth insulating layer 74 is formed on the sidewalls of the resistance element body 57e, and the sixth insulating layer 76, which is a sidewall spacer, is formed on the sidewalls of the resistance element body 57e with the fourth insulating layer 74 interposed therebetween. The upper surface of the resistance element body 57e is covered by the first insulating layer 71 and the third insulating layer 73.

The non-silicide resistance element 57 may be included in an analog-digital converter (ADC), a digital-analog converter (DAC), or the like. In one specific example, the non-silicide resistance element is included in an ADC in the column signal processing circuit 47. The non-silicide resistance element is suitable for use in a sophisticated ADC having a resolution exceeding 10 bits or in a DAC having a small area.

Figure 6:
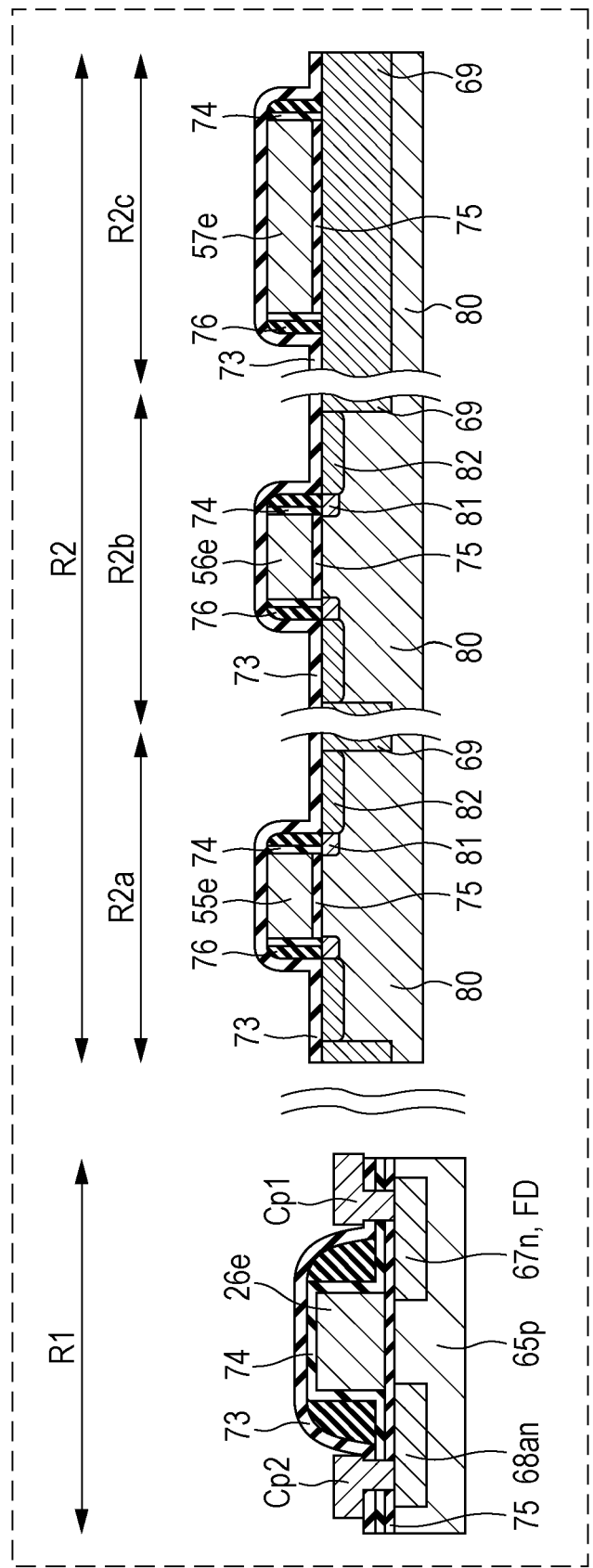
FIG. 6 is an explanatory diagram illustrating steps for manufacturing the imaging apparatus according to the embodiment.
Figure 7:
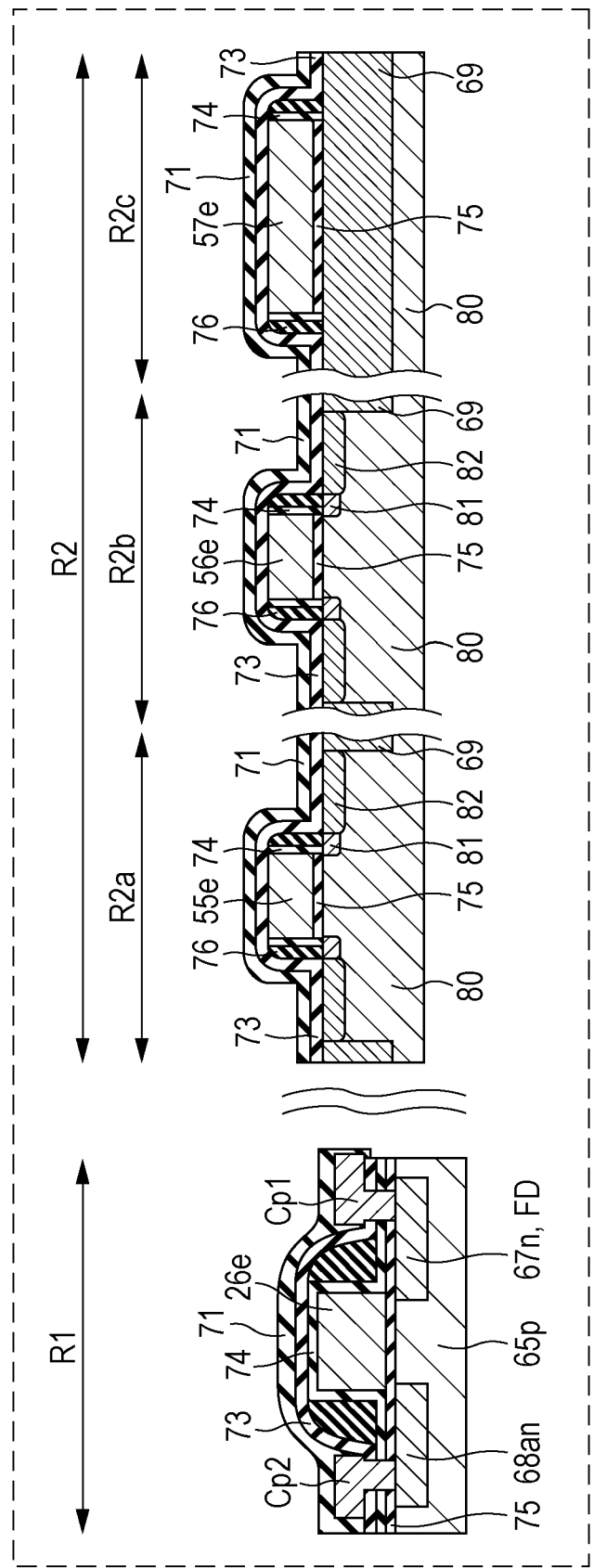
FIG. 7 is an explanatory diagram illustrating steps for manufacturing the imaging apparatus according to the embodiment.
Figure 8:
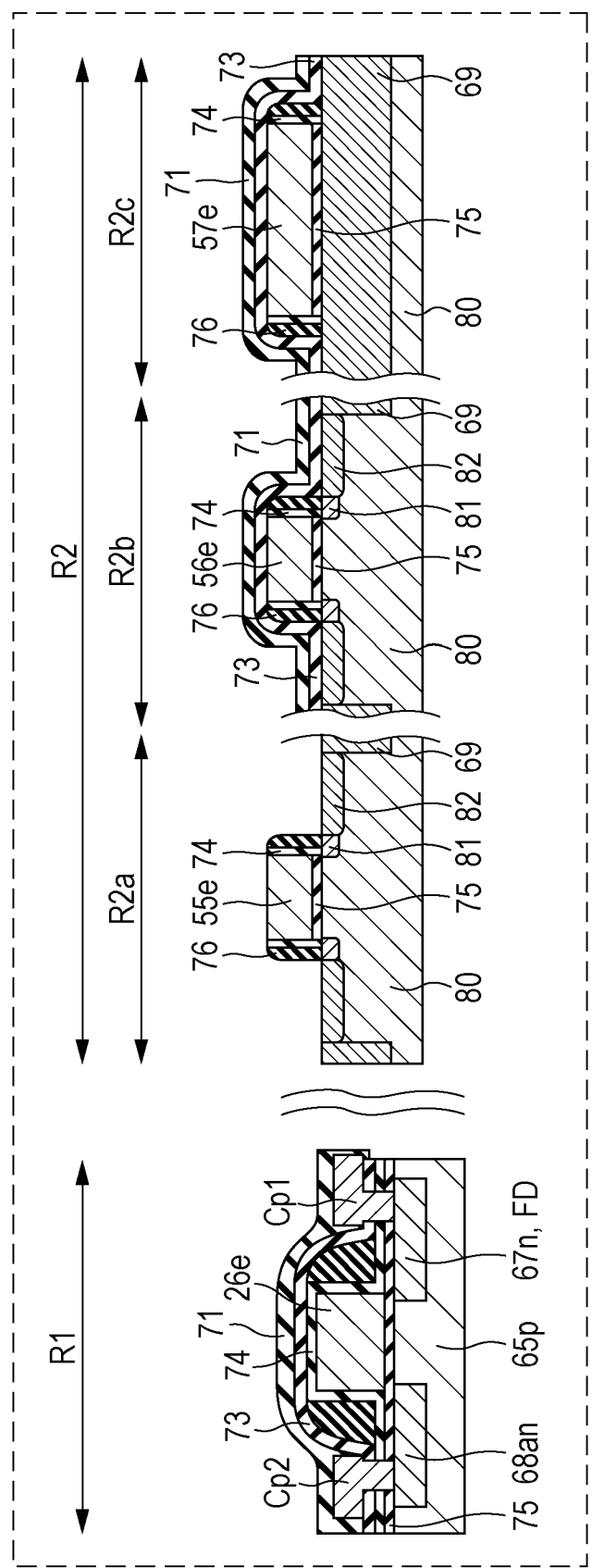
FIG. 8 is an explanatory diagram illustrating steps for manufacturing the imaging apparatus according to the embodiment.

As described earlier, in connection with being or not being silicide, the first insulating layer 71 provides useful effects in the manufacture of the imaging apparatus 100. This point is described below with reference to FIGS. 6 to 8. Note that FIGS. 6 to 8 are schematic diagrams for illustration. Thus, FIGS. 6 to 8 show only part of the manufacturing steps. Moreover, FIGS. 6 to 8 do not show some of the elements in the imaging apparatus 100. For example, FIGS. 6 to 8 do not show the first region 67a, the second region 67b, the third region 67c, and the contact plug Cp7.

In the manufacture of the imaging apparatus 100 of the present embodiment, a first product in process of the imaging apparatus 100 is fabricated.

FIG. 6 shows the first product in process.

The first product in process includes, in the imaging region R1, the third insulating layer 73, the fourth insulating layer 74, the fifth insulating layer 75, and the contact plugs Cp1 to Cp7. FIG. 6 depicts the contact plugs Cp1 and Cp2 out of the contact plugs Cp1 to Cp7.

The first product in process has, in the surrounding region R2, the third insulating layer 73. Specifically, in the silicide transistor region R2a, the upper surfaces of the paired n+-type impurity regions 82 and the upper surface of the gate electrode 55e are covered by the third insulating layer 73. In the non-silicide transistor region R2b, the upper surfaces of the paired n+-type impurity regions 82 and the upper surface of the gate electrode 56e are covered by the third insulating layer 73. In the non-silicide resistance element region R2c, the resistance element body 57e is covered by the third insulating layer 73.

Next, a material of the first insulating layer 71 is deposited on the first product in process from a direction opposite from the semiconductor substrate 60. The contact plugs Cp1 to Cp7 of the first product in process are thereby covered by the first insulating layer 71 from a direction opposite from the semiconductor substrate 60. A second product in process is thus obtained. FIG. 7 shows the second product in process.

In the imaging region R1 of the second product in process, the first insulating layer 71 is formed on the upper surface and side surfaces of each of the contact plugs Cp1 to Cp7. As shown in FIG. 7, in the second product in process, through-holes communicating with the contact plugs Cp1 to Cp7 are not formed in the first insulating layer 71 in the imaging region R1.

In the second product in process, the first insulating layer 71 is formed in the surrounding region R2 as well. Specifically, the first insulating layer 71 is formed on the third insulating layer 73.

Next, a heat treatment is performed on the second product in process. The contact plugs Cp1 to Cp7 are thereby heated, and the impurity of the first conductivity type contained in the contact plugs Cp1 to Cp7 is activated. Specifically, phosphorus is activated. A third product in process is thus obtained. In the present embodiment, this heat treatment is carried out in a nitrogen atmosphere at 800° C. or higher.

This heat treatment for activation is performed with the contact plugs Cp1 to Cp7 covered by the first insulating layer 71. Hereinbelow, this heat treatment may be called covered annealing. The covered annealing can reduce diffusion of the impurity of the first conductivity type from the inside to the outside of the contact plugs Cp1 to Cp7. Thus, with the covered annealing, the impurity concentrations in the contact plugs Cp1 to Cp7 can be maintained at high levels. Moreover, the covered annealing facilitates making the impurity concentrations in the contact plugs Cp1 to Cp7 constant in terms of the depth direction of the semiconductor substrate 60. These points are advantageous in securing the concentration of the impurity at each of the contact portions between the contact plugs Cp1 to Cp7 and the via plugs 88 in the imaging apparatus 100. This may reduce the contact resistances between the contact plugs Cp1 to Cp7 and the via plugs 88.

Next, a silicide forming step is performed on the third product in process to form a silicide in the surrounding region R2. In the silicide forming step, first, the first insulating layer 71 and the third insulating layer 73 in the surrounding region R2 are partially removed. Specifically, in a silicide region of the surrounding region R2, the first insulating layer 71 and the third insulating layer 73 are removed. In a non-silicide region of the surrounding region R2, the first insulating layer 71 and the third insulating layer 73 are unremoved. In the present embodiment, the partial removal of the first insulating layer 71 and the third insulating layer 73 is performed by photolithography and etching.

The non-silicide region is where a silicide layer is not to be formed, and the silicide region is where a silicide layer is to be formed. In the example in FIGS. 5 to 8, the imaging region R1, the non-silicide transistor region R2b, and the non-silicide resistance element region R2c are non-silicide regions, and the silicide transistor region R2a is a silicide region. Thus, the first insulating layer 71 and the third insulating layer 73 are removed in the silicide transistor region R2a. In the silicide transistor region R2a, the upper surfaces of the paired n+-type impurity regions 82 and the upper surface of the gate electrode 55e are exposed.

In the present embodiment, parts of the already-formed first and third insulating layers 71 and 73 that belong in the silicide region are removed. Thereby, silicon in the silicide region is exposed, allowing a metal to be deposited on this exposed portion. In the present embodiment, the first insulating layer 71 and the third insulating layer 73 contain the same material. This is advantageous in simplifying the step of partially removing the first insulating layer 71 and the third insulating layer 73. For example, this enables the partial removal to be performed by one-time etching.

For example, the partial removal of the first insulating layer 71 and the third insulating layer 73 can be achieved by photolithography and etching using resists. Etching may be dry etching or wet etching. Dry etching is suitable for microfabrication with a small minimum feature size, whereas with wet etching, plasma damage caused by dry etching can be avoided. When an insulating layer to be removed is a silicon dioxide, can be used as an etching solution for wet etching.

FIG. 8 shows a product in process in which the partial removal has been performed by the silicide forming step.

Further, in the silicide forming step, a metal is deposited on this product in process after the partial removal, from a direction opposite from the semiconductor substrate 60. In the present embodiment, the metal deposition is performed by sputtering. After the metal deposition, a heat treatment is performed. As a result of the silicide forming step, a fourth product in process is obtained.

The metal deposition is carried out on the first insulating layer 71 in the imaging region R1, the non-silicide transistor region R2b, and the non-silicide resistance element region R2c. In these regions, the first insulating layer 71 acts as a silicide block layer. Thus, the deposited metal prevents a silicide from being formed in these regions. Meanwhile, in the silicide transistor region R2a, the metal deposition is carried out on the upper surfaces of the paired n+-type impurity regions 82 and the upper surface of the gate electrode 55e. The heat treatment is performed with the metal being in contact with the above upper surfaces, and consequently, a silicide is formed.

After the silicide forming step, the metal on the first insulating layer 71, which is a silicide block layer, is removed by cleaning. Thereafter, various steps follow, such as a step of depositing the second insulating layer 72.

Referring back to FIG. 3 showing the imaging apparatus 100, the description is continued.

In the imaging region R1, the first insulating layer 71 is in contact with the upper and side surfaces of the contact plugs Cp1 to Cp7. The first insulating layer 71 is in contact with the side surfaces of the via plugs 88. One of the main surfaces of the first insulating layer 71 is in contact with the third insulating layer 73. The other main surface of the first insulating layer 71 is in contact with the second insulating layer 72.

Between the first insulating layer 71 and the third insulating layer 73, there is a region where the contact plugs Cp1 to Cp7 are situated. There is also a region where the first insulating layer 71 and the third insulating layer 73 are in contact with each other. This contact structure is formed in the imaging region R1 and the non-silicide regions in the surrounding circuitry 40.

In the imaging region R1, the gate electrodes 22e, 24e, 26e, the contact plugs Cp5, Cp6, Cp7, and the first insulating layer 71 are stacked in this order. Meanwhile, as is understood from FIG. 5, in the silicide region of the surrounding region R2, there are no contact plug, first insulating layer 71, third insulating layer 73, or fourth insulating layer 74 on the gate electrode. This may become a factor in generating a global step between the imaging region R1 and the surrounding region R2. A global step is a wavy step that extends over a wide range on a chip based on the difference in density between arrangement patterns of circuit elements. In the present embodiment, after the deposition of the seventh insulating layer 91, chemical-mechanical polishing (CMP) for flattening the surface of the seventh insulating layer 91 is performed to reduce the global step. However, it is not necessarily easy to completely remove the global step with CMP.

A global step can cause a problem in steps of manufacturing the imaging apparatus 100. For example, a global step may appear in the seventh insulating layer 91 in such a manner that a part of the seventh insulating layer 91 that belongs in the imaging region R1 is, as a whole, raised upward from a part thereof that belongs in the surrounding region R2. What is meant by a part being "raised upward" is that the part juts out in the direction opposite from the semiconductor substrate 60. A case is considered now of forming holes in the seventh insulating layer 91 having such a global step by photolithography in both the imaging region R1 and the surrounding region R2. Holes formed in the imaging region R1 are, for example, the connection holes 88h communicating with the contact plugs Cp1 to Cp7. Holes formed in the surrounding region R2 are, for example, holes to house conductors to be connected to the silicide transistor 55, the non-silicide transistor 56, and the non-silicide resistance element 57. If the global step is large, it is difficult to pattern these holes properly due to insufficient depth of focus of the lens used in photolithography. In the imaging region R1, this may cause poor connections between the via plugs 88 and the contact plugs Cp1 to Cp7. Further, in the surrounding region R2, this may cause poor connections between the silicide transistor 55, the non-silicide transistor 56, and the non-silicide resistance element 57 and the conductors.

A specific description is now given of poor connections in the holes due to a global step. A minimum resolution R in a projection exposure apparatus is known to be proportional to $\lambda$/NA, where $\lambda$ is a wavelength used, and NA is the numerical aperture of an optical system. Hence, conventionally, the optical system has been designed to have a larger numerical aperture NA to improve the resolution of the projection exposure apparatus in order to support LSI with a higher level of integration in recent years. However, it is known that increasing the numerical aperture NA of the optical system does reduce the minimum resolution R, but more importantly, reduces the depth of focus DOF of the projection exposure apparatus. The depth of focus DOF is proportional to/$NA^2$. Hence, by trying to improve the resolution, a conventional projection exposure apparatus faces a problem of having a small depth of focus and therefore having poor transfer accuracy.

An ArF excimer laser reduced exposure apparatus with a wavelength used $\lambda$ of 193 nm is used to form the connection hole 88h with a diameter of 100 nm or less. Owing to the improvement in the performance of resist materials and the evolution of masks used in a projection exposure apparatus, the minimum resolution R of 100 nm or less can be achieved by use of an ArF excimer laser reduced exposure apparatus. However, as for the depth of focus DOF, variation components of 200 nm are needed considering lens performance of the reduced projection exposure apparatus such as the curvature of field and the stage performance of the reduced projection exposure apparatus. Further, the depth of focus DOF has to be determined after adding the amount of the global step to the variation components of 200 nm.

If $\lambda$ is 193 nm and NA is 0.7, the depth of focus DOF is generally 250 nm. After subtraction of 200 nm which is the value of the variation components of the lens and stage performance described above, only 50 nm or so is left as a value allowed for a global step. It is therefore preferable to reduce the film thicknesses of the contact plugs, the first insulating layer 71, the third insulating layer 73, and the fourth insulating layer 74 formed in the imaging region R1. However, the film thickness difference of the contact plugs, the first insulating layer 71, the third insulating layer 73, and the fourth insulating layer 74 in the imaging region R1 is not directly reflected in the surrounding region R2 or particularly the silicide transistor 55 as a global step. A step is still present after CMP. It is hence important to reduce the film thickness of the first insulating layer 71, which can be easily reduced in thickness due to its function.

In view of this, the thickness of the first insulating layer 71 in the imaging apparatus 100 can be set to, for example, 50 nm or less. When the first insulating layer 71 is this thin, it is advantageous in reducing the above-described global step. The first insulating layer 71 may be 25 nm or less in thickness. The first insulating layer 71 may be 15 nm or less in thickness.

Further, as is understood from the above description referring to FIG. 7, the first insulating layer 71 offers an effect of suppressing diffusion of the impurity of the first conductivity type from the inside to the outside of the contact plugs Cp1 to Cp7. To ensure this effect, the first insulating layer 71 in the imaging apparatus 100 may be, for example, 10 nm or greater in thickness. When the first insulating layer 71 is this thick, the diffusion suppression effect can be provided while the above-described covered annealing is performed by a heat treatment in a nitrogen atmosphere at 800° C. or higher. As described earlier, the diffusion suppression effect can help maintain the impurity concentrations in the contact plugs Cp1 to Cp7 at high levels. By this effect, a drop in the impurity concentrations due to covered annealing can be reduced to, for example, approximately 20%. Further, the impurity concentrations in the contact plugs Cp1 to Cp7 can be made uniform in terms of the depth direction of the semiconductor substrate 60.

In order to achieve the diffusion suppression effect and the reduction in the global step at the same time, the thickness of the first insulating layer 71 in the imaging apparatus 100 can be set to, for example, greater than or equal to 10 nm and less than or equal to 50 nm. The thickness of the first insulating layer 71 in the imaging apparatus 100 may be in a range of greater than or equal to 10 nm to less than or equal to 25 nm. The thickness of the first insulating layer 71 may be greater than or equal to 10 nm and less than or equal to 15 nm.

Note that the thickness of the first insulating layer 71 may be reduced in the silicide forming step described with reference to FIG. 8. For example, in the present embodiment, before the metal deposition is performed by sputtering, a cleaning treatment is performed to remove oxide residues and the like inhibiting a silicidation reaction, using a treatment called single-wafer chemical dry cleaning treatment (CDT). This treatment may reduce the thickness of the first insulating layer 71. Further, a chemical is used in order to induce a silicidation reaction. This chemical may reduce the thickness of the first insulating layer 71. By the silicide forming step, the thickness of the first insulating layer 71 is reduced from, for example, a range of greater than or equal to 20 nm to less than or equal to 35 nm to a range of greater than or equal to 10 nm to less than or equal to 25 nm.

In a typical example, there is a correlation between the thickness of the first insulating layer 71 before the silicide forming step and the thickness of the first insulating layer 71 after the silicide forming step. For this reason, setting the upper value, the lower value, and/or the range of the thickness of the first insulating layer 71 in the imaging apparatus 100 as above has significance in reducing the global step and/or providing the diffusion suppression effect.

With reference to FIG. 3, the description is continued below about other elements in the imaging apparatus 100 according to the present embodiment, such as the second insulating layer 72.

The second insulating layer 72 is formed using a film formation method called atomic layer deposition (ALD) offering good coverage. The second insulating layer 72 has a first surface, a second surface, and hole inner surfaces. As a whole, the first surface is located at a higher level than the second surface. The first surface of the second insulating layer 72 is in contact with the seventh insulating layer 91. The second surface of the second insulating layer 72 is in contact with the first insulating layer 71. The hole inner surfaces of the second insulating layer 72 are in contact with the via plugs 88.

In the present embodiment, the seventh insulating layer 91 is a silicon dioxide layer. The seventh insulating layer 91 is thicker than the first insulating layer 71 or the second insulating layer 72. For example, the seventh insulating layer 91 is approximately 300 nm to 600 nm in thickness.

Note that in the manufacture of the imaging apparatus 100 in the present embodiment, the seventh insulating layer 91 is flattened by CMP. By the CMP, the seventh insulating layer 91 is polished and reduced in thickness. For example, the CMP causes the thickness of the seventh insulating layer 91 in the imaging region R1 to be reduced from a range of approximately 700 nm to 900 nm to a range of approximately 300 nm to 400 nm. Thereby, the thickness of the seventh insulating layer 91 becomes approximately 300 nm to 600 nm as described above.

The thickness of the seventh insulating layer 91 defines the distance from the contact plugs Cp5 to Cp7 to the metal wiring 87. Increasing these distances appropriately can reduce a decrease in circuit speed. Increasing this distance appropriately can reduce parasitic capacitances between the contact plugs Cp5 to Cp7 and the metal wiring 87. The distance from the contact plugs Cp5 to Cp7 to the metal wiring 87 is, for example, approximately 150 nm to 250 nm.

In the manufacture of the imaging apparatus 100, the connection holes 88h are formed in the seventh insulating layer 91 by etching. The second insulating layer 72 acts as an etching stopper, or more specifically, as an etching stopper film. In this regard, the second insulating layer 72 is a silicon nitride layer in this embodiment. A silicon nitride layer is suitable as an etching stopper.

A description is further given of advantages based on the material of the second insulating layer 72. As shown in FIG. 3, in the present embodiment, a plurality of connection holes 88h are formed. In the example in FIG. 3, not all the connection holes 88h have the same depth. This is because the circuit elements on the semiconductor substrate 60 side to which to connect the via plugs 88 are at different heights. Specifically, in a certain region, a contact plug is formed on the source or drain of a transistor situated in the semiconductor substrate 60. In a different region, a contact plug is formed on the gate electrode of a transistor situated on the semiconductor substrate 60. There is a step between the former and latter contact plugs, the step being, for example, 100 nm or greater in size. Thus, the connection hole 88h extending to the former contact plug is deeper than the connection hole 88h extending to the latter contact plug. Assume that the second insulating layer 72 and the seventh insulating layer 91 are made of the same material. Then, if the seventh insulating layer 91 is etched based on the former region, the connection hole 88h may extend into the contact plug in the latter region. By contrast, if the seventh insulating layer 91 is etched based on the latter region, the etching may stop in the former region before the connection hole 88h reaches the contact plug. This phenomenon is called etching stop. However, in the present embodiment, the second insulating layer 72 and the seventh insulating layer 91 are made of different materials. This provides etching selectivity of these materials, and allows the connection holes 88h to be formed at appropriate depths in both the former and latter regions even if there is a step between these regions as described above. Note that, in one specific example, the relative permittivity of the silicon dioxide layer constituting the seventh insulating layer 91 is 3.9, and the relative permittivity of the silicon nitride layer constituting the second insulating layer 72 is 7.0.

In order to make the second insulating layer 72 act as an etching stopper, the second insulating layer 72 should be moderately thick. The thickness of the second insulating layer 72 is, for example, 30 nm or greater.

On the other hand, in order to reduce the parasitic capacitance of the second insulating layer 72 to reduce a decrease in circuit speed, the second insulating layer 72 should be moderately thin. Particularly if the second insulating layer 72 is a silicon nitride layer, the above-described effect is more easily obtained when the second insulating layer 72 is moderately thin. This is because a silicon nitride layer has a high relative permittivity and tends to have a large parasitic capacitance. The thickness of the second insulating layer 72 is, for example, 50 nm or less.

Moreover, the second insulating layer 72 should be moderately thin in order to reduce contact resistance as well. With reduction in chip size, the area of the surrounding region R2 is getting smaller. In particular, with reduction in chip size of the surrounding region R2, the distance between gate electrodes is getting smaller, and 65-nm design rule states that the minimum width between gate electrodes is approximately 270 nm. However, the fourth insulating layer 74, which is an offset sidewall spacer, and the sixth insulating layer 76, which is a sidewall spacer, are formed between the gate electrodes. For example, if the fourth insulating layer 74 and the sixth insulating layer 76 are formed with thicknesses of 10 nm and 50 nm, respectively, there is only 150 nm or so left after the thickness of the fourth insulating layer 74, which is an offset sidewall spacer, and the thickness of the sixth insulating layer 76, which is a sidewall spacer, are subtracted from 270 nm, which is the minimum width between the gate electrodes. Further, if the second insulating layer 72 is formed with a thickness of 50 nm, the width of the via plug 88 between the gate electrodes in contact with the semiconductor substrate 60 has to be 50 nm or less. Then, in the surrounding region R2, the contact area between the via plug 88, which is a conductor, and the silicide layer 85 on the source and drain of the silicide transistor 55 is reduced, which in turn causes an increase in contact resistance. In terms of these points as well, it is desirable that the second insulating layer 72 be moderately thin.

In order to make the second insulating layer 72 act as an etching stopper, reduce the parasitic capacitance of the second insulating layer 72, and reduce contact resistance, the thickness of the second insulating layer 72 is, for example, greater than or equal to 30 nm and less than or equal to 50 nm. Note that, in a typical example, if the second insulating layer 72 is a silicon nitride layer, etching may partially remove the second insulating layer 72, but does not decrease the overall thickness of the second insulating layer 72. Further, in a typical example, if the second insulating layer 72 is a silicon nitride layer, the second insulating layer 72 is substantially not reduced in thickness even when washed. Thus, the thickness of the second insulating layer 72 before etching and the thickness of the second insulating layer 72 in the completed imaging apparatus 100 may be substantially the same. An example of the thickness of the second insulating layer 72, such as one greater than or equal to 30 nm and less than or equal to 50 nm described herein, can also be regarded as an example of the thickness of the second insulating layer 72 in the completed imaging apparatus 100, irrespective of the material of the second insulating layer 72.

In the present embodiment, dry etching is used for the etching to form the connection holes 88h in the seventh insulating layer 91. This dry etching includes the first stage and the second stage.

In the first stage of dry etching, through-holes are formed in the seventh insulating layer 91, but not in the second insulating layer 72. To put it differently, for the first stage of dry etching, the etching selectivity between the seventh insulating layer 91 and the second insulating layer 72 is set so as to obtain such a result. The etching selectivity between the seventh insulating layer 91 and the second insulating layer 72 is a value obtained by dividing the etching rate of the seventh insulating layer 91 by the etching rate of the second insulating layer 72. In one specific example, this selectivity is 17. Thus, in the first stage of dry etching, the seventh insulating layer 91 is etched 17 times faster than the second insulating layer 72.

In the second stage of dry etching, the second insulating layer 72 and the first insulating layer 71 are etched with the seventh insulating layer 91 used as a hard mask, thereby forming through-holes in these layers. In the second stage of dry etching according to one specific example, the etching selectivity between the second insulating layer 72 and the first insulating layer 71 is 1. The etching selectivity between the second insulating layer 72 and the seventh insulating layer 91 is also 1.

In order for parasitic capacitances to be small between the contact plugs Cp5 to Cp7 and the metal wiring 87, the contact plugs Cp5 to Cp7 and the metal wiring 87 should be at a certain distance from each other. In order to do so, the seventh insulating layer 91 should be thick to a certain degree. In this regard, in the second stage of dry etching, if the second insulating layer 72 is thick, the seventh insulating layer 91, which is a hard mask used to form through-holes in the second insulating layer 72, is reduced in thickness greatly. Although it depends on the selectivity used in the second stage of dry etching, if the second insulating layer 72 is as thin as, for example, approximately 30 nm to 50 nm, the seventh insulating layer 91 can be prevented from being excessively reduced in thickness.

Further, in the second stage of dry etching, if the first insulating layer 71 is thick, the seventh insulating layer 91 used as a hard mask is greatly reduced in thickness in the formation of through-holes in the first insulating layer 71. When only this thickness reduction is taken into consideration, it may seem best to increase the thickness of the seventh insulating layer 91 before the first and second stages of dry etching. However, the need then arises to increase the thickness of the second insulating layer 72. Specifically, before the first stage of dry etching, the seventh insulating layer 91 is not deposited completely uniformly in the in-plane direction. Moreover, the etching rate in the first stage of dry etching is not completely uniform in the in-plane direction. The nonuniform deposition and the nonuniform etching rate mean that the etching stopper function that the second insulating layer 72 is supposed to offer has variability in the in-plane direction. This variability tends to be large if the seventh insulating layer 91 is thick. Then, there arises the need to make the second insulating layer 72 have a somewhat large thickness to give a margin to the etching stopper function considering the variability. However, as described earlier, increasing the thickness of the second insulating layer 72 is disadvantageous in reducing the parasitic capacitance of the second insulating layer 72 to suppress a decrease in circuit speed and in reducing the contact resistance of the via plugs 88 formed in the surrounding region R2. For these reasons, in the present embodiment, the first insulating layer 71 before being dry etched is set to be thin to a certain degree. Specifically, before being dry etched, the first insulating layer 71 is thinner than the second insulating layer 72. As a result, in the imaging apparatus 100 in the present embodiment, the first insulating layer 71 is thinner than the second insulating layer 72.

A further description is given to supplement the description of the nonuniformity in the previous paragraph. In the dry etching performed to form the connection holes 88h in the seventh insulating layer 91 which has been subjected to CMP, the dry etching needs to be conducted a little longer than the exact time, i.e., over-etching needs to be conducted (the exact time is, in a case where the film thickness of the seventh insulating layer 91 after CMP is for example 460 nm, the time it takes to etch the 460 nm thick seventh insulating layer 91). The amount of dry etching conducted after the exact time is called the amount of over etching. For example, if the nonuniformity in the film thickness of the seventh insulating layer 91 and the nonuniformity in the dry etching rate in the first stage totals 30%, a necessary amount of over-etching is 30%. For example, if the film thickness of the seventh insulating layer 91 after CMP is 460 nm, the amount of dry etching for the seventh insulating layer 91 is approximately 600 nm, including the over-etching amount. If there is 30% of nonuniformity in the direction of reducing the film thickness of the seventh insulating layer 91, a necessary amount of dry etching of the seventh insulating layer 91 is approximately 320 nm at a portion that needs the least amount of dry etching. In other words, when over-etching of 30% relative to the exact time is carried out to prevent etching stop from occurring in the first stage of dry etching, the etching in a thin portion of the seventh insulating layer 91 reaches the second insulating layer 72 at an early point in the first stage of dry etching. Thereafter, by the time the 30% over-etching is completed, the second insulating layer 72 is excessively dry-etched by 280 nm calculated in terms of the film thickness of the seventh insulating layer 91. Then, in order to prepare for this excessive dry etching, the second insulating layer 72 needs a film thickness of approximately 16 nm, which is calculated taking etching selectivity into consideration.

Moreover, the film thickness of the second insulating layer 72 needs to be determined taking the heights of the circuit elements to which to connect the via plugs 88 into consideration. In FIG. 3, with the interface between the semiconductor substrate 60 and the fifth insulating layer 75 used as a reference surface, the region where the contact plugs Cp5, Cp6, Cp7 are formed on the gate electrodes 22e, 24e, 26e in the imaging region R1 is the highest location relative to the reference surface, among the circuit elements to which to connect the via plugs 88. If the fifth insulating layer 75 is 10 nm thick, the gate electrodes 22e, 24e, 26e are 140 nm thick each, the fourth insulating layer 74 is 10 nm thick, the third insulating layer 73 is 30 nm thick, the contact plugs Cp5, Cp6, Cp7 are 100 nm thick each, and the first insulating layer 71 is 10 nm thick, the height of a location which is the highest from the reference surface is approximately 300 nm. By contrast, as shown in FIG. 5, the lowest location relative to the reference surface among the circuit elements to which to connect the via plugs 88 is the region of the silicide layer 85 formed on the source or drain of the silicide transistor in the silicide transistor region R2a. This height is 0 nm from the reference surface. Thus, there is a difference of approximately 300 nm in the heights of the circuit elements to which to connect the via plugs 88. Thus, the thickness of the second insulating layer 72 has to be adjusted considering the height difference among the circuit elements as well. On the contact plugs Cp5, Cp6, Cp7 in the imaging region R1, at an early point in the first stage of dry etching, the etching has reached the second insulating layer 72 formed on the first insulating layer 71. Meanwhile, on the silicide layer 85 in the silicide transistor region R2a, the etching has not reached the second insulating layer 72 at that point. In the region of the silicide layer 85, the seventh insulating layer 91 needs to be further dry etched by approximately 300 nm from the point when the etching has reached the second insulating layer 72 in the imaging region R1. In this event, to prevent the etching from penetrating the first insulating layer 71 and extending into the contact plugs Cp5, Cp6, Cp7 in the imaging region R1, the second insulating layer 72 needs to have the most suitable film thickness. Specifically, the second insulating layer 72 needs to have a film thickness of approximately 18 nm in order to absorb the height difference among the circuit elements. Conclusively, in view of the nonuniformity of the film thickness of the seventh insulating layer 91, the nonuniformity of the dry etching rate in the first stage, and the height difference among the circuit elements, the second insulating layer 72 needs a film thickness of approximately 34 nm.

In other words, the film thickness of the second insulating layer 72 is determined considering the above-described nonuniformity due to the etching selectivity between the seventh insulating layer 91 and the second insulating layer 72 in the first stage of dry etching, the height difference among the circuit elements, an increase in the contact resistance between the gate electrodes due to a reduction in the chip size of the surrounding region R2, and a reduction in the parasitic capacitance. Judging from these constraints, it is important to set the film thickness of the second insulating layer 72 to an appropriate thickness of approximately 30 nm to 50 nm.

The third insulating layer 73 is formed by sub-atmospheric pressure CVD (SACVD). By SACVD, the material of the third insulating layer 73 is deposited in a temperature range of 350° C. to 450° C.

The third insulating layer 73 has a first surface, a second surface, and hole inner surfaces. As a whole, the first surface is located at a higher level than the second surface. The first surface of the third insulating layer 73 is in contact with the first insulating layer 71 and the lower surfaces of portions of the contact plugs Cp1 to Cp7 protruding sideways. The second surface of the third insulating layer 73 is in contact with the fourth insulating layer 74 and the sixth insulating layer 76. The hole inner surfaces of the third insulating layer 73 are in contact with the side surfaces of the contact plugs Cp1 to Cp7.

Figure 9:
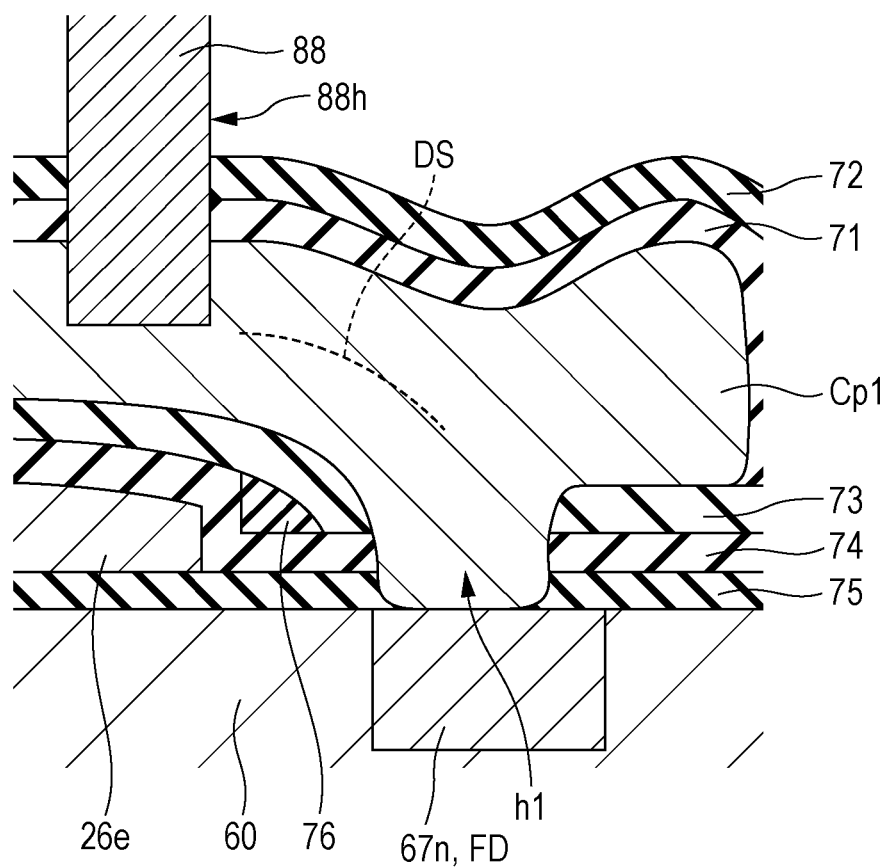
FIG. 9 is an enlarged sectional view showing a structure around a contact plug.

For example, a positive voltage of approximately 10 V may be applied to the storage control line 31 when the imaging apparatus 100 is in operation. In this situation where a voltage of this degree is applied to the storage control line 31 with the storage control line 31 and the contact plug Cp1 being connected to each other via the photoelectric conversion structure 12A and the like, a high voltage may be applied to the contact plug Cp1 as well. This contact plug Cp1 may be routed as a local wire onto the gate electrode 26e of the reset transistor 26. A local wire is a locally extending wire used for connection between elements. Such routing may be useful depending on the size of the transistor in the signal detecting circuit 14A in the imaging region R1, the wiring layout of the metal wiring 87, the design rule of the metal wiring 87, and the like. FIG. 9 shows an example of such routing.

In the example in FIG. 9, the fourth insulating layer 74 and the third insulating layer 73 are present between the gate electrode 26e and a portion of the contact plug Cp1 that is routed onto the gate electrode 26e. Thus, dielectric strength can be secured between the contact plug Cp1 and the gate electrode 26e by adjustment of the thicknesses of the fourth insulating layer 74 and the third insulating layer 73. Thus, the gate electrode 26e does not receive the high voltage applied to the contact plug Cp1 connected via the storage control line 31, enabling normal circuit operation. In the present embodiment, for example, the third insulating layer 73 has a thickness of 30 nm or greater, and the fourth insulating layer 74 has a thickness of 5 nm to 15 nm.

The connection holes 88h and the contact holes h1 to h4 do not have to overlap each other in a plan view. In other words, the connection holes 88h and the contact holes h1 to h4 may be spaced away from each other in a plan view. This point is described below.

For example, in order to help prevent fabrication defects and an attendant decrease in yields, constraints may be imposed, such as having to extend a plurality of wires of the metal wiring 87 in parallel to each other in the imaging region R1, avoiding extending the metal wiring 87 in a direction other than a predetermined direction or bending the metal wiring 87. In addition, for example, the layout of the metal wiring 87 may be subjected to constraints of design rules. Examples of the constraints of design rules include the minimum wire width of metal wiring and the minimum space between wires of metal wiring. Here is a specific example. In 65-nm design rule, the minimum wire width of metal wiring is 100 nm, and the minimum space between wires of metal wiring is 140 nm. Moreover, for example, the layout of the metal wiring 87 may be subjected to constraints regarding the size and number of transistors in the signal detecting circuit 14A. The smaller the size of the pixel 10A, the higher the difficulty of laying out the metal wiring 87 while meeting these constraints.

Assume that a rule is set which states that the connection holes 88h and the contact holes h1 to h4 are to overlap each other in a plan view (such a rule may be called a stack rule). The stack rule is an additional constraint for the layout of the metal wiring 87, and may increase the difficulty of laying out the metal wiring 87. It is not necessarily easy to achieve a layout of the metal wiring 87 that meets the stack rule as well as the other constraints. In the imaging apparatus 100 according to one example, a predetermined number of lines of metal wiring 87 are routed from the vertical scanning circuit 42. However, it is not necessarily easy to place these lines of metal wiring 87 at proper positions in the imaging apparatus 100 while meeting these constraints.

Employing a fine design rule may seem a possibility to achieve the layout of the metal wiring 87 while meeting the imposed constraints. However, the need then arises to introduce, for each step, an expensive manufacturing apparatus that supports the fine design rule. This means an increase in the costs for manufacturing the imaging apparatus 100. For this reason, employing a fine design rule is inadvisable from a cost perspective.

In this regard, by using the contact plugs Cp1 to Cp7 as local wires, the imaging apparatus 100 according to one example achieves a configuration in which the connection holes 88h and the contact holes h1 to h4 do not overlap in a plan view. To put it differently, a configuration that does not have to meet the stack rule is achieved by using the contact plugs Cp1 to Cp7 as local wires. In this way, in this example, the use of the contact plugs Cp1 to Cp7 as local wires enhances flexibility to the layout of the connection holes 88h and the metal wiring 87, making it easy to lay out the metal wiring 87 while meeting the imposed constraints. Moreover, this way may be advantageous in achieving a layout that meets the imposed constraints, at low costs.

The above-described example in FIG. 9 is also an example where the connection hole 88h and the contact hole h1 do not overlap in a plan view. It is understood from FIG. 9 that a conductive path extending between the connection hole 88h and the contact hole h1 is formed in the contact plug Cp1 acting as a local wire. FIG. 9 schematically shows this conductive path with a dotted line DS.

With reference to FIGS. 10 to 14, a process of forming a part of the imaging apparatus 100 that belongs in the imaging region R1 according to one specific example is described in detail below step by step. Specifically, FIGS. 10 to 14 show a process from before the contact plugs Cp1 to Cp7 are formed to after the via plugs 88 are formed. Note that some of the following descriptions may overlap the descriptions already given.

Figure 10:
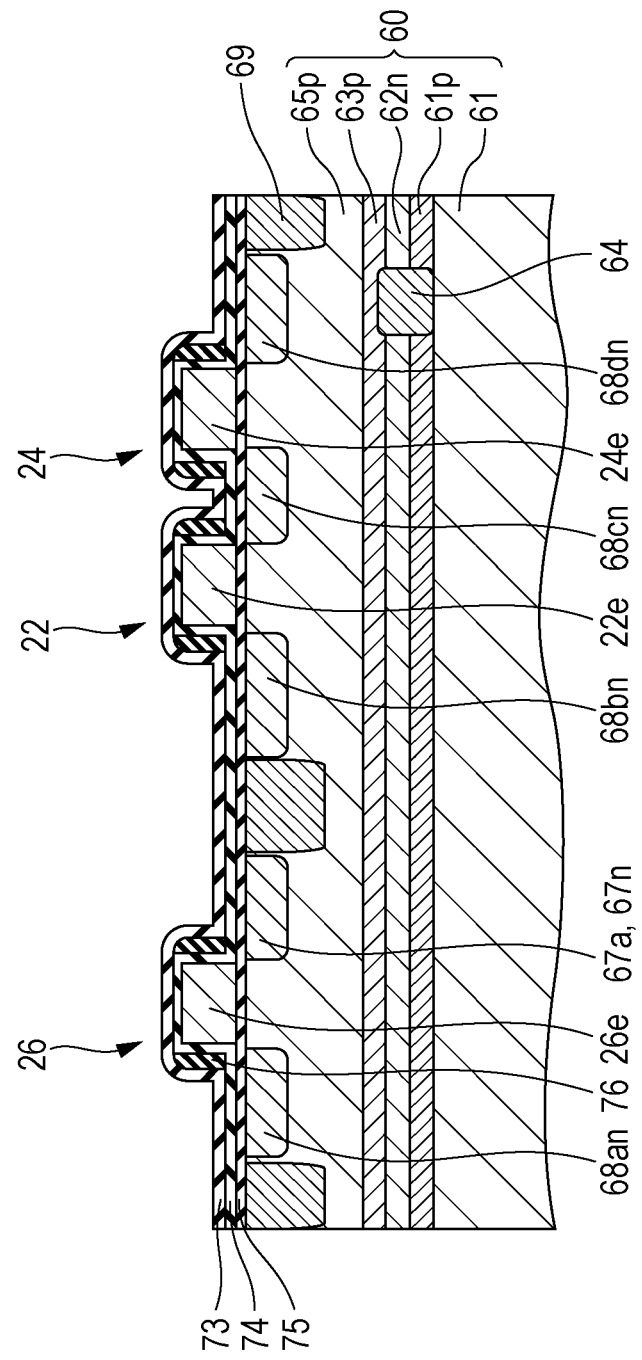
FIG. 10 is an explanatory diagram illustrating steps for manufacturing the imaging apparatus according to the embodiment.

FIG. 10 is a sectional view showing the imaging region R1 where the third insulating layer 73 has just been formed. The third insulating layer 73 is a silicon dioxide layer. In this specific example, the third insulating layer 73 is formed by SACVD using tetraethoxysilane (TEOS, $Si(OC_2H_5)_4$) and ozone as a source gas.

SACVD can be used in a low-temperature treatment and offers good coverage. Before the step of forming the third insulating layer 73, all the impurity formation by implantation into the semiconductor substrate 60 in the imaging region R1 and the surrounding region R2 have already been finished. Forming a film in a low-temperature treatment can suppress impurity diffusion. Further, due to reduction in the areas of elements in recent years, the space between transistor elements has been reduced to yield more chips per wafer. For this reason, there is a very narrow space between the gate electrodes of the transistors in the surrounding region R2. By use of SACVD that provides good step coverage, film formation can be performed without generating a void (a gap) between the gate electrodes.

Figure 11:
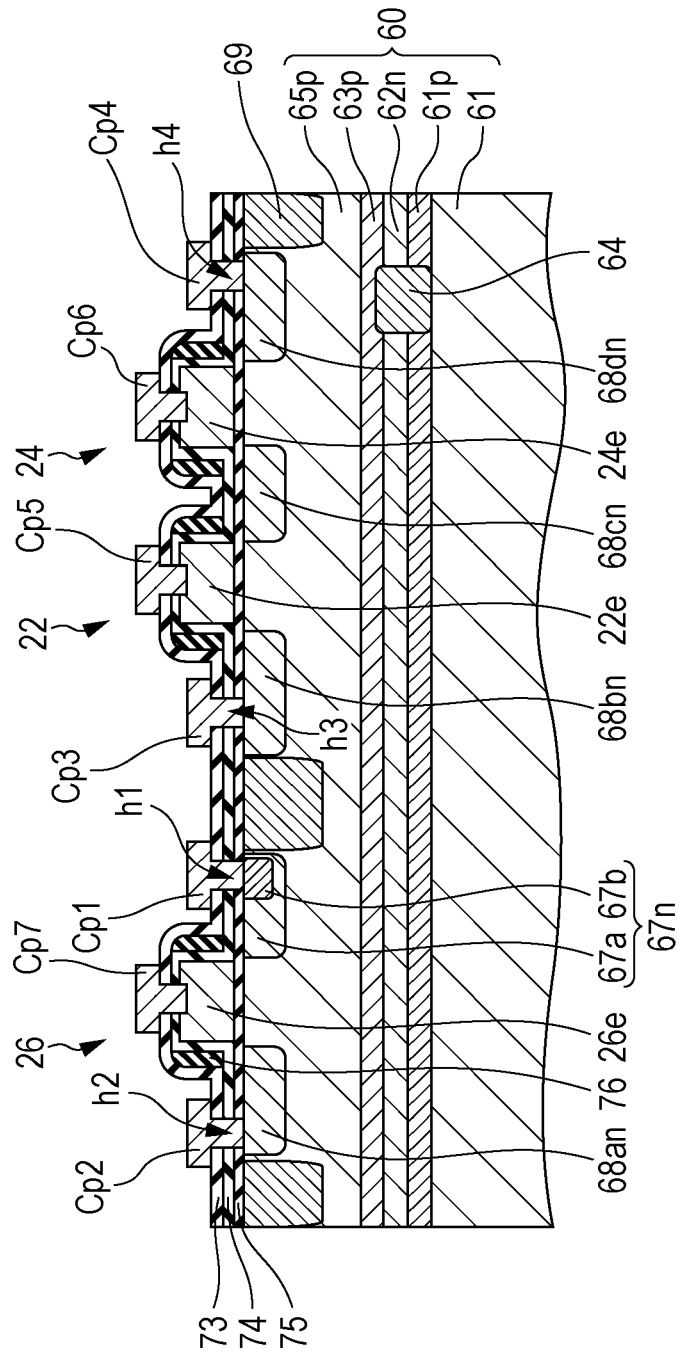
FIG. 11 is an explanatory diagram illustrating steps for manufacturing the imaging apparatus according to the embodiment.

FIG. 11 is a sectional view showing the imaging region R1 where the contact plugs Cp1 to Cp7 have been formed. After the formation of the third insulating layer 73, the product in process in FIG. 11 is obtained as follows.

The third insulating layer 73, the fourth insulating layer 74, and the fifth insulating layer 75 are processed by photolithography and dry etching at portions above the source portions and drain portions of the transistors in the signal detecting circuit 14A. The third insulating layer 73 and the fourth insulating layer 74 are processed by photolithography and dry etching at portions above the gate electrode portions of the transistors in the signal detecting circuit 14A.

In the formation of a resist pattern in photolithography, a patterning of 80 nm to 100 nm is performed. Conditions of the dry etching are not limited to any particular conditions. In this specific example, reactive dry etching is performed using the resist pattern as a mask. A dry etching gas is not limited to any particular one. Examples of the dry etching gas include $CF_4/CHF_3/Ar$, $CF_4/CHF_3/O_2$, and $CF_4/CHF_3/Ar/O_2$. The dry etching can be performed using a single-wafer dry etching apparatus. Examples of etching conditions used with a single-wafer dry etching apparatus are as follows: the pressure, 20 mTorr to 100 mTorr the RF power, 300 W to 900 W; and the gas type and flow rate, $CF_4/CHF_3/Ar$ and 20 standard CC per minute (SCCM) to 60 SCCM, 30 SCCM to 100 SCCM, 20 SCCM to 80 SCCM, respectively.

In this specific example, a plurality of through-holes each with a diameter of 80 nm to 100 nm are formed by photolithography and dry etching. Some of these through-holes correspond to the contact holes h1 to h4.

After the formation of the through-holes, a step of growing phosphorus-doped polysilicon is performed to form the contact plugs Cp1 to Cp7. In this specific example, the growing of phosphorus-doped polysilicon is low-temperature film formation. This low-temperature film formation is performed using a low-pressure CVD apparatus of a vertical diffusion furnace. This low-temperature film formation uses a reactive gas which is based on monosilane ($SiH_4$)+phosphine ($PH_3$). The low-temperature film formation is performed at approximately 550° C. to 580° C. under a reduced pressure of 0.4 Torr to 1.5 Torr. A 100 nm film is deposited by this low-temperature film formation. To be more specific, 100 nm is the width between the upper surface of this deposited film and the upper surface of the third insulating layer 73.

Next, the above deposited film is partially removed, thereby being formed into the contact plugs Cp1 to Cp7. The product in process shown in FIG. 11 is thus obtained.

Figure 12:
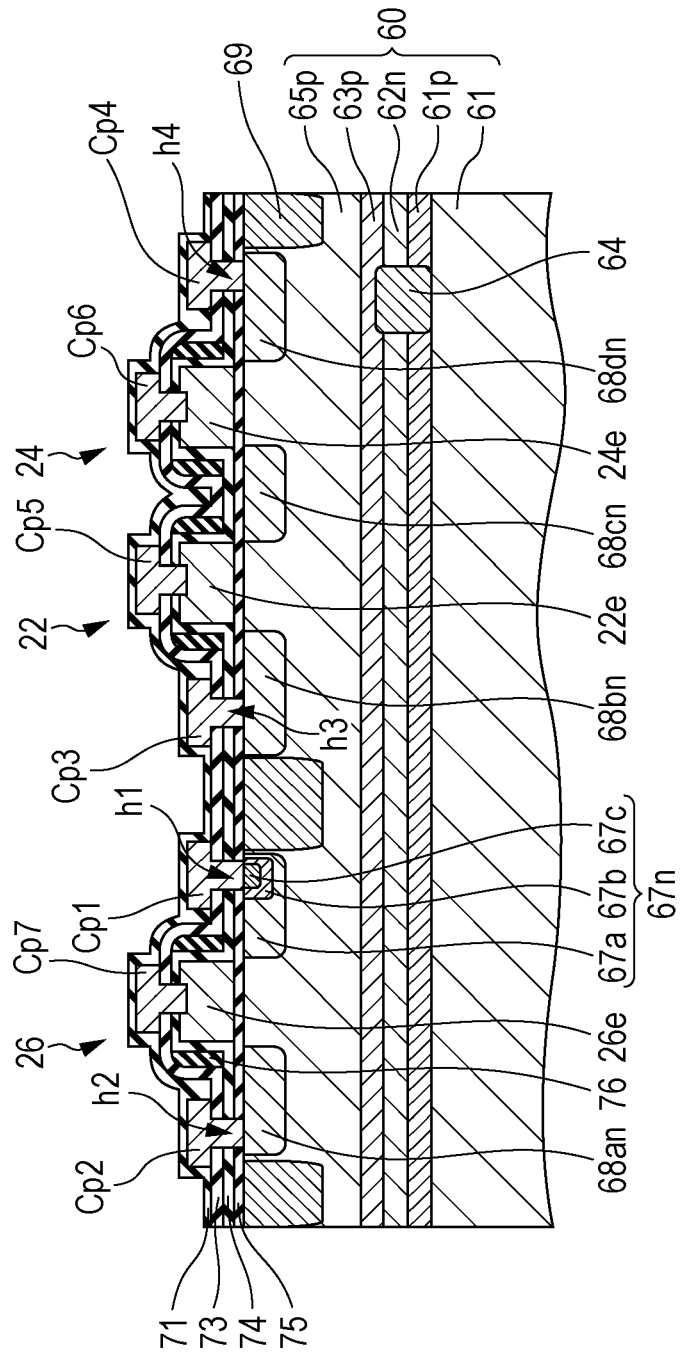
FIG. 12 is an explanatory diagram illustrating steps for manufacturing the imaging apparatus according to the embodiment.

FIG. 12 is a sectional view showing the imaging region R1 where the first insulating layer 71 has been formed. In this specific example, the product in process shown in FIG. 12 is obtained as follows.

In this specific example, like the third insulating layer 73, the first insulating layer 71 is a silicon dioxide layer and is formed by SACVD using TEOS and ozone as a source gas.

Next, using a diffusion furnace, a heat treatment is carried out in a nitrogen atmosphere at a temperature of 800° C. or higher. The impurity contained in the contact plugs Cp1 to Cp7 is activated by this heat treatment. In this specific example, the impurity is phosphorus. By the actitation of the impurity, the resistances in the contact plugs Cp1 to Cp7 are decreased. The resistances are decreased because the impurity is incorporated into the crystals inside the grain boundaries of polysilicon by the heat treatment and becomes able to act as carriers more easily.

The contact plugs Cp1 to Cp7 are subjected to high temperature by the above heat treatment. Then, the impurity inside the contact plug Cp1 diffuses to the second region 67b of the n-type impurity region 67n. Thereby, the concentration of the impurity becomes higher in a part of the second region 67b. The region thus having a higher concentration of the impurity is the third region 67c, which is an n+-impurity region.

The above heat treatment also restores crystallographic defects caused by the damage during the ion implantation into the n-type impurity region 67n and dry etching.

Next, although not shown, photolithography and etching are performed. Specifically, the first insulating layer 71 and the third insulating layer 73 are etched in the silicide region of the surrounding region R2. Thereby, the semiconductor substrate 60 and the gate electrodes are exposed, making it possible to form silicide transistors in a silicide forming step to be described below.

Next, although not shown, a silicide forming step is carried out. Thereby, a silicide is formed in the silicide region. Examples of a silicide formed in the silicide region include a nickel (Ni) silicide, a titanium silicide, and a cobalt silicide. A nickel silicide is a silicide containing nickel. The same applies to the other silicides.

In this specific example, a nickel silicide layer is formed in the silicide region. A nickel silicide layer can be used as a silicide layer in a silicide transistor. Specifically, a nickel silicide layer can be used as a silicide layer on the gate electrode, source, and drain of a silicide transistor. A silicide transistor having a silicide layer which is a nickel silicide layer can function even if the silicide layer is a very narrow line. This point is described below. In a gate electrode using a silicide layer, when the width is reduced to meet a higher level of integration, the fine line effect may occur, depending on the material of the silicide layer. The fine line effect leads to the following problems: increase in variability of resistance in the silicide layer and increase in the average resistance value. A heat treatment may be performed in two stages in the process of forming the silicide layer. In the first stage of heat treatment, a high-resistance silicide crystal structure is formed. In the second stage of heat treatment at a high temperature, a low-resistance silicide crystal structure is formed. However, the narrower the width of a gate electrode is, the harder it becomes for the high-resistance silicide crystal structure to undergo a phase transition to the low-resistance silicide crystal structure, thus resulting in a higher proportion of the high-resistance crystals. This higher proportion is believed to increase the average resistance value and the variability of resistance. In this regard, compared with a titanium silicide or a cobalt silicide, it is easier for a nickel silicide to be processed at a low temperature of 600° C. or lower in the second stage of heat treatment; therefore, a phase transition is easier even in a very fine line. Examples of a nickel silicide layer include a NiSi layer, NiPtSi layer, and a stack of these layers.

A NiSi layer can be formed as follows. First, a metal layer which is a Ni layer is formed on the surface of the semiconductor substrate 60 by sputtering. The thickness of the metal layer formed is, for example, approximately 5 nm to 20 nm. Next, the first heat treatment is performed at, for example, 250° C. to 350° C. using a lamp annealing apparatus. Thereby, a $Ni_2Si$ layer is formed. Thereafter, in a region having the $Ni_2Si$ layer and the unreacted metal layer, the unreacted metal layer is selectively removed by a treatment with a chemical solution using a sulfuric acid hydrogen peroxide (/water) mixture (SPM) or the like. By this treatment, Ni on the first insulating layer 71 is removed as well. Next, using a lamp annealing apparatus, the second heat treatment is performed at, for example, 350° C. to 400° C. Thereby, a NiSi layer is formed on the sources, drains, and gate electrodes of the transistors in the surrounding circuitry 40.

Figure 13:
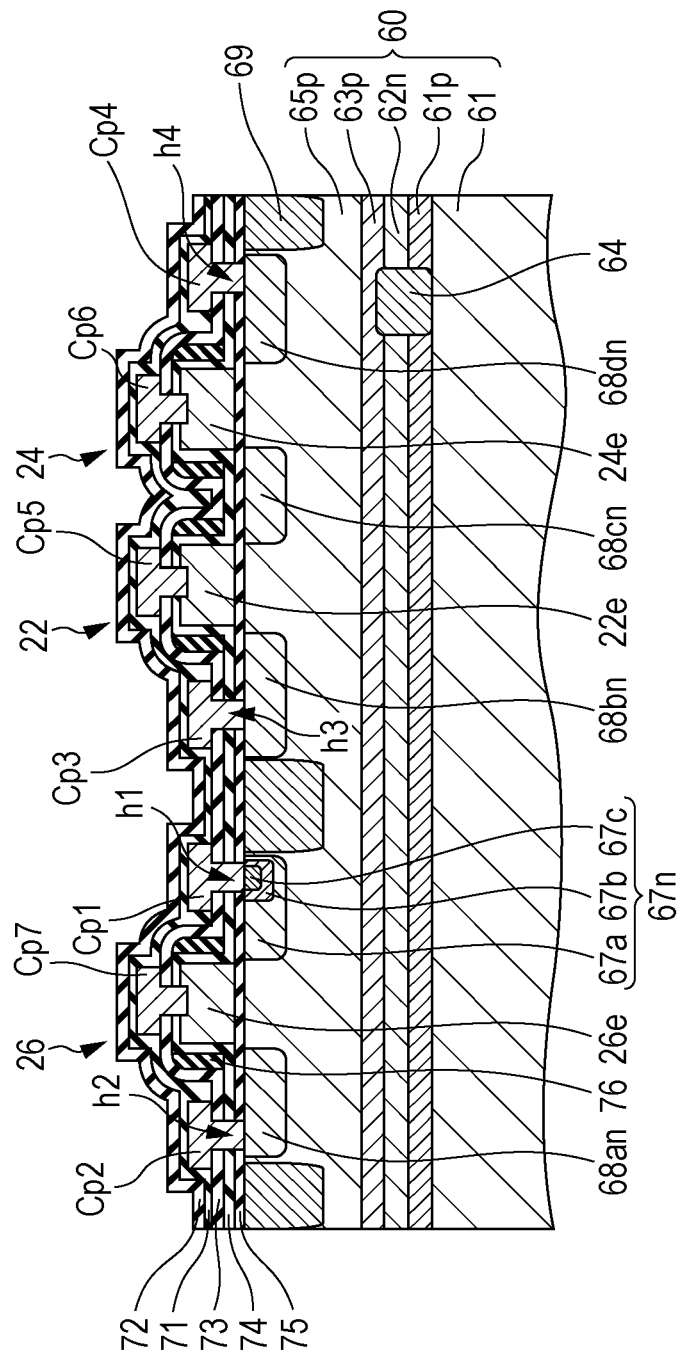
FIG. 13 is an explanatory diagram illustrating steps for manufacturing the imaging apparatus according to the embodiment.

FIG. 13 is a sectional view showing the imaging region R1 where the second insulating layer 72 has been formed. In this specific example, the product in process shown in FIG. 13 is obtained as follows.

In this specific example, the second insulating layer 72 is a silicon nitride layer (ALD-SiN layer), and is formed by atomic layer deposition (ALD). A silicon nitride layer of high quality can be formed at a low temperature of 300° C. to 500° C. by alternate supply of dichlorosilane (DCS, $SiH_2Cl_2$) and ammonia ($NH_3$). In this way, ALD forms a film by supplying two or more types of reactive gas alternately, one type at a time, and controls the film thickness by changing the number of cycles of supplying the reactive gases. For example, if the film formation rate is 0.1 nm per cycle, 20 cycles of processing are performed to form a 2 nm thick film. This way, the film thickness can be controlled to be uniform at the atomic layer level.

In this specific example, the second insulating layer 72 is deposited 30 nm to 50 nm, considering the relation between the remaining film of the seventh insulating layer 91 after CMP and etching selectivity.

Figure 14:
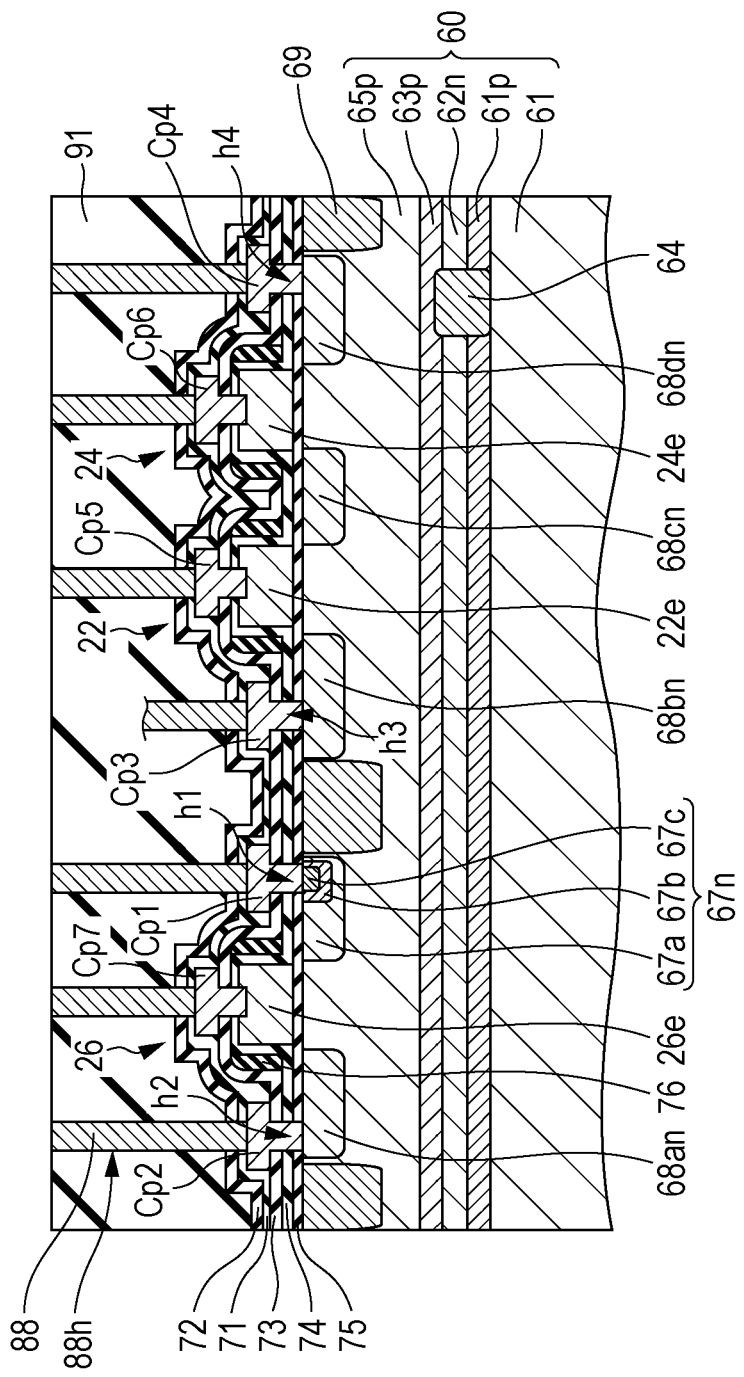
FIG. 14 is an explanatory diagram illustrating steps for manufacturing the imaging apparatus according to the embodiment.

FIG. 14 is a sectional view showing the imaging region R1 where the connection holes 88h and the via plugs 88 have been formed. In this specific example, the product in process shown in FIG. 14 is obtained as follows.

After the formation of the second insulating layer 72, the seventh insulating layer 91 is created. In this specific example, the seventh insulating layer 91 is a silicon dioxide layer, and is formed by chemical vapor deposition. More specifically, high-density plasma-enhanced chemical vapor deposition (HDP-CVD) is employed as the chemical vapor deposition. The thickness of the seventh insulating layer 91 formed is, for example, approximately 700 nm to 900 nm. For example, the conditions of the HDP-CVD are, although not limited to any particular ones, as follows: the flow rate of $SiH_4$ gas, 50 SCCM to 150 SCCM; the flow rate of $O_2$ gas, 200 SCCM to 300 SCCM; the pressure, 1 mTorr to 10 mTorr; the RF power, 3000 W to 5000 W; and the processing temperature, 300° C. to 500° C.

Plasma CVD at approximately 450° C. or the like can be employed in place of HDP-CVD to form, for example, an ozone-TEOS oxide film. However, HDP-CVD is superior in terms of insulating film embedding performance. This superiority is likely to be significant in recent years where the gap between gate electrodes is getting smaller.

Next, the upper surface of the seventh insulating layer 91 is polished by CMP. Thereby, the upper surface of the seventh insulating layer 91 is flattened. The amount of thickness of the seventh insulating layer 91 reduced by this polishing is, for example, approximately 300 nm to 400 nm.

Note that CMP reduces local steps in the upper surface of the seventh insulating layer 91, but may not completely flatten the upper surface of the seventh insulating layer 91, leaving a global step where the imaging region R1 as a whole is raised from the surrounding region R2. As described earlier, making the first insulating layer 71 thin is effective in reducing the global step.

Next, photolithography is performed. Specifically, a hole pattern is formed using a resist as a mask. The diameter of each hole in the hole pattern is, for example, 80 nm to 100 nm. Next, dry etching is performed. The dry etching includes the first stage and the second stage.

In the first stage of dry etching, through-holes are formed in the seventh insulating layer 91. These through-holes extend to the second insulating layer 72, but do not penetrate the second insulating layer 72 in the first stage of dry etching. In the second stage of dry etching, the second insulating layer 72 and the first insulating layer 71 are etched with the seventh insulating layer 91 used as a hard mask. Thereby, through-holes are formed in the second insulating layer 72 and the first insulating layer 71. The through-holes in the seventh insulating layer 91, the through-holes in the second insulating layer 72, and the through-holes in the first insulating layer 71 constitute the connection holes 88h together.

Conditions for the first stage of dry etching are not limited to any particular ones. In the first stage of dry etching, for example, a dual-frequency capacitively-coupled etching apparatus is used. For example, conditions for the first stage of dry etching in this specific example are as follows: the flow rate of $C_4F_6$, 10 SCCM to 50 SCCM; the flow rate of Ar, 1000 SCCM to 1500 SCCM; the flow rate of $O_2$, 5 SCCM to 30 SCCM; power applied to the upper electrode, 700 W to 1200 W; power applied to the lower electrode, 1500 W to 2000 W; and gas pressure, 10 mTorr to 50 mTorr.

Conditions for the second stage of dry etching are not limited to any particular ones. In the second stage of dry etching, for example, a parallel-plate capacitively-coupled dry etching apparatus is used. For example, conditions for the second stage of dry etching in this specific example are as follows: the flow rate of $CHF_3$, 20 SCCM to 70 SCCM; the flow rate of Ar, 1000 SCCM to 1500 SCCM; the flow rate of $O_2$, 5 SCCM to 30 SCCM; discharge power, 100 W to 300 W; and gas pressure, 10 mTorr to 50 mTorr.

Note that It is better that the selectivity between second insulating layer 72 and the contact plugs Cp1 to Cp7 is high, in order for the second insulating layer 72 to prevent the contact plugs Cp1 to Cp7 from being etched in the second stage of etching. However, setting the selectivity too high may cause a situation where the second insulating layer 72 is not properly etched in the second stage of etching. In view of these factors, the selectivity is, for example, approximately 1 to 2.

The connection holes 88h are thus formed by the photolithography, the first stage of dry etching, and the second stage of dry etching.

Next, a conductive metal is embedded in the connection holes 88h thus formed. This conductive metal forms the via plugs 88. The conductive metal is, for example, tungsten (W).

In this specific example, a barrier conductor film is formed in the connection holes 88h. As described above, the connection holes 88h include the through-holes formed in the seventh insulating layer 91, the through-holes formed in the second insulating layer 72, and the through-holes formed in the first insulating layer 71. The barrier conductor film may be, for example, a TiN film, a stack film of a Ti film and a TiN film, or the like. The barrier conductor film is formed by, for example, plasma CVD at approximately 450° C. After the formation of the barrier conductor film, a conductive metal is charged onto the barrier conductor film to embed the connection holes 88h.

Next, the unneeded conductor metal and barrier conductor film remaining on the surface of the seventh insulating layer 91 are removed. This removal is performed by, for example, CMP, back etching, or the like.

The via plugs 88 are thus formed.

The present disclosure is further described below using experiments A, B, and C.

[Experiment A: Distribution of Phosphorus]

Samples A1, A2, and A3 were fabricated as follows.

(Sample A3)

Figure 17:
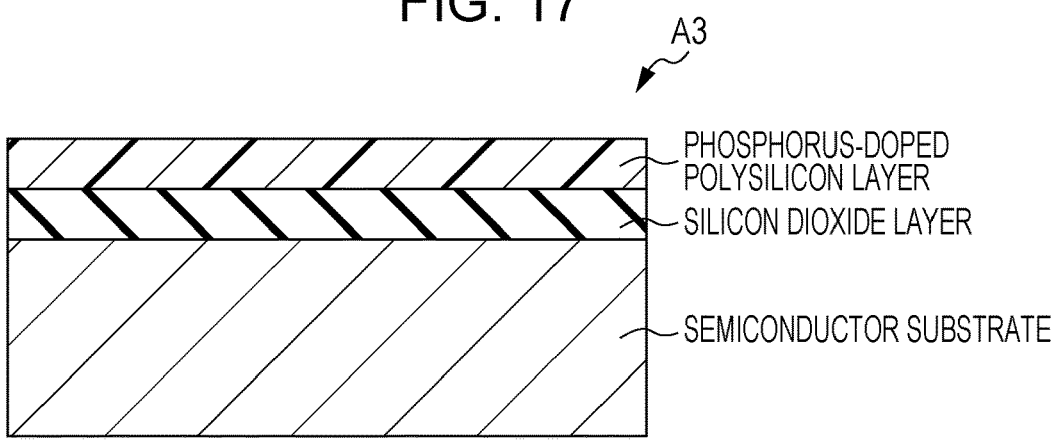
FIG. 17 is a sectional view schematically showing a sample fabricated for an experiment.

A silicon dioxide was deposited on a semiconductor substrate made of silicon, forming a flat silicon dioxide layer with a 25 nm thickness. Next, phosphorus-doped polysilicon was deposited on the silicon dioxide layer, forming a flat phosphorus-doped polysilicon layer with a 78 nm thickness. The phosphorus-doped polysilicon layer thus formed is a simple simulation of the contact plugs Cp1 to Cp7. Thus fabricated was a substrate in which the silicon dioxide layer and the phosphorus-doped polysilicon layer were stacked in this order on the entire surface of the semiconductor substrate. This substrate after film formation was set to be sample A3. FIG. 17 shows a schematic diagram of sample A3. Herein, the "substrate after film formation" indicates a substrate on which electronic components such as transistors have yet to be packaged, and more specifically, a substrate in which a single or plurality of layers are formed on the upper surface of a semiconductor substrate.

(Sample A1)

Figure 15:
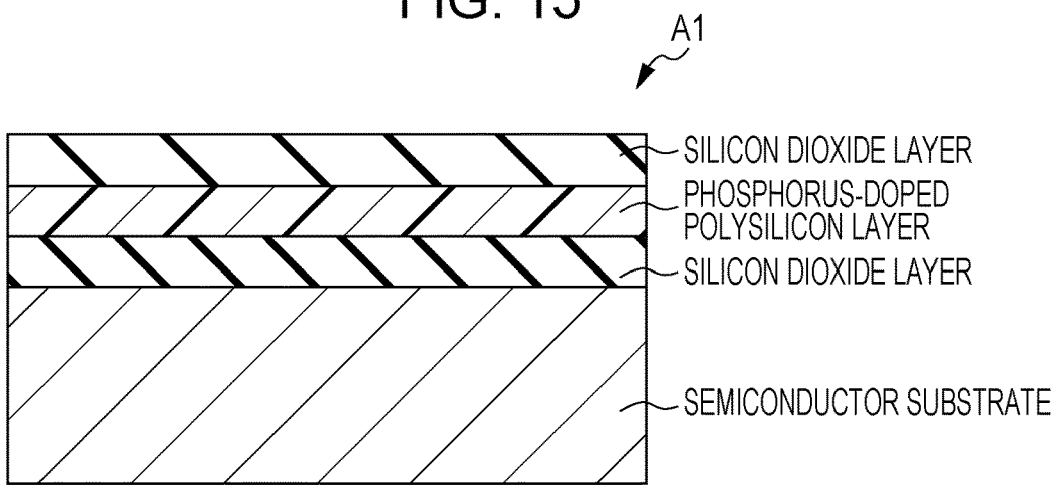
FIG. 15 is a sectional view schematically showing a sample fabricated for an experiment.

A substrate after film formation was fabricated in the same manner as sample A3. A flat silicon dioxide layer with a 25 nm thickness was formed on the phosphorus-doped polysilicon layer in the substrate after film formation. This silicon dioxide layer is a simulation of the first insulating layer 71. Thus formed was a stack in which the silicon dioxide layer, the phosphorus-doped polysilicon layer, and the silicon dioxide layer were stacked in this order on the entire surface of the semiconductor substrate. This stack was subjected to a heat treatment in a nitrogen atmosphere at 800° C. This heat treatment is a simulation of the covered annealing performed in the fabrication of the imaging apparatus 100. A substrate after the heat treatment was set to be sample A1. FIG. 15 shows a schematic diagram of sample A1.

(Sample A2)

Figure 16:
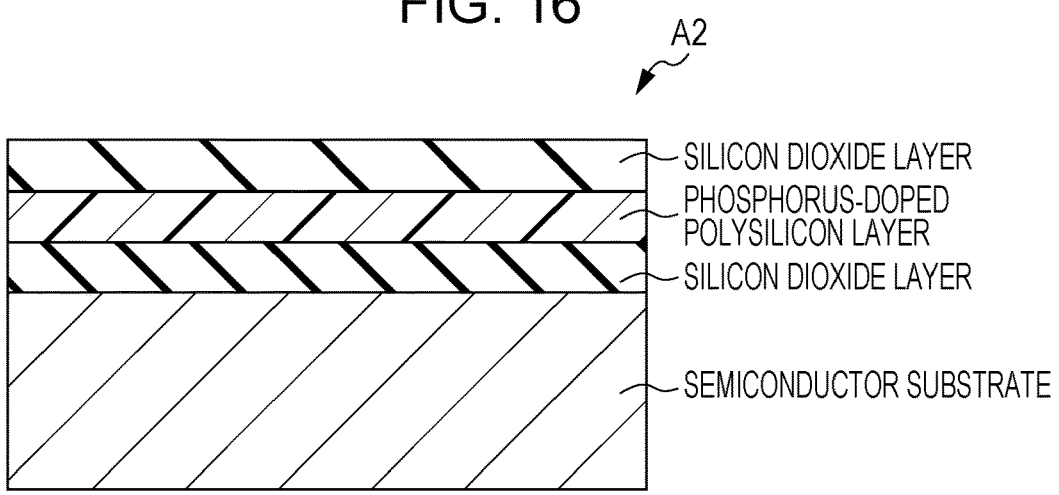
FIG. 16 is a sectional view schematically showing a sample fabricated for an experiment.

A substrate after film formation was fabricated in the same manner as sample A3. This substrate was subjected to a heat treatment in a nitrogen atmosphere at 800° C. Performed with the phosphorus-doped polysilicon layer exposed, this heat treatment can be referred to as exposed annealing. After the heat treatment, a flat silicon dioxide layer with a 25 nm thickness was formed. This silicon dioxide layer is a simulation of the first insulating layer 71. Thus fabricated was a substrate in which the silicon dioxide layer, the phosphorus-doped polysilicon layer, and the silicon dioxide layer were stacked in this order on the entire surface of the semiconductor substrate. This substrate after film formation was set to be sample A2. FIG. 16 shows a schematic diagram of sample A2.

Since the silicon dioxide layer, which is a simulation of the first insulating layer 71, was included not only in sample A1 but also in sample A2, the difference in the manufacturing method between sample A1 and sample A2 is whether the annealing was covered annealing or exposed annealing. If the experiment using sample A1 is regarded as the main experiment, the experiment using sample A2 can be regarded as a control experiment. Note that, as described earlier, the first insulating layer 71 enables not only covered annealing, but also fabrication of non-silicide contact plugs. It is believed that by including the silicon dioxide layer simulating the first insulating layer 71 in sample A2, data acquired from sample A2 can approximate to data which may be acquired from an imaging apparatus fabricated using exposed annealing instead of covered annealing.

(SIMS Measurement)

For each of samples A1, A2, and A3, the distribution of the concentration of phosphorus in terms of the depth direction of the semiconductor substrate was measured. This measurement was performed using secondary ion mass spectrometry (SIMS). Specific conditions for this measurement were as follows.

Figure 18:
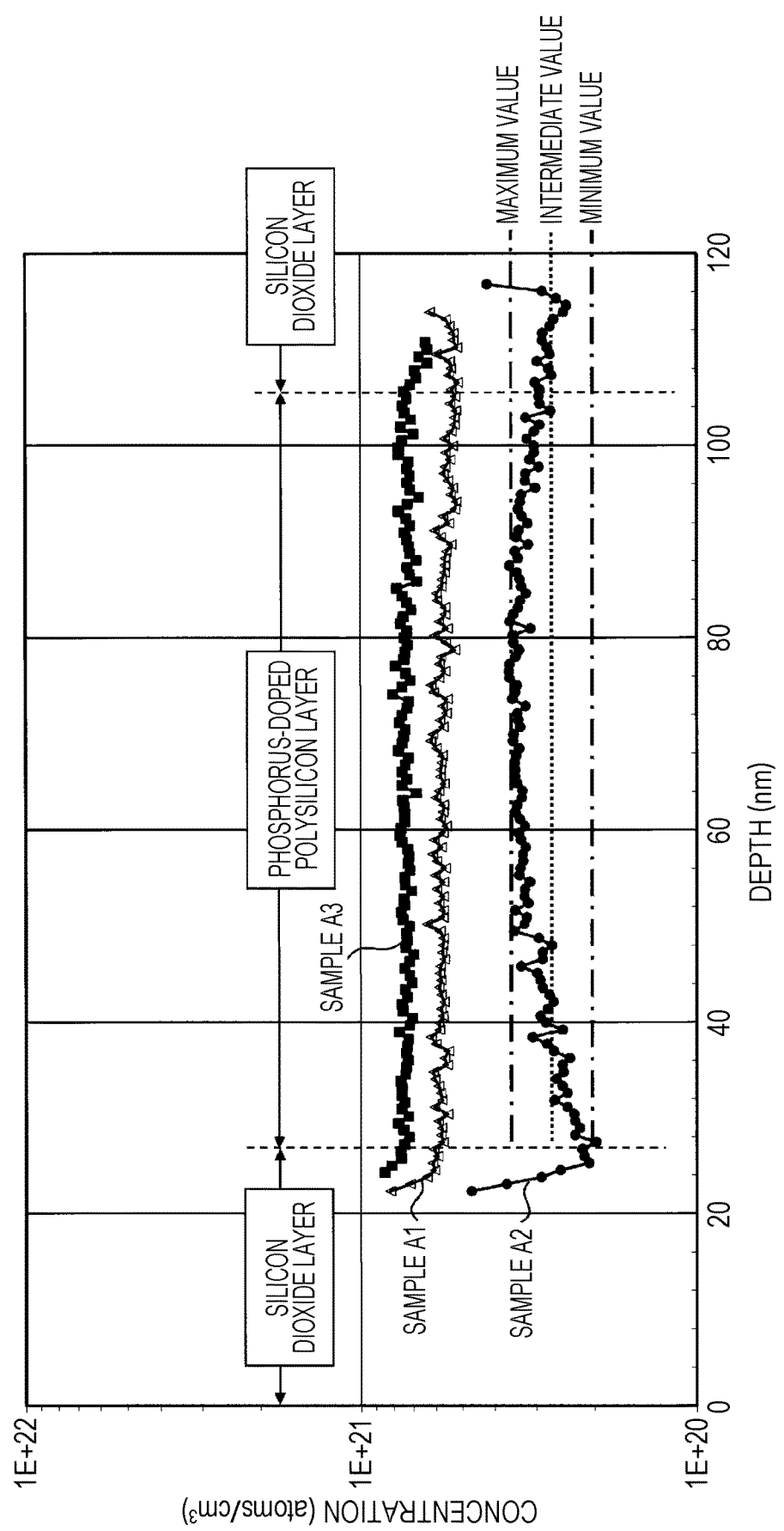
FIG. 18 is a graph showing an impurity concentration distribution of phosphorus in the contact plug in terms of a depth direction.

Measurement apparatus: secondary ion mass spectrometry having a quadrupole mass analyzer
Primary ion species: cesium (Cs$^+$)
Primary acceleration voltage: 5.0 kV
Primary ion current: 1 μA
Primary ion incidence angle (an angle from a direction perpendicular to the sample surface): 60°
Raster size: 200×200 μm$^2$
Detection area: 40×40 μm$^2$
Secondary ion polarity: negative
Use of electron gun for neutralization: used The graph in FIG. 18 shows measurement results. In FIG. 18, the horizontal axis indicates a position (unit: nm) in the depth direction of the semiconductor substrate. On the horizontal axis, the right side is the semiconductor substrate side, and the left side is the phosphorus-doped polysilicon layer side. The vertical axis indicates the concentration of phosphorus (unit: atoms/cm$^3$).

Note that the graph in FIG. 18 does not reflect data on the concentration near the interface between the phosphorus-doped polysilicon layer and the silicon dioxide layer, because the concentration of phosphorus impurity at an interface cannot be calculated accurately. The concentration of phosphorus impurity at an interface cannot be calculated accurately because the primary ion species segregates to the interface during SIMS measurement, increasing, at the interface, the probability of secondary ionization of an element constituting the sample, which is used as a reference in concentration conversion. To be more specific, cesium (Cs$^+$), which is the primary ion species, segregates to the interface. This segregation increases the probability of secondary ionization of an element constituting the sample, which is used as a reference, and makes it impossible for the secondary ionic strength of phosphorus to be accurately converted into concentration. Obtained as a result is a concentration profile having an abrupt concentration peak near the interface, which is different from actuality.

For an easy understanding of the structures of samples A1 and A2 and the relation in FIG. 18, FIG. 18 depicts terms "SILICON DIOXIDE LAYER", "PHOSPHORUS-DOPED POLYSILICON LAYER", and "SILICON DIOXIDE LAYER" side by side from the left to the right. Note, however, that sample A3 does not have a silicon dioxide layer simulating the first insulating layer 71 as described above.

The solid solubility concentration limit of phosphorus in polysilicon at 800° C. is 7E20 atoms/cm$^3$. On the assumption that deposition of phosphorus-doped polysilicon is followed by a heat treatment at 800° C., manufacturing conditions for samples A1 to A3 were set aiming that the concentration of phosphorus in the phosphorus-doped polysilicon immediately after the deposition approximates to the solid solubility concentration limit. That the concentration of phosphorus in the phosphorus-doped polysilicon immediately after the deposition approximates to the solid solubility concentration limit is advantageous in lowering the resistivities of the contact plugs Cp1 to Cp7.

In this regard, as is understood from the graph in FIG. 18, the concentration of phosphorus in the phosphorus-doped polysilicon layer in sample A3 is 7E20 atoms/cm$^3$ to 8E20 atoms/cm$^3$. It can be therefore said that phosphorus introduced to the polysilicon was as planned. In sample A3, the concentration of phosphorus in the phosphorus-doped layer is generally uniform in terms of the depth direction of the semiconductor substrate.

As described above, in the fabrication of sample A1, a heat treatment was carried out after the formation of the silicon dioxide layer simulating the first insulating layer 71. In other words, covered annealing was carried out. The concentration of phosphorus in the phosphorus-doped polysilicon layer in sample A1 is distributed in a range approximately from 5E20 atoms/cm$^3$ to 6E20 atoms/cm$^3$. This value is lower than the corresponding value in sample A3 by approximately 20%. In sample A1, the concentration of phosphorus in the phosphorus-doped polysilicon layer is generally uniform in terms of the depth direction of the semiconductor substrate.

As described earlier, in the fabrication of sample A2, a heat treatment was carried out with no silicon dioxide layer that simulates the first insulating layer 71 being formed. In other words, exposed annealing was carried out. As to the concentration of phosphorus in the phosphorus-doped polysilicon layer in sample A2, a relatively steep gradient is observed in the depth direction of the semiconductor substrate. In sample A2, the concentration of phosphorus at a surface of the phosphorus-doped polysilicon layer opposite from the semiconductor substrate is approximately 2E20 atoms/cm$^3$. This value is approximately one-quarter to one-third of the corresponding value in sample A3.

Now, the intermedium value, the variation range, and the percentage of the variation range are defined as below using the maximum and minimum values of the concentration of phosphorus in the phosphorus-doped polysilicon layer.

The graph in FIG. 18 shows the maximum value, the minimum value, and the intermediate value regarding sample A2. The percentage of the variation range can be used as an index of the uniformity of the concentration of the phosphorus in the phosphorus-doped polysilicon layer.

Intermediate value=(maximum value+minimum value)/2

Variation range=maximum value−minimum value

Percentage of variation range=variation range/intermediate value

In sample A1, the percentage of the variation range was 21.4%. In sample A2, the percentage of the variation range was 58.8%. In sample A3, the percentage of the variation range was 17.7%. Table 1 tabulates the maximum value, the minimum value, the intermediate value, the variation range, and the percentage of the variation range of each of samples A1, A2, and A3.

TABLE 1

| Sample | Maximum value (atoms/cm$^3$) | Minimum value (atoms/cm$^3$) | Intermediate value (atoms/cm$^3$) | Variation range (atoms/cm$^3$) | Percentage of variation range (%) |
|---|---|---|---|---|---|
| A1 | 6.37E+20 | 5.14E+20 | 5.76E+20 | 1.23E+20 | 21.4 |
| A2 | 3.63E+20 | 1.98E+20 | 2.81E+20 | 1.65E+20 | 58.8 |
| A3 | 8.05E+20 | 6.74E+20 | 7.40E+20 | 1.31E+20 | 17.7 |

Sample A1 has a lower percentage of the variation range than sample A2. This means that sample A1 has a more uniform concentration of phosphorus in the phosphorus-doped polysilicon layer than sample A2. In addition, sample A1 has a higher concentration of phosphorus over the entire phosphorus-doped polysilicon layer in its depth direction than sample A2. The high and uniform concentration of phosphorus in sample A1 is believed to be obtained because the diffusion of phosphorus from the inside to the outside of the phosphorus-doped polysilicon layer was suppressed by the covered annealing.

Sample A3 has a lower percentage of the variation range than sample A1. In addition, sample A3 has a higher concentration of phosphorus over the entire phosphorus-doped polysilicon layer in its depth direction than sample A1. However, the sample A3 was not subjected to a heat treatment, and thus phosphorus in the phosphorus-doped polysilicon layer was not activated. For this reason, sample A3 presumably has a high resistance in the phosphorus-doped polysilicon layer. Thus, it is presumed that an imaging apparatus is more likely to have higher performance when the imaging apparatus has contact plugs subjected to a heat treatment like in sample A1 than when the imaging apparatus has contact plugs not subjected to a heat treatment like in sample A3.

[Experiment B: Contact Resistance]

A first test element group (TEG) simulating part of the imaging apparatus 100 shown in FIG. 3 was fabricated. The first TEG includes a first resistance element measurement pattern. The first resistance element measurement pattern includes a measurement structure B1. The measurement structure B1 imitates part of the structure shown in FIG. 3. The measurement structure B1 has a plurality of combinations of the contact plug Cp5 and the via plug 88 which is a tungsten plug being connected to the contact plug Cp5 and 80 nm in diameter. The via plug 88 in each combination is connected to the metal wiring 87 made of copper. Like the phosphorus-doped polysilicon layer of sample A1 of experiment A, the contact plug Cp5 in the measurement structure B1 contained phosphorus whose concentration before a heat treatment generally matched the solid solubility concentration limit of phosphorus in polysilicon at 800° C., and was subjected to covered annealing. In the first resistance element measurement pattern, a bonding bad is connected to the metal wiring 87 of the measurement structure B1. As is understood from the above description, the first resistance element measurement pattern is a pattern with which the resistances of the metal wiring 87, the via plug 88, and the contact plug Cp5 can be measured. These resistances can be substantially seen as the contact resistance between the via plugs 88 and the contact plug Cp5. Thus, it can be said that the first resistance element measurement pattern is substantially a pattern with which the contact resistance between the via plug 88 and the contact plug Cp5 can be measured.

A second TEG was also fabricated. The second TEG includes a second resistance element measurement pattern. The second resistance element measurement pattern includes a measurement structure B2. The second resistance element measurement pattern differs from the first resistance element measurement pattern in that the contact plugs Cp5 in the second resistance element measurement pattern were subjected not to covered annealing, but to exposed annealing. Specifically, in the second resistance element measurement pattern, the contact plugs Cp5 were annealed with the phosphorus-doped polysilicon layer exposed, like sample A2 of experiment A.

Using four-terminal sensing, the contact resistance between one contact plug and one via plug 88 in the measurement structure B1 was measured by application of voltage to the bonding pad. Specifically, the measurement structure 81 has 68 regions in each of which a plurality of through-holes are formed, and in each of those through-holes, the contact plug Cp5 and the via plug 88 are connected together. Each of these 68 regions has a detection point at which a general value reflecting the contact resistances between the contact plugs Cp5 and the via plugs 88 in the respective through-holes in that region can be detected. Data was acquired with a measurement probe in contact with the detection point, and based on the data acquired, the contact resistance between the contact plug and the via plug per one through-hole (unit: $\Omega$/piece) in that region was calculated. Similar data acquisition and calculation was conducted with the measurement probe in contact with a detection point in another one of the 68 regions. Thus, 68-point measurement was carried out, measuring the contact resistance per through-hole (unit: $\Omega$/piece) in every one of the 68 regions and acquiring 68 pieces of data.

A detailed description is given of the 68-point measurement. An exposure apparatus used in the lithography process for a semiconductor device has an exposable range. The dimension of this exposable range is sometimes referred to as a field size. In the imaging apparatus 100 according to one specific example, the semiconductor substrate 60 is 300 mm in diameter and has 68 regions each with a field size of 25×32 mm. Several to several tens of chips are mounted on each field size region. The first resistance element measurement pattern simulates one of those chips, and is of the order of several tens to several hundreds of micrometers in a plan view. The measurement structure B1 is provided with a silicon wafer simulating the semiconductor substrate 60, and this silicon wafer has the 68 field size regions in the wafer plane like in the specific example described above. The 68-point measurement regarding the first resistance element measurement pattern indicates measuring, in each field size region, the contact resistance (unit: $\Omega$/piece) between the contact plug and the via plug in the first resistance element measurement pattern. The same applies to the 68-point measurement regarding the second resistance element measurement pattern to be described later.

Using four-terminal sensing, the contact resistance between one contact plug and one via plug 88 in the measurement structure B2 was measured by application of voltage to the bonding pad. Specifically, the measurement structure B2 has 68 regions in each of which a plurality of through-holes are formed, and in each of those through-holes, the contact plug Cp5 and the via plug 88 are connected together. Each of these 68 regions has a detection point at which a general value reflecting the contact resistances between the contact plugs Cp5 and the via plugs 88 in the respective through-holes in that region can be detected. Data was acquired with a measurement probe in contact with the detection point, and based on the data acquired, the contact resistance between the contact plug and the via plug per one through-hole (unit: $\Omega$/piece) in that region was calculated. Similar data acquisition and calculation was conducted with the measurement probe in contact with a detection point in another one of the 68 regions. Thus, 68-point measurement was carried out, measuring the contact resistance per through-hole (unit: $\Omega$/piece) in every one of the 68 regions and acquiring 68 pieces of data.

Figure 19:
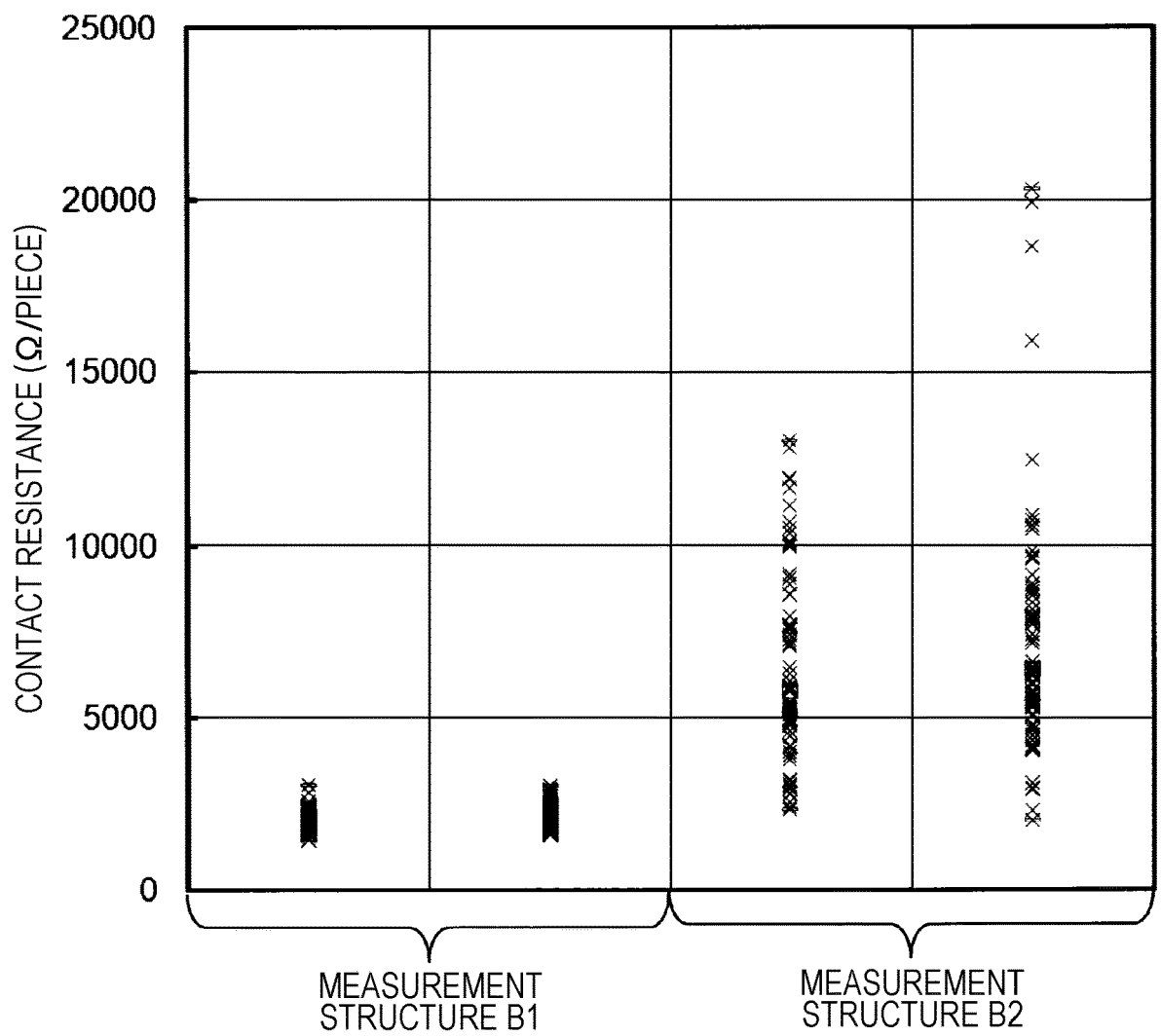
FIG. 19 is a graph showing contact resistance between a via plug and a contact plug.

FIG. 19 shows the contact resistances (unit: $\Omega$/piece) in the measurement structures B1 and the contact resistances in the measurement structures B2 obtained by measurement. In experiment B, to check the reproducibility, two first TEGs were fabricated under the same manufacturing conditions. Also, two second TEGs were fabricated under the same manufacturing conditions. The contact resistances in the measurement structure B1 in each of the two first TEG were measured. The contact resistances in the measurement structure B2 in each of the two second TEG were measured. This is why FIG. 19 shows two groups of plots for the contact resistances in the measurement structures B1 and two groups of plots for the contact resistances in the measurement structures B2.

The average value of the contact resistances (unit: Ω/piece) obtained for the measurement structure 1 in one of the first TEGs was 1995 Ω/piece. The average value of the contact resistances obtained for the measurement structure B1 in the other one of the first TEGs was 2147 Ω/piece. The maximum value of the contact resistances obtained for the measurement structure B1 in one of the first TEGs was 3080 Ω/piece. The maximum value of the contact resistances obtained for the measurement structure B1 in the other one of the first TEGs was 3036 Ω/piece.

The average value of the contact resistances (unit: Ω/piece) obtained for the measurement structure B2 in one of the second TEGs was 6470 Ω/piece. The average value of the contact resistances obtained for the measurement structure B2 in the other one of the second TEGs was 7312 piece. The maximum value of the contact resistances obtained for the measurement structures B2 in one of the second TEGs was 13,045 Ω/piece. The maximum value of the contact resistances obtained for the measurement structure B2 in the other one of the second TEGs was 20,302 Ω/piece.

The average value of the contact resistances in the measurement structure B1 is approximately one-third of that in the measurement structure B2. The variability in the contact resistance in the measurement structure B1 is markedly smaller than that in the measurement structure B2. As is understood from the above description, sample A1 corresponds to the measurement structure 81, and sample A2 corresponds to the measurement structure B2. In view of this, it can be said that the high uniformity in the impurity concentration in the contact plugs Cp1 to Cp7 in the depth direction is advantageous in reducing the magnitude and variability of the contact resistances between the contact plugs Cp1 to Cp7 and the via plugs 88.

The measurement structure B2 also has a location where the constant resistance is several tens of thousands of ohms per piece. By contrast, the measurement structure B1 has a smaller contact resistance than the measurement structure B2. A small contact resistance may lead to a high dynamic range. A small contact resistance may also enable the imaging apparatus 100 to operate at high speed. Specifically, if the configuration shown in FIG. 2 is employed, signal charges are temporarily stored in the charge accumulation portion FD, are then amplified by the signal detection transistor 22, and are then transmitted to the vertical signal line 35 via the address transistor 24. A small contact resistance may reduce a voltage drop in this signal path. This is advantageous in increasing the output range of signals outputted to the vertical signal line 35 and increasing the dynamic range of the imaging apparatus 100. In addition, a small contact resistance is advantageous in reducing the time constant, reducing output waveform rounding, reducing the delay in the signal detecting circuit 14A, and enabling the imaging apparatus 100 to operate at high speed. For the reasons above, a small contact resistance may contribute to obtaining a high-quality image.

Judging from the above and the results of electrical characteristics, high uniformity in the impurity concentration in the contact plugs Cp1 to Cp7 in their depth direction may contribute to obtaining a high-quality image. Thus, when the percentage of the variation range described regarding experiment A is, for example, 30% or lower, it may contribute to obtaining a high-quality image.

(Experiment C: Distance Between the Impurity region 69 and the Contact plug Cp1)

Figure 20:
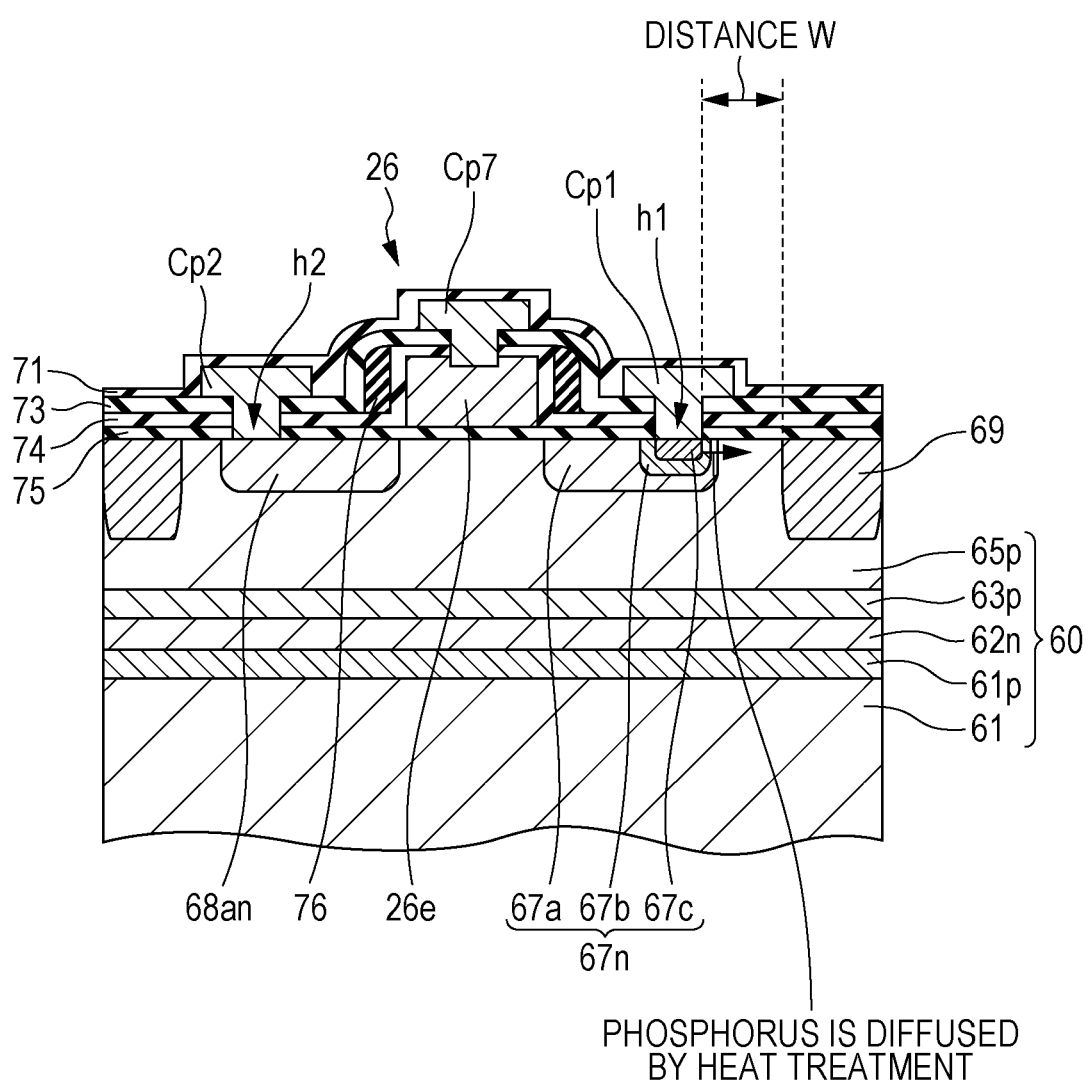
FIG. 20 is an enlarged sectional view of an area around a reset transistor in the imaging apparatus according to the embodiment.

FIG. 20 is a sectional view enlarging an area around the reset transistor 26 in FIG. 3. FIG. 20 shows the charge accumulation portion FD, the impurity region 69, and the like. In the example in FIG. 20, the charge accumulation portion FD is the n-type impurity region 67n. The impurity region 69 is specifically an element isolation region, and is an implantation isolation region in the example in FIG. 3.

In the present embodiment, as described earlier, the contact plug Cp1 includes an impurity of the first conductivity type. The first conductivity type is specifically an n-type. The impurity is specifically phosphorus. A heat treatment for impurity activation causes the impurity to diffuse from the inside of the contact plug Cp1 to the n-type impurity region 67n. A region of the n-type impurity region 67n into which the impurity has been introduced by the diffusion becomes the third region 67c which is an n+-type impurity region.

As is understood from the SIMS measurement results in FIG. 18, the concentration of the first impurity in the contact plug Cp1 may be at a high level of 5E20 atoms/cm$^3$ to 6E20 atoms/cm$^3$. Accordingly, the concentration of the impurity of the first conductivity type in the third region 67c, which is an n+-type impurity region, may be correspondingly at a high level.

The impurity region 69, which is an element isolation region, electrically isolates elements from each other. Specifically, the impurity region 69 is formed around an active region where an element is formed. In the present embodiment, the impurity region 69 is a p-type semiconductor. Specifically, the impurity region 69 is formed by photolithography and ion implantation. The dopant for the ion implantation is boron (B). Thus, the impurity region 69 contains boron.

Herein, the distance between the third region 67c, which is an n+-type impurity region, and the impurity region 69 in a plan view is denoted as a distance W in a plan view. As is understood from FIG. 20, the distance W in a plan view is, specifically, the distance between an end portion of the third region 67c and an end portion of the impurity region 69 in a plan view. The "distance W in a plan view" may be denoted simply as the "distance W" hereinbelow.

The distance W in a plan view is substantially the same as the distance between a contact portion between the contact plug Cp1 and the charge accumulation portion FD and the impurity region 69 in a plan view. For this reason, this distance can be regarded as the distance W in a plan view. Specifically, the distance between an end portion of the contact portion between the contact plug Cp1 and the charge accumulation portion FD and an end portion of the impurity region 69 in a plan view can be regarded as the distance W in a plan view.

In experiment C, a plurality of TEGs of the imaging apparatus 100 were fabricated. Each TEG has the structure shown in FIG. 20. However, the TEGs have different values of W. Specifically, the TEGs include one with W=0 nm, one with W=10 nm, one with W=20 nm, one with W=40 nm, one with W=60 nm, one with W=80 nm, and one with W=100 nm.

Figure 21:
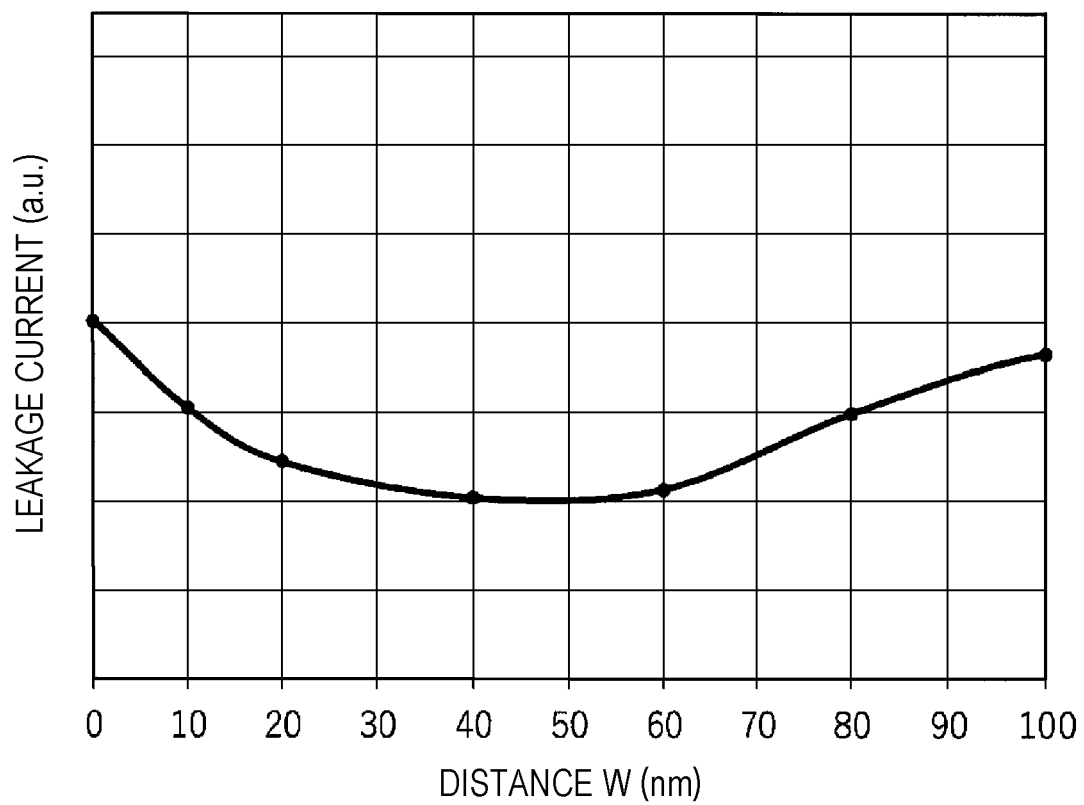
FIG. 21 is a graph showing the relation between leakage current and the distance between an n+-type impurity region and an element isolation region.

The above TEGs are configured so that leakage current that flows when a voltage of 0.1 V to 1.0 V is applied to the n-type impurity region 67n can be detected. In experiment C, a voltage of 0.5 V was applied to the n-type impurity region 67n of each TEG, and leakage current flowing after this application was measured. FIG. 21 shows a graph showing the distance W in each TEG and the magnitude of the leakage current that flowed in each TEG.

It can be observed in FIG. 21 that when the impurity region 69, which is an element isolation region, is close to the contact plug Cp1 to make the distance W too short, leakage current increases, and conversely, when the distance W is too long, leakage current is also large. It is observed in FIG. 21 that leakage current is at a local minimum when the distance W is at a certain value. The local minimum fluctuates depending on the voltage applied to the n-type impurity region 67n.

The increase in the leakage current when the distance W is too short is presumably due to an increase in leakage current based on band-to-band tunneling via an impurity level caused by an increase in electric field strength. Meanwhile, in the semiconductor substrate 60, a depletion layer is formed between the n-type impurity region 67n and the impurity region 69, which is an element isolation region. A portion of the depletion layer that spreads over the surface of the semiconductor substrate 60 is hereinafter referred to as an interface depletion layer. The increase in leakage current when the distance W is too long is presumably due to an increase in the area of the interface depletion layer.

As described above, when the distance W is long, large leakage current is likely to flow due to the large-area interface depletion layer. However, this leakage current may be reducible by adjustment of the impurity concentration in the impurity region 69, which is a region for element isolation, to reduce the area of the interface depletion layer. Meanwhile, it is not necessarily easy to adjust the band-to-band tunneling which is a problem when the distance W is short. This is because the band-to-band tunneling depends on such factors as the concentration of impurity in the contact plug, heat treatment conditions, and the mode of the first insulating layer 71. Considering these factors, a certain distance or longer may need to be secured as the distance W. From this perspective, the distance W is, for example, 50 nm or greater.

Based on the above description of the imaging apparatus 100 and the method of manufacturing the imaging apparatus 100, the following can be said.

In the imaging apparatus 100 according to the above description, the semiconductor substrate 60 has the charge accumulation portion FD. The charge accumulation portion FD contains an impurity of a first conductivity type. The contact plug Cp1 is connected to the charge accumulation portion FD. The contact plug Cp1 contains an impurity of the first conductivity type. The contact plug Cp1 is not silicide.

In the example in FIG. 3, the contact plugs Cp2 to Cp7 also contain an impurity of the first conductivity type. The contact plugs Cp2 to Cp7 are not silicide, either.

In the example of FIG. 3, the first conductivity type is the n-type. Specifically, the charge accumulation portion FD is the n-type impurity region 67n. The first conductivity type may be the p-type instead.

Assume that the contact plug Cp1 has been turned into a silicide and has a silicide layer in its surface. The silicide layer facilitates reduction of the contact resistance between the contact plug Cp1 and the via plug 88, which is a metal plug. However, not all the metal introduced in the silicidation process contributes to the formation of the silicide layer. The metal which has not contributed to the formation of the silicide layer is at risk of being diffused to the charge accumulation portion FD in the subsequent heat treatment process. Meal intruding into the charge accumulation portion FD may increase leakage current. Leakage current may lead to degradation of the quality of an image.

In this regard, in the embodiment, the contact plug Cp1 is not silicide. This may contribute to suppressing leakage current and thereby obtaining a high-quality image.

Figure 22:
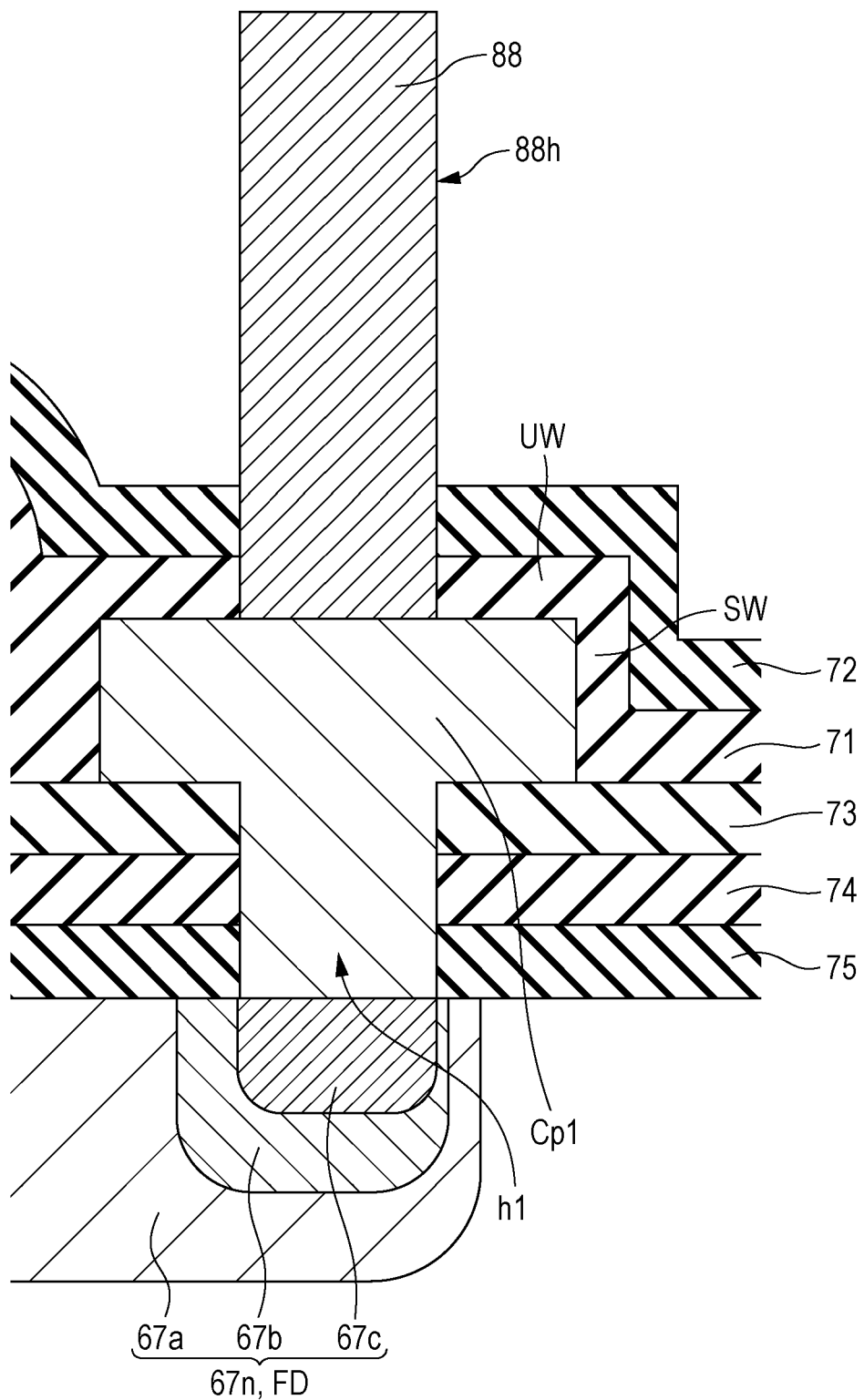
FIG. 22 is an enlarged sectional view showing a structure around the contact plug in the imaging apparatus according to the embodiment.

FIG. 22 is a partially-enlarged view of FIG. 3. As shown in FIG. 22, the first insulating layer 71 has an upper wall UW located above the contact plug Cp1. Specifically, the upper wall UW is in contact with the non-silicide surface of the contact plug Cp1. Note that "above the contact plug Cp1" in the above context means the opposite side of the contact plug Cp1 from the semiconductor substrate 60.

The upper wall UW may suppress diffusion of the first impurity in the contact plug Cp1 from the inside to the outside of the contact plug Cp1. This is advantageous in maintaining a high concentration of the first impurity in the contact plug Cp1 and reducing the contact resistance between the contact plug Cp1 and the via plug 88.

Signal charges collected at the pixel electrode 12a are read by the signal detection transistor 22 via the via plug 88, the contact plug Cp1, and the charge accumulation portion FD. When the contact resistance is small, a voltage drop in such a path along which the signal charges flow can be reduced. This is advantageous in securing a dynamic range of the imaging apparatus 100. This is also advantageous in reducing delay in the signal detecting circuit 14A and enabling the imaging apparatus 100 to operate at high speed. Thus, reducing a contact resistance may contribute to obtaining a high-quality image.

Further, the above-described contact resistance reducing effect provided by the upper wall UW allows a practical contact resistance to be achieved even when the contact diameter is minute. This enables implementation of an imaging apparatus meeting the recent trend of more and smaller pixels.

As described above, in the manufacture of the imaging apparatus 100, a product in process of the imaging apparatus 100 may be formed, which includes the contact plug Cp1 and is subjected to a heat treatment after the formation of the contact plug Cp1. Even if such a heat treatment is performed, the above-described upper wall UW can suppress diffusion of the first impurity from the inside to the outside of the contact plug Cp1. The heat treatment is performed to, for example, activate the first impurity.

The first impurity makes the region containing itself conductive. In the above-described embodiment, the first impurity in the contact plug Cp1 is phosphorus. In other words, the contact plug Cp1 contains phosphorus. Phosphorus has a high solid solubility concentration limit. This means that the contact plug Cp1 may contain a high concentration of phosphorus. This makes it possible to reduce the resistivity of the contact plug Cp1. This is advantageous in reducing the contact resistance between the contact plug Cp1 and the via plug 88. For example, even when the via plug 88 is minute, being 100 nm or less in diameter, the contact resistance can be reduced to a small value. Since phosphorus is an impurity that easily diffuses, the first impurity diffusion preventing effect provided by the upper wall UW easily appears in the present embodiment.

In the present embodiment, the imaging apparatus 100 has the photoelectric conversion structure 12A. In the embodiment, the photoelectric conversion structure 12A is located outside the semiconductor substrate 60, or more specifically, above the semiconductor substrate 60. Alternatively, the photoelectric converter may be a photodiode located inside the semiconductor substrate.

As shown in FIG. 22, the first insulating layer 71 has a sidewall SW located lateral to the contact plug Cp1. The sidewall SW is in contact with the contact plug Cp1. Specifically, the sidewall SW extends from the upper wall UW toward the semiconductor substrate 60. The sidewall SW too may suppress diffusion of the first impurity in the contact plug Cp1 from the inside to the outside of the contact plug Cp1.

In the embodiment, the first insulating layer 71 is 50 nm or less in thickness. When the first insulating layer 71 is this thin, a global step is likely to be reduced. Reducing a global step makes it unlikely that the lens used in photolithography to form a hole at a plurality of locations in the seventh insulating layer 91 has an insufficient depth of focus, facilitating precise patterning of these holes and in turn precise formation of the holes. A precisely formed hole facilitates a proper connection between a conductor formed in the hole and an element distributed on the semiconductor substrate 60. For example, in the imaging region R1, the via plugs 88 and the contact plugs Cp1 to Cp7 can be easily and properly connected, and in the surrounding region R2, a conductor in the hole and the silicide layer 85 on the source and drain of the silicide transistor 55 can be easily and properly connected. This may contribute to obtaining a high-quality image.

A further description is given of an advantage of reducing the thickness of the first insulating layer 71. In the example in FIGS. 3 and 5, there is a difference in position in the depth direction of the semiconductor substrate 60 between the contact plugs Cp5, Cp6, Cp7 on the gate electrodes 22e, 24e, 26e in the imaging region R1 (see FIG. 3) and the silicide layer 85 on the source and drain of the silicide transistor 55 in the surrounding region R2 (see FIG. 5). This difference produces a global step, making the upper surface of the seventh insulating layer 91 an uneven surface. However, in a typical example, the difference in height between a high portion and a low portion of this uneven surface is small compared to a height difference in an arrangement pattern of circuit elements on the semiconductor substrate 60, such as the difference in depth-wise position between the contact plugs Cp5, Cp6, Cp7 and the silicide layer 85. This is because, in a typical example, the height difference in the arrangement pattern of circuit elements is not completely reflected on the upper surface of the originally-deposited seventh insulating layer 91, and also, the upper surface of the seventh insulating layer 91 is flattened by CMP. For such reasons, the thickness (which may be referred to as a height difference) of the seventh insulating layer 91 immediately before the through-holes are formed by photolithography and etching is smaller on the contact plugs Cp5, Cp6, Cp7 than on the silicide layer 85. Such a difference in the thickness of the seventh insulating layer 91 is disadvantageous in accurately forming through-holes in regions of the seventh insulating layer 91 which are situated on the respective circuit elements distributed on the semiconductor substrate 60. Such a difference in the thickness of the seventh insulating layer 91 tends to be large when the first insulating layer 71 is thick. In this regard, in the embodiment, the first insulating layer 71 is 50 nm or less in thickness. The first insulating layer 71 may be 25 nm or less in thickness. The first insulating layer 71 may be 15 nm or less in thickness. When the first insulating layer 71 is this thin, the above-described difference in the thickness of the seventh insulating layer 91 is unlikely to be large, facilitating accurate formation of the through-holes in the seventh insulating layer 91. Thus, proper connections between conductors formed in the through-holes and circuit elements distributed on the semiconductor substrate 60 are facilitated.

In the embodiment, the first insulating layer 71 is 10 nm or greater in thickness. When the first insulating layer 71 is this thick, the first insulating layer 71 may provide the above-described effect of suppressing diffusion of the first impurity from the inside to the outside of the contact plug Cp1. Further, as described above, in the manufacture of the imaging apparatus 100, a metal may be introduced to form a silicide in the surrounding circuitry 40. In such a silicide forming step, in a typical example, the metal is introduced not only to the surrounding region R2, but also to the imaging region R1. When the first insulating layer 71 is as thick as the above, the first insulating layer 71 may function as a silicide block, preventing the metal introduced to the imaging region R1 in the silicide forming step from coming into contact with the contact plug Cp1.

Specifically, the first insulating layer 71 may have a thickness in a range of 10 nm to 50 nm. The first insulating layer 71 may have a thickness in a range of 10 nm to 25 nm. The first insulating layer 71 may have a thickness in a range of 10 nm to 15 nm.

In the embodiment, the first insulating layer 71 contains a silicon oxide. With such first insulating layer 71 with a small relative permittivity, the parasitic capacitances between the contact plugs Cp5 to Cp7 and the metal wiring 87 can be reduced. Also, such first insulating layer 71 can suppress diffusion of the first impurity from the inside to the outside of the contact plug Cp1. In addition, such first insulating layer 71 may function as a silicide block in the silicide forming step. For this reason, the first insulating layer 71 containing a silicon oxide may contribute to obtaining a high-quality image. Also, the first insulating layer 71 containing a silicon oxide can be processed or removed by photolithography and etching as needed. Specifically, the first insulating layer 71 contains a silicon dioxide.

In the embodiment, the connection holes 88h penetrating the first insulating layer 71 are provided. The via plug 88, which is a metal plug, is connected to the contact plug Cp1 through the connection hole 88h. Specifically, the connection hole 88h penetrates the upper wall UW of the first insulating layer 71. The via plug 88, which is a metal plug, is in contact with the non-silicide surface of the contact plug Cp1 through the connection hole 88h.

In the embodiment, the via plug 88, which is a metal plug, can be said to penetrate the upper wall UW and be in contact with the non-silicide surface of the contact plug Cp1.

In the embodiment, the connection hole 88h is 100 nm or less in diameter. The connection hole 88h having as small a diameter as this is advantageous in reducing the cell size of each pixel and increasing the number of pixels in the imaging apparatus 100. Thus, the connection hole 88h being 100 nm or less in diameter may contribute to obtaining a high-quality image.

In the embodiment, the second insulating layer 72 has a portion located above the upper wall UW of the first insulating layer 71. The material of the second insulating layer 72 is different from that of the first insulating layer 71. This facilitates giving the first and second insulating layers functions different from each other. An example of properties different from each other is etching rates different from each other. Specifically, the second insulating layer 72 has a portion located above the first insulating layer 71. Note that in the above context, "above the upper wall UW" means the opposite side of the upper wall UW from the semiconductor substrate 60. "The material of the second insulating layer 72 is different from that of the first insulating layer 71" indicates, specifically, that the composition of the material of the second insulating layer 72 is different from that of the first insulating layer 71.

In the embodiment, the connection hole 88h penetrates the second insulating layer 72. Specifically, the connection hole 88h penetrates a portion of the second insulating layer 72 that is located above the upper wall UW.

In the example in FIG. 3, the second insulating layer 72 is located at the opposite side of the first insulating layer 71 from the semiconductor substrate 60. The above-described portion of the second insulating layer 72 that is located above the upper wall UW of the first insulating layer 71 (hereinafter referred to as an upper portion) is in contact with the upper wall UW. The second insulating layer 72 includes a side portion that extends from the upper portion toward the semiconductor substrate 60 and that is located lateral to the sidewall SW of the first insulating layer 71. This side portion is in contact with the sidewall SW.

In the embodiment, the first insulating layer 71 is thinner than the second insulating layer 72. In addition, in the embodiment, the second insulating layer 72 is in contact with the first insulating layer 71.

In the embodiment, the second insulating layer 72 is 50 nm or less in thickness. When the second insulating layer 72 is this thin, the parasitic capacitance of the second insulating layer 72 can be reduced. This may contribute to obtaining a high-quality image.

In the embodiment, the second insulating layer 72 is 30 nm or greater in thickness.

Specifically, the second insulating layer 72 may have a thickness in a range of 30 nm to 50 nm.

In the embodiment, the second insulating layer 72 contains a silicon nitride. Thus, the second insulating layer 72 may act as an etching stopper when the seventh insulating layer 91 is etched to form the connection holes 88h.

In the embodiment, the contact hole h1 through which the contact plug Cp1 extends is provided. The third insulating layer 73 has a portion that is located around the contact hole h1 and between the semiconductor substrate 60 and the contact plug Cp1.

In the embodiment, the third insulating layer 73 and the first insulating layer 71 are made of the same material. This facilitates simplification of the step of forming the first and third insulating layers. This may allow, for example, the first and third insulating layers to be etched collectively. The etching may be dry etching or wet etching. Here, "the third insulating layer 73 and the first insulating layer 71 are made of the same material" indicates, specifically, that the composition of the material of the third insulating layer 73 is the same as that of the first insulating layer 71.

In the embodiment, the third insulating layer 73 is in contact with the first insulating layer 71.

In the embodiment, the first insulating layer 71 is thinner than the third insulating layer 73. The upper wall UW of the first insulating layer 71 that is situated above the contact plug Cp1 may become a cause for generating a global step between the pixel 10A portion and the surrounding circuitry 40. A global step appears in the upper surface of the seventh insulating layer 91, and may make it difficult to form the connection holes 88h in the seventh insulating layer 91 by etching and cause a poor connection between the via plug 88 and the contact plug Cp1. The first insulating layer 71 being thin to a certain degree is advantageous in reducing such a global step. Meanwhile, the third insulating layer 73 being thick to a certain degree is advantageous in, when at least part of the third insulating layer 73 is situated between two elements, securing dielectric strength between the elements.

In the example in FIG. 9, a part of the third insulating layer 73 is situated between the contact plug Cp1 and the gate electrode 26e of the reset transistor 26, and the third insulating layer 73 thus contributes to securing dielectric strength between them. For this reason, the first insulating layer 71 being thinner than the third insulating layer 73 may be beneficial.

In the embodiment, the connection holes 88h penetrating the first insulating layer 71 are provided. The via plug 88, which is a metal plug, is connected to the contact plug Cp1 through the connection hole 88h. In a plan view, the connection hole 88h and the contact hole h1 are away from each other. This configuration is an example of a configuration in which the positional flexibility of the via plug 88, which is a metal plug, relative to the position of the contact hole h1 in a plan view is improved by use of the contact plug Cp1 as a local wire. It can be said that in this configuration, the layout flexibility of the metal wiring 87 connected to the via plug 88, which is a metal plug, is also improved. FIG. 9 shows a configuration where the connection hole 88h and the contact hole h1 are away from each other in a plan view. As described earlier, "a plan view" means seeing in a direction perpendicular to the semiconductor substrate 60.

The via plug 88 may be connected to the upper surface of the contact plug Cp1. The contact plug Cp1 may be provided with a dent, and the via plug 88 may be partially in the dent. FIG. 9 shows such a configuration.

In one example, the semiconductor substrate 60 has the impurity region 69 of a second conductivity type different from the first conductivity type. In a plan view, the distance W between the contact portion between the contact plug Cp1 and the charge accumulation portion FD and the impurity region 69 is 50 nm or greater. This may contribute to reducing leakage current and obtaining a high-quality image. Note that the distance W is, for example, 10 μm or less. In the above context, the "second conductivity type different from the first conductivity type" means that the second conductivity type has a different polarity from the first conductivity type, and more specifically, one of the first and second conductivity types is the n-type and the other is the p-type.

In one example, in the depth direction of the semiconductor substrate 60, the difference between the maximum and minimum values of the concentration of the impurity in the contact plug Cp1 is 30% or lower of the intermediate value thereof. This example facilitates avoidance of a situation where the concentration of the impurity in the contact plug Cp1 is small at a portion in contact with the via plug 88. Thus, this example is advantageous in obtaining a high-quality image. The intermediate value above is the sum of the maximum and minimum values divided by 2.

Figure 23:
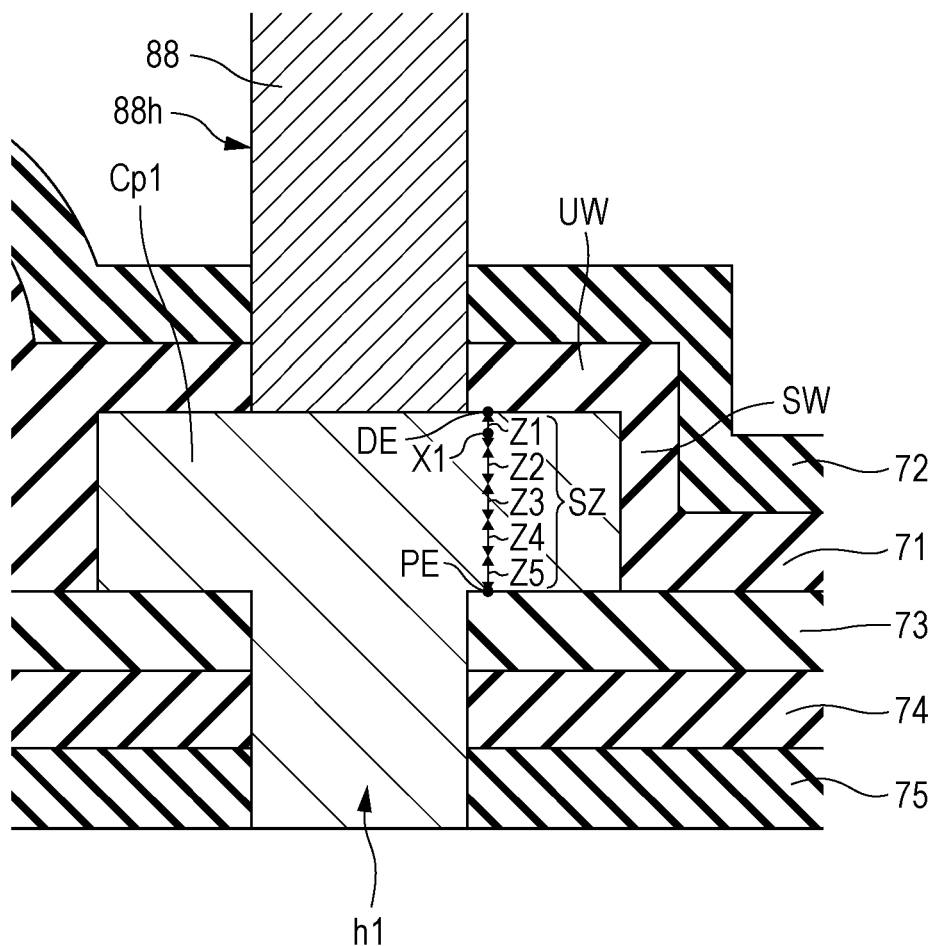
FIG. 23 is an enlarged sectional view showing a structure around the contact plug in the imaging apparatus according to the embodiment.

FIG. 23 is a partially enlarged view of FIG. 3. The expression "in the depth direction of the semiconductor substrate 60, the difference between the maximum and minimum values of the concentration of the impurity in the contact plug Cp1 is 30% or lower of the intermediate value thereof" may be related to a linear region SZ extending through a portion of the contact plug Cp1 which is inside the contact hole h1, or may be related to a linear region SZ not extending through a portion of the contact plug Cp1 which is inside the contact hole h1.

In the example in FIG. 23, the linear region SZ is a region extending above the third insulating layer 73. The linear region SZ has the characteristics that "in the depth direction of the semiconductor substrate 60, the difference between the maximum and minimum values of the concentration of the impurity in the contact plug Cp1 is 30% or lower of the intermediate value thereof". Specifically, the linear region SZ has as its lower end a portion of contact between the third insulating layer 73 and the contact plug Cp1 and as its upper end a portion of contact between the upper wall UW of the first insulating layer 71 and the contact plug Cp1.

In one example, in the configuration in FIG. 23, the contact plug Cp1 contains the first impurity of the first conductivity type. The contact plug Cp1 has the linear region SZ extending in the depth direction of the semiconductor substrate 60. The linear region SZ includes a proximal end PE which constitutes part of the contour of the contact plug Cp1 and is relatively close to the semiconductor substrate 60 and a distal end DE which constitutes part of the contour of the contact plug Cp1 and is relatively far from the semiconductor substrate 60. When the linear region SZ is divided into five equal sections which are a first section Z1, a second section Z2, a third section Z3, a fourth section Z4, and a fifth section Z5 sequentially from the distal end DE to the proximal end PE, the first section Z1 has a first portion X1. The concentration of the first impurity at the first portion X1 is 70% or higher of the maximum concentration of the first impurity in the linear region SZ. This specific example is an example of a configuration which facilitates securing the concentration of the first impurity in the contact plug Cp1 at a portion in contact with the via plug 88. This specific example may be advantageous in obtaining a high-quality image.

The embodiment includes a first step S1, a second step S2, a third step S3, a fourth step S4, a fifth step S5, a sixth step S6, and a seventh step S7.

The first step S1 is a step of forming the third insulating layer 73 on the semiconductor substrate 60 having the charge accumulation portion FD. The charge accumulation portion FD contains an impurity of the first conductivity type.

The second step S2 is a step of forming the contact plug Cp1 which penetrates the third insulating layer 73 and is connected to the charge accumulation portion FD. The contact plug Cp1 formed in the second step S2 contains an impurity of the first conductivity type and is not silicide. It can also be said that the second step S2 is a step of forming the contact plug Cp1 which contains an impurity of the first conductivity type and is not silicide so that the contact plug Cp1 may be connected to the charge accumulation portion FD which is included in the semiconductor substrate 60 and contains an impurity of the first conductivity type.

The third step S3 is a step of forming the first insulating layer 71 having the upper wall UW located above the contact plug Cp1. In this context, "above the contact plug Cp1" means the opposite side of the contact plug Cp1 from the semiconductor substrate 60.

The fourth step S4 is a step of heating the contact plug Cp1. The fourth step S4 is performed after the formation of the first insulating layer 71.

The fifth step S5 is a step of forming the second insulating layer 72 having a portion located above the upper wall UW of the first insulating layer 71. In this context, "above the upper wall UW" means the opposite side of the upper wall UW from the semiconductor substrate 60.

The sixth step S6 is a step of forming the connection hole 88h. The connection hole 88h penetrates the first insulating layer 71. The sixth step S6 is performed after the contact plug Cp1 is heated. Heating the contact plug Cp1 before forming the connection hole 88h is suitable for making the concentration of the impurity in the contact plug Cp1 more uniform. Specifically, the connection hole 88h penetrates the second insulating layer 72 as well.

The seventh step S7 is a step of forming the via plug 88 connected to the contact plug Cp1 through the connection hole 88h. The via plug 88 is, specifically, a metal plug.

FIG. 24 is a flowchart of the first step S1 to the seventh step S7. In one specific example, the first step S1 to the seventh step S7 are carried out in this order.

The imaging apparatus and the method for manufacturing the imaging apparatus according to the present disclosure have thus been described above. However, the present disclosure is not limited to the embodiment. Various modifications of the embodiment which may be conceived of by those skilled in the art, other modes constructed by combining part of the components of the embodiment, and the like are also included in the scope of the present disclosure as long as such modifications and modes do not depart from the gist of the present disclosure.

The imaging apparatus of the present disclosure has small leakage current and small contact resistance in the pixel part, and therefore can perform imaging of high quality. The imaging apparatus of the present disclosure is useful for, for example, a digital camera or the like. More specifically, the imaging apparatus of the present disclosure can be used for, for example, a cameral for medical use, a camera for robots, a surveillance camera, a vehicle-mounted camera, or the like.

What is claimed is:

1. An imaging apparatus comprising:
   a semiconductor substrate which includes a charge accumulation portion containing an impurity of a first conductivity type;
   a contact plug which is connected to the charge accumulation portion, contains an impurity of the first conductivity type, and is not silicide;
   a first insulating film which includes an upper wall located above the contact plug; and
   a second insulating film which includes a portion located above the upper wall, wherein
   a material of the second insulating film is different from a material of the first insulating film, and
   the first insulating film is thinner than the second insulating film.

2. The imaging apparatus according to claim 1, wherein the upper wall is in contact with a surface of the contact plug.

3. The imaging apparatus according to claim 1, wherein the first insulating film includes a sidewall located lateral to the contact plug, and
   the sidewall is in contact with the contact plug.

4. The imaging apparatus according to claim 1, wherein a thickness of the first insulating film is less than or equal to 50 nm.

5. The imaging apparatus according to claim 1, wherein the first insulating film contains a silicon oxide.

6. The imaging apparatus according to claim 1, further comprising:
   a connection hole which penetrates the first insulating film; and
   a metal plug which is connected to the contact plug through the connection hole.

7. The imaging apparatus according to claim 6, wherein a diameter of the connection hole is less than or equal to 199 nm.

8. The imaging apparatus according to claim 1, wherein a thickness of the second insulating film is less than or equal to 50 nm.

9. The imaging apparatus according to claim 1, wherein the second insulating film contains a silicon nitride.

10. The imaging apparatus according to claim 1, further comprising:
    a contact hole in which the contact plug extends; and
    a third insulating film which includes a portion located around the contact hole and between the semiconductor substrate and the contact plug.

11. The imaging apparatus according to claim 10, wherein the third insulating film is made of a same material as the first insulating film.

12. The imaging apparatus according to claim 10, wherein the first insulating film is thinner than the third insulating film.

13. The imaging apparatus according to claim 10, further comprising:
    a connection hole which penetrates the first insulating film; and
    a metal plug which is connected to the contact plug through the connection hole, wherein
    in a plan view, the connection hole and the contact hole are separated from each other.

14. The imaging apparatus according to claim 1, wherein
    the semiconductor substrate includes an impurity region of a second conductivity type different from the first conductivity type, and
    in a plan view, a distance between the impurity region and a portion where the contact plug is in contact with the charge accumulation portion is greater than or equal to 50 nm.

15. The imaging apparatus according to claim 1, wherein the contact plug contains phosphorus.

16. The imaging apparatus according to claim 1, wherein
    in a depth direction of the semiconductor substrate, a difference between maximum and minimum values of a concentration of the impurity of the first conductivity type contained in the contact plug is less than or equal to 30% of an intermediate value of the concentration.

* * * * *